(12) United States Patent  
Kawamoto et al.

(10) Patent No.: US 8,970,281 B2  
(45) Date of Patent: Mar. 3, 2015

(54) LOAD DRIVER WITH CONSTANT CURRENT VARIABLE STRUCTURE

(71) Applicant: DENSO CORPORATION, Kariya, Aichi-pref. (JP)

(72) Inventors: Teppei Kawamoto, Anjo (JP); Yasutaka Senda, Nukata-gun (JP); Ryotaro Miura, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/091,473

(22) Filed: Nov. 27, 2013

(65) Prior Publication Data

US 2014/0084964 A1 Mar. 27, 2014

Related U.S. Application Data

(62) Division of application No. 13/300,786, filed on Nov. 21, 2011, now Pat. No. 8,633,755.

(30) Foreign Application Priority Data

Nov. 22, 2010 (JP) ................................. 2010-260397  
Nov. 22, 2010 (JP) ................................. 2010-260400  
Mar. 24, 2011 (JP) ................................. 2011-66218  
Apr. 18, 2011 (JP) ................................. 2011-91848

(51) Int. Cl.
*H03L 5/00* (2006.01)
*H03K 3/012* (2006.01)
*H03K 17/16* (2006.01)

(52) U.S. Cl.
CPC .............. *H03K 3/012* (2013.01); *H03K 17/163* (2013.01); *H03K 17/166* (2013.01); *H03K 17/168* (2013.01)
USPC ........... 327/309; 327/318; 327/321; 327/322; 327/374; 327/434

(58) Field of Classification Search
CPC ... H03K 3/012; H03K 17/168; H03K 17/166; H03K 17/163
USPC ......... 327/108, 170, 178, 180, 309, 315, 316, 327/318, 320, 321, 322, 323, 374, 376, 392, 327/395, 403, 404, 427, 434; 361/91.1, 88, 361/93.1, 93.8, 103
See application file for complete search history.

(56) References Cited

U.S. PATENT DOCUMENTS 5,905,389 A * 5/1999 Alleven ....................... 327/108  
6,222,403 B1 4/2001 Mitsuda  
(Continued)

FOREIGN PATENT DOCUMENTS

JP 2004-72424 A 3/2004  
JP 2007-028711 A 2/2007  
JP 2010-034701 A 12/2010

OTHER PUBLICATIONS

Office Action dated Jan. 6, 2014 issued in corresponding CN patent application No. 201110373638.6 (and English translation).

(Continued)

*Primary Examiner* — Jung Kim  
(74) *Attorney, Agent, or Firm* — Posz Law Group, PLC

(57) ABSTRACT

A load driver includes a switching element connected to a load, a constant current generator that generates a constant current, and a driver circuit that turns on the switching element for an on-period, which depends on a value of the constant current and is shortened with an increase in the value of the constant current. The constant current generator supplies a first constant current having a first current value to the driver circuit during the on-period, and supplies a second constant current having a second current value smaller than the first current value after the on-period has elapsed and the switching element reaches an on state.

5 Claims, 37 Drawing Sheets

(56) References Cited

U.S. PATENT DOCUMENTS

| | | |
|---|---|---|
| 6,362,678 B1 | 3/2002 | Bosnyak et al. |
| 7,511,540 B2 | 3/2009 | Dickman et al. |
| 2008/0116955 A1 | 5/2008 | Chen et al. |
| 2009/0002054 A1 | 1/2009 | Tsunoda et al. |
| 2009/0066402 A1 | 3/2009 | Hiyama |
| 2009/0153200 A1 | 6/2009 | Kawagishi et al. |
| 2010/0213989 A1 | 8/2010 | Nakatake et al. |
| 2012/0126858 A1 | 5/2012 | Senda et al. |
| 2012/0249020 A1* | 10/2012 | Komatsu et al. ............. 318/139 |

OTHER PUBLICATIONS

Japanese Office Action mailed Dec. 25, 2012 from the Japanese Patent Office for the corresponding Japanese patent application No. 2011-091848 (with English translation).

Japanese Office Action mailed Dec. 25, 2012 from the Japanese Patent Office for the corresponding Japanese patent application No. 2011-066218 (with English translation).

* cited by examiner

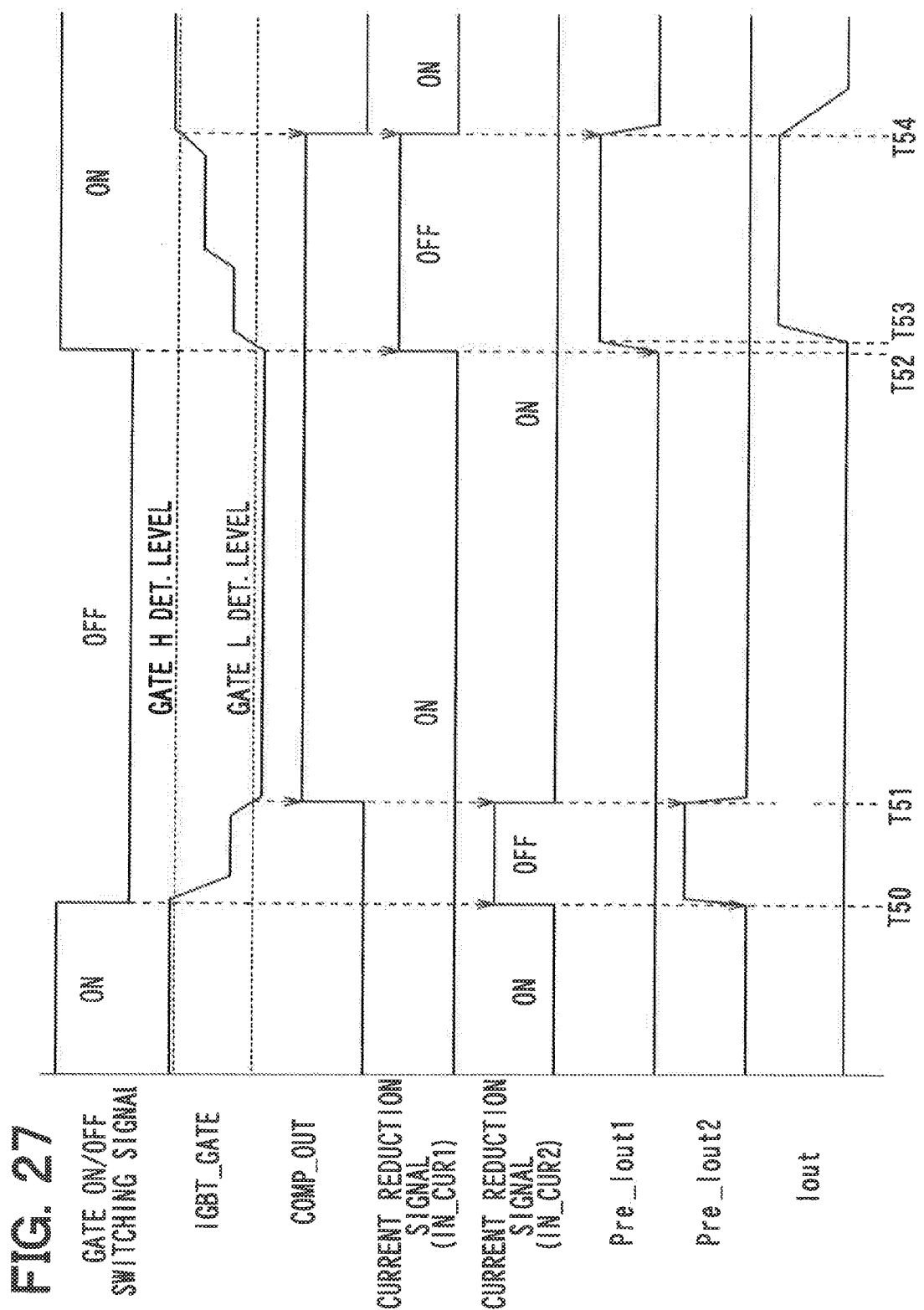

FIG. 45

| IN | OUT1 | OUT2 | OUT3 | I_IN1 | I_IN2 | I_IN3 |
|---|---|---|---|---|---|---|
| L | H | H | H | H | H | H |
| L | L | H | H | H | H | L |
| L | L | L | H | H | L | L |
| L | L | H | L | H | L | L |
| L | L | L | L | L | L | L |
| L | H | L | H | H | H | L |
| L | H | H | L | H | H | L |
| L | H | L | L | H | L | L |
| H | Don't care | | | L | L | L |

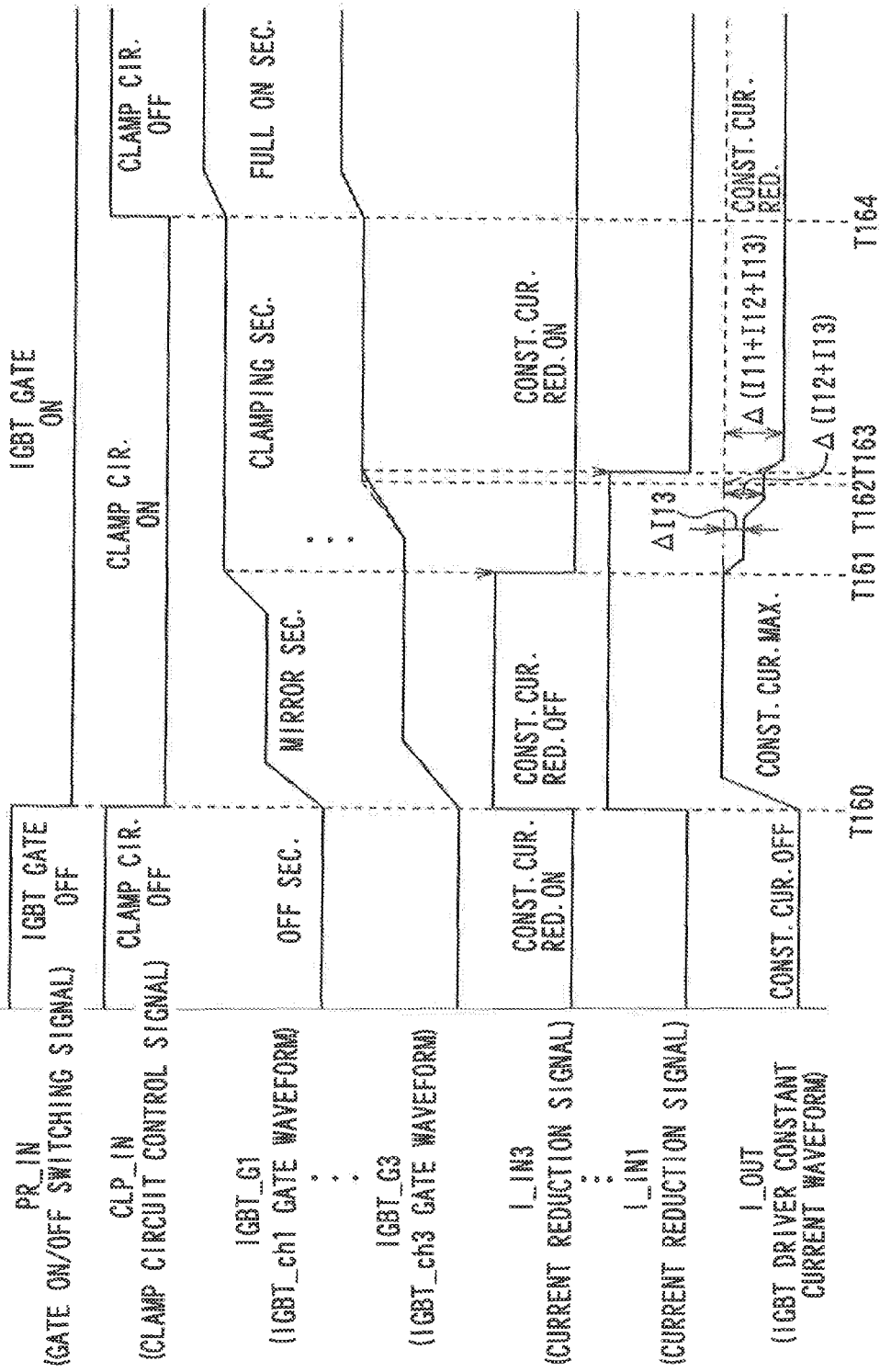

LOAD DRIVER WITH CONSTANT CURRENT VARIABLE STRUCTURE

CROSS REFERENCE TO RELATED APPLICATIONS

This application is a divisional of application Ser. No. 13/300,786 filed on Nov. 21, 2011, which is based on Japanese Patent Applications No. 2010-260397 filed on Nov. 22, 2010, No. 2010-260400 filed on Nov. 22, 2010, No. 2011-91848 filed on Apr. 18, 2011 and No. 2011-66218 filed on Mar. 24, 2011, the disclosure of which are incorporated herein by reference.

FIELD OF THE INVENTION

The present invention relates to a load driver with a constant current variable structure.

BACKGROUND OF THE INVENTION

For example, JP2009-71956A, corresponding to US2009/0066402A1, describes a gate drive circuit for driving a power switching element, such as an insulated gate bipolar transistor (IGBT), as a load. The described gate drive circuit has a first turn-on power supply circuit for turning on a power switching element. The first turn-on power supply circuit has a first turn-on power source as a power source dedicated for the first turn-on power supply circuit.

The first turn-on power supply circuit supplies a voltage equal to or lower than a predetermined level to a gate of the power switching element to turn on the power switching element. Therefore, an adverse influence, such as a characteristic change, to the power switching element is reduced.

The above gate drive circuit is an example, and some other types of the gate drive circuit, that is, a driver circuit are widely known.

In a switching element driven by such a driver circuit, a time to turn on the gate depends on a capacity of the driver circuit. The shorter the rising time is, the more the speed of rising the gate increases.

For example, assuming that the capacity of the gate is C, the value of the constant current to charge the gate is I, and an on-voltage where the gate becomes an on state is V, the rising time T for turning on the gate is expressed as $T=(C\times V)/I$. The constant current is supplied to the driver circuit from an external device.

According to the above expression, the rising time T is shortened by increasing the value I of the electric current supplied to the driver circuit or by reducing the gate capacity C or the on-voltage V. That is, by shortening the rising time T, the rising speed of the gate increases.

The gate capacity C and the on-voltage V are uniquely decided depending on the size or the manufacturing process of the switching element. Therefore, the rising time T is adjusted by the value I of the constant current.

It is considered to shorten the rising time T by increasing the value I of the constant current. However, the increase in the value I of the constant current results in an increase in current consumption in the driver circuit. Particularly, if the constant current having the increased value I is continuously supplied to the driver circuit even after the gate reaches the on state, the consumption current in the driver circuit is increased.

For example, JP2009-11049A corresponding to US2009/0002054A1 describes a gate drive apparatus that drives a gate of a power element as a load, such as an IGBT or a MOSFET, with a constant current. In the gate drive apparatus, a constant-current-pulse gate drive circuit is connected to the gate of the power element.

When the constant-current-pulse gate drive circuit is operated in accordance with a control signal, the constant current is supplied to the gate of the power element from the constant-current-pulse gate drive circuit. Since the gate of the power element is supplied with an electric charge, a gate voltage rises, and thus the power element turns on.

In such a structure, if an overshoot occurs when the gate of the power element reaches a fully on state, the power element will be damaged. Therefore, it is considered to connect a clamp circuit, which clamps the gate voltage on a constant voltage, to the gate of the power element, thereby to restrict the overshoot of the power element and to protect the power element.

However, a current path through which the constant current passes is formed in the clamp circuit at a timing where the gate voltage reaches the voltage of the clamp circuit. Therefore, the constant current supplied to the power element will be continuously supplied also to the clamp circuit as long as the constant current is continuously supplied to the power element. As a result, the current consumption will be increased.

For example, JP2004-72424A describes a gate drive circuit of a MOS gate transistor which can shorten a turn-on time for a high power transistor and also can reduce internal power consumption. However, in JP2004-72424A, the value of a constant current is not changed.

SUMMARY OF THE INVENTION

It is an object to provide a load driver capable of turning on a switching element at high speed while reducing current consumption in a driver circuit.

It is another object to provide a load driver having a clamp circuit connected to a power element, capable of reducing the consumption of a constant current for driving the power element.

According to an aspect, a load driver includes a switching element connected to a load, a constant current generator that generates a constant current, and a driver circuit that turns on the switching element by the constant current supplied from the constant current generator. An on-period required to turn on the switching element is determined depending on a value of the constant current, and is shortened with an increase in the value of the constant current. The constant current generator supplies a first constant current having a first current value to the driver circuit during the on-period, and supplies a second constant current having a second current value smaller than the first current value after the on-period has elapsed and the switching element reaches an on state.

In such a structure, the switching element is turned on by the constant current having the first current value, and after the switching element is turned on, the value of the constant current from the constant current generator is reduced from the first current value to the second current value. Therefore, the switching element is turned on at a high speed by the constant current having the first current value, and current consumption in the driver circuit after the switching element is turned on is reduced by the constant current having the second current value smaller than the first current value.

According to a second aspect, a load driver includes a power element, a river circuit, a clamp circuit. The power element is connected to a load. The power element is provided by a semiconductor switching element, and has a driving terminal. The driver circuit supplies a constant current to the driving terminal to drive the power element. The clamp circuit is connected to the driving terminal and clamps a voltage applied to the driving terminal on a predetermined voltage when the voltage reaches the predetermined voltage by the constant current supplied from the driver circuit. The driver circuit includes a variable constant current circuit that reduces a value of the constant current after the voltage reaches the predetermined voltage to a value smaller than that of the constant current supplied before the voltage reaches the predetermined voltage.

In such a structure, after the voltage of the driving terminal of the power element reaches the predetermined voltage, the value of the constant current supplied to the driving terminal is reduced by the variable constant current circuit. Therefore, the electric current supplied to the clamp circuit is reduced. Accordingly, the consumption amount of the constant current is reduced.

BRIEF DESCRIPTION OF THE DRAWINGS

Other objects, features and advantages of the present invention will become more apparent from the following detailed description made with reference to the accompanying drawings, in which like parts are designated by like reference numbers and in which:

FIG. 27 is a time chart for explaining a regular operation of the load driver according to the sixteenth embodiment;

FIG. 45 is a truth value chart of a constant current control circuit of the load driver according to the twenty-fifth embodiment; and FIG. 46 is a time chart for explaining an operation of the load driver according to the twenty-fifth embodiment.

DETAILED DESCRIPTION OF EXEMPLARY EMBODIMENTS

Hereinafter, exemplary embodiments will be described with reference to the drawings. Like parts are designated with like reference numbers throughout the exemplary embodiments.

First Embodiment

A first embodiment will be described with reference to FIGS. 1 through 3. A load driver according to the first embodiment is employed to drive a load, such as an IGBT, a power MOSFET, a capacity load or a resistor load, with a constant current.

Figure 1:
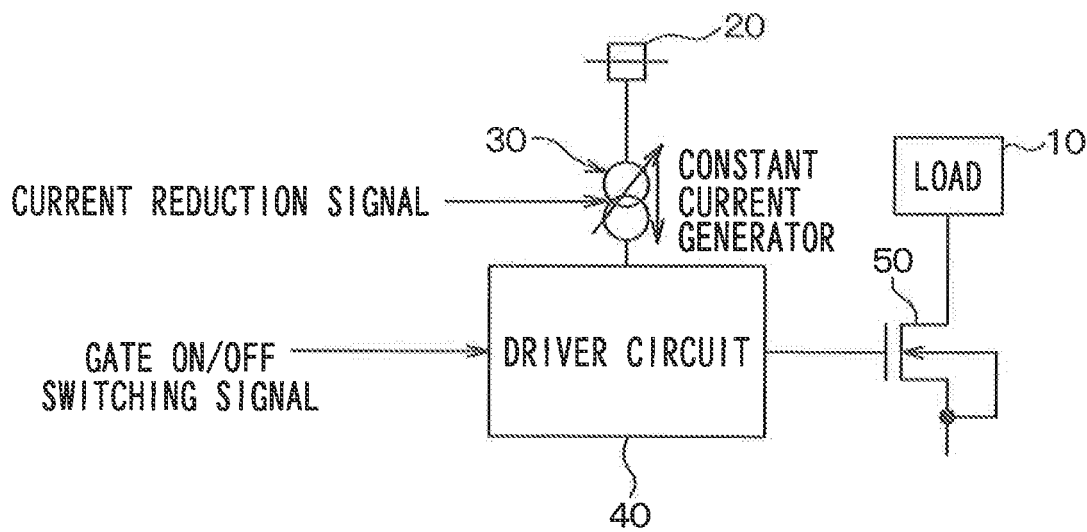
FIG. 1 is a schematic circuit diagram of a load driver, in a state of being connected to a load, according to a first embodiment.

FIG. 1 is a schematic diagram of the load driver, in a state of being connected to a load 10, according to the present embodiment. As shown in FIG. 1, the load driver includes a constant current generator 30, a driver circuit 20, and a switching element 50.

The constant current generator 30 is connected to a power source 20. The constant current generator 30 is a circuit that generates a constant current. The constant current generated in the constant current generator 30 determines a capacity of the driver circuit 40, that is, a switching speed.

The driver circuit 40 is configured to drive, i.e., to turn on and off the switching element 50 in accordance with a gate ON/OFF switching signal from an external device. An on-time period required to turn on the switching element 50 is shortened with an increase in the intensity of the constant current. The driver circuit 40 turns on the switching element 50 for the on-time period in accordance with the intensity of the constant current from the constant current generator 30. Hereinafter, the gate ON/OFF switching signal is simply referred to as the switching signal.

The switching element 50 is a semiconductor switching element for driving the load 10. In the present embodiment, the switching element 50 is an N-channel MOSFET, for example. A gate of the switching element 50 is connected to the driver circuit 40. A drain of the switching element 50 is connected to the load 10. Alternatively, the load 10 may be connected to a source of the switching element 50.

Figure 2:
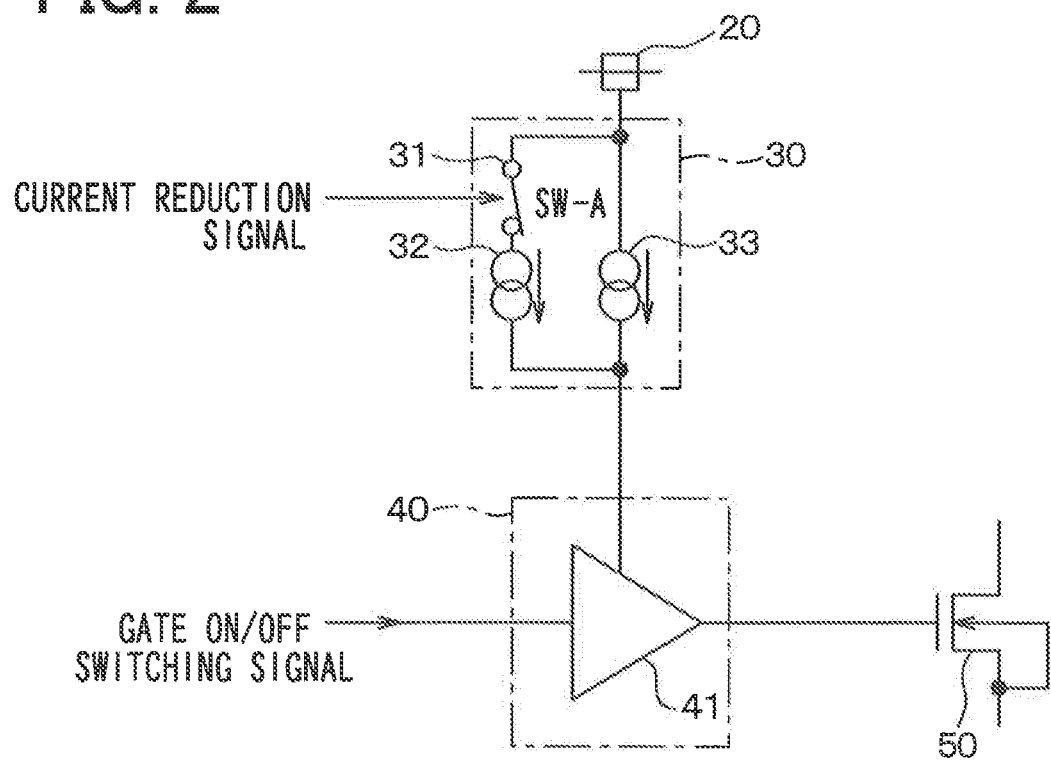
FIG. 2 is a detailed circuit diagram of the load driver according to the first embodiment.
Figure 3:
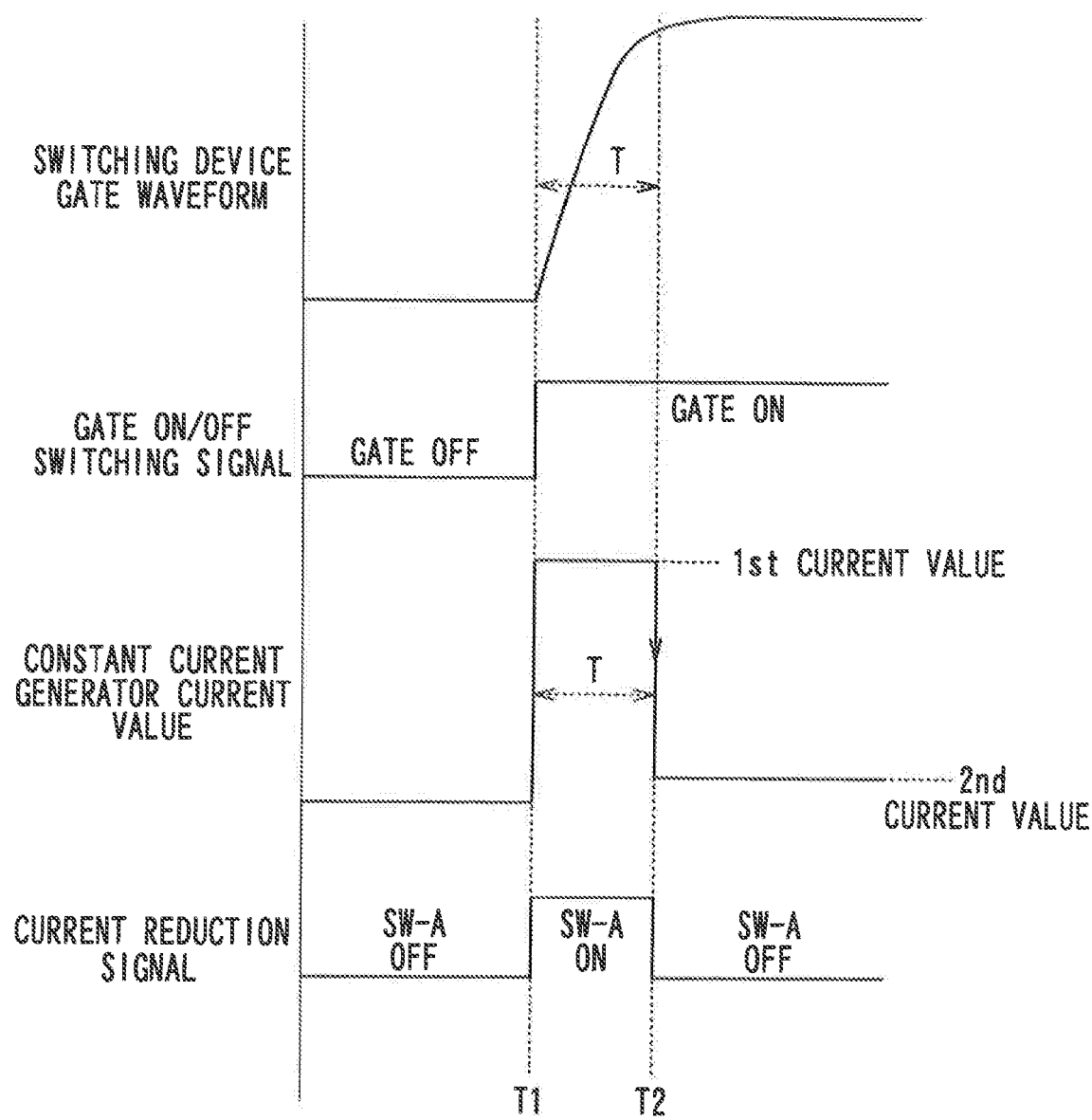
FIG. 3 is a time chart for explaining an operation of the load driver, which illustrates a gate waveform of a switching element, a switching signal, a value of a constant current generated in a constant current generator, and a current reduction signal, according to the first embodiment.

Referring to FIG. 2, a detail structure of the load driver will be described. The constant current generator 30 includes a switch 31 (SW-A), a first constant current source 32 and a second constant current source 33.

The switch 31 is connected to the first constant current source 32. The second constant current source 33 is connected in parallel with a series line including the switch 31 and the first constant current source 32. A connecting point between the switch 31 and the second constant current source 33 is connected to the power source 20. A connecting point between the first constant current source 32 and the second constant current source 33 is connected to the driver circuit 40.

The switch 31 is turned on and off in accordance with an on command and an off command of an current reduction signal from an external device. For example, the switch 31 is provided by a semiconductor element such as a MOSFET.

When the switch 31 is turned on, a parallel circuit is formed by the first constant current source 32 and the second electric current source 33, between the power source 20 and the driver circuit 40. Therefore, the sum of the electric current passing through the first constant current source 32 and the electric current passing through the second constant current source is generated as the constant current having a first current value and is supplied to the driver circuit 40.

On the other hand, when the switch 31 is turned off, a circuit in which only the second constant current source 33 exists is formed between the power source 20 and the driver circuit 40. Therefore, the electric current passing through the second constant current source 33 is generated as the constant current having a second current value and is supplied to the driver circuit 40.

Namely, the constant current generator 30 is a variable constant current source that generates the constant current (e.g., first constant current) having the first current value when the switch 31 is turned on and the constant current (e.g., second constant current) having the second current value smaller than the first current value when the switch 31 is turned off. It is to be noted that the first constant current source 32 and the second constant current source 33 may have the same current capacity or different current capacities. The current capacity of each of the first and second constant current sources 32, 33 is determined depending on the value (intensity) of the constant current to be supplied to the driver circuit 40 by the turning on and off of the switch 31.

The driver circuit 40 includes an amplifier 41. The amplifier 41 provides a circuit that generates an output in phase to the switching signal. An output terminal of the amplifier 41 is connected to the gate of the switching element 50 to drive the switching element 50 with the output of the amplifier 41.

The capacity of the amplifier 41 is determined by the value of the constant current supplied from the constant current generator 30. The capacity of the amplifier 41 corresponds to a switching speed to drive the switching element 50. The capacity of the amplifier 41 increases with an increase in the constant current.

For example, assuming that the capacity of the gate of the switching element 50 is C, the value of the constant current to electrically charge the gate is I, and an on-voltage at which the gate of the switching element 50 is in an on state is V, a rising time T to make the gate of the switching element 50 in the on state is expressed as $T=(C \times V)/I$.

As shown above, an on-period (on-time) required to turn on the switching element 50 is in inverse proportion to the value of the constant current. Therefore, the on-period of the switching element 50 is shortened with the increase in the value of the electric current. The value of the constant current is adjusted by turning on and off the switch 31 in accordance with the current reduction signal.

The load driver of the present embodiment have the above described circuit structure. In the present embodiment, the switching signal and the current reduction signal are generated in an external device, such as an ECU, and inputted into the load driver, for example.

Next, an operation of the load driver shown in FIG. 2 will be described with reference to FIG. 3. FIG. 3 is a time chart illustrating a gate waveform of the switching element 50, the switching signal to turn on and off the switching element 50, the value of the constant current generated in the constant current generator 30, and the current reduction signal.

When the switching signal is at a high level, the amplifier 41 applies a high level voltage to the gate of the switching element 50 since the amplifier 41 generates the output in phase to the switching signal. Thus, the switching element 51 is turned on. When the switching signal is at a low level, the output of the amplifier 41 is at a low level. Therefore, the switching element 50 is turned off. In this way, the driver circuit 40 turns on the switching element 50 when the switching signal is at the high level, and turns off the switching element 50 when the switching signal is at the low level.

At a timing T1, when the switching signal inputted into the driver circuit 40 is switched from the low level to the high level, the switching element 50 is driven by the amplifier 41.

Also, at the timing T1, the switch 31 of the constant current generator 30 is turned on by the on command of the current reduction signal. Therefore, the electric current passing through the first constant current source 32 and the electric current passing through the second constant current source 33 are added together and supplied to the driver circuit 40 as the constant current having the first current value.

The rising time T of the gate of the switching element 50 is determined in accordance with the value of the constant current supplied from the constant current generator 30 (i.e., $T=(C \times V)/I$). The rising time T corresponds to the on-period required to turn on the switching element 50.

Therefore, the driver circuit 40 drives the gate of the switching element 50 with the constant current having the first current value supplied from the constant current generator 30. Accordingly, the gate voltage of the switching element 50 increases with the gradient according to the first current value of the constant current, as shown in FIG. 3.

Thereafter, at a timing T2, that is, when the on-period has elapsed, the switch 31 of the constant current generator 30 is turned off in accordance with the off command of the current reduction signal. Therefore, the constant current generator 30 supplies the electric current passing through the second constant current source 33 to the driver circuit 40 as the constant current having the second current value.

In this way, the constant current generator 30 supplies the driver circuit 40 with the constant current having the first current value during the on-period. Accordingly, the switching element 50 is turned on for the rising time determined by the first current value of the constant current.

After the on-period has elapsed, the constant current generator 30 supplies the constant current having the second current value, which is smaller than the first current value, to the driver circuit 40. In other words, the value of the constant current is reduced at an on-timing where the switching element 50 reaches the on state. Therefore, after the gate of the switching element 50 is turned on, the value of the constant current supplied from the constant current generator 30 to the driver circuit 40 is smaller than that supplied when the gate of the switching element 50 is turned on.

In the present embodiment, as described above, the value of the constant current supplied from the constant current generator 30 to the driver circuit 40 is reduced after the on-period has elapsed.

Since the value of electric current generated in the constant current generator 30 is reduced from the first current value to the second current value after the switching element 50 is turned on, a consumption current in the driver circuit 40 is reduced when the switching element 50 is in the on state.

Until the switching element 50 reaches the on state, the driver circuit 40 is operated by the constant current having the first current value, which is larger than the second current value, the rising speed of the switching element is not reduced. That is, the rising speed of the switching element 50 is maintained at a high level by the constant current having the first current value.

Accordingly, the consumption current in the driver circuit 40 is reduced while maintaining the rising speed of the switching element 50 at a high level.

The constant current generator 30 has a structure where the electric current passing through the first constant current source 32 is added to the electric current passing through the second constant current source 33 by turning on the switch 31. Therefore, after the on-period has elapsed, the constant current having the second current value is provided only by the electric current passing through the second constant current source 33.

Second Embodiment

A second embodiment will be described with reference to FIG. 4. Hereinafter, a structure different from the structure of the first embodiment will be mainly described. In the present embodiment, the amplifier 41 of the driver circuit 40 is constructed of a MOSFET.

Figure 4:
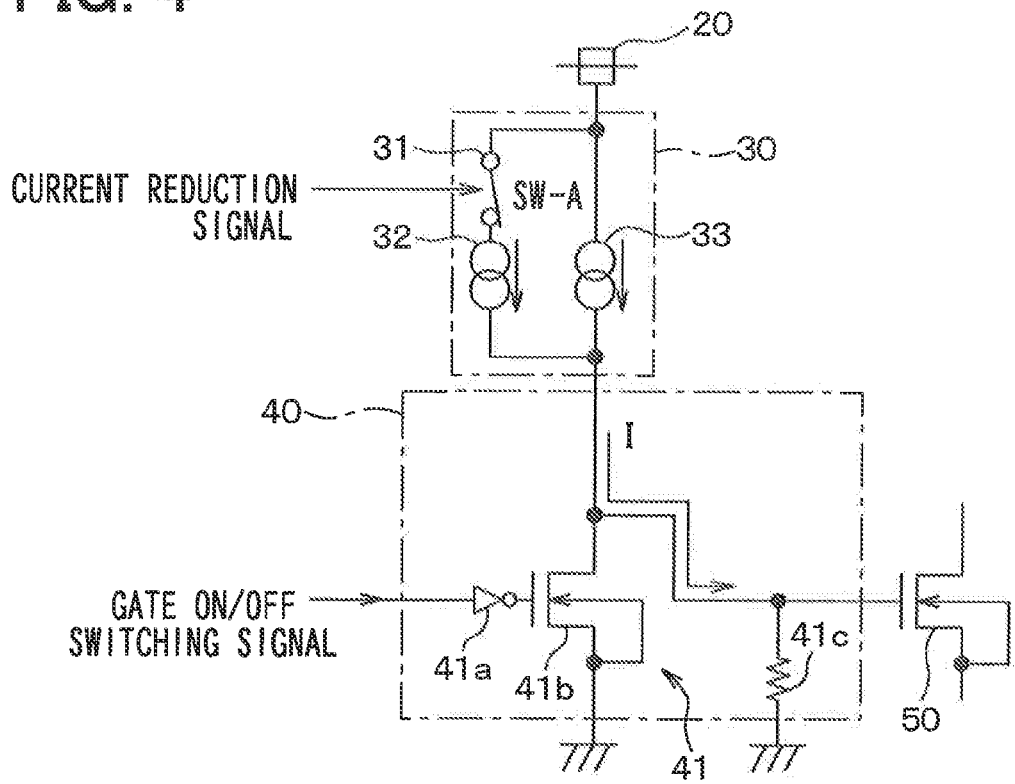
FIG. 4 is a detailed circuit diagram of a load driver according to a second embodiment.

Referring to FIG. 4, the amplifier 41 includes an inverter 41a, a switching element 41b and a resistor 41c.

The inverter 41a is connected to a gate of the switching element 41b. The inverter 41a inverts the switching signal inputted to the driver circuit 40 and sends the inverted switching signal to the gate of the switching element 41b. The switching element 41b is provided by an N-channel MOSFET. A drain of the switching element 41b is connected to the constant current generator 30, and a source of the switching element 41b is connected to a reference voltage line, such as the ground. The resistor 41c is connected between the drain of the switching element 50 and the reference voltage line, such as the ground.

In this way, the amplifier 41 is configured as a source-ground type where the source of the switching element 41b is connected to the reference voltage line. In FIG. 4 and some other figures, the ground is illustrated as an example of the reference voltage line. However, the reference voltage line is not limited to the ground, but may have any other potential as the reference.

When the switching signal is changed from the low level to the high level, the switching element 41b is turned off. Therefore, the constant current (e.g., I in FIG. 4) supplied to the driver circuit 40 from the constant current generator 30 flows toward the gate of the switching element 50. As such, the gate voltage of the switching element 50 increases.

As described above, the amplifier 41 can be constructed of the switching element 41b including the N-channel MOSFET.

Third Embodiment

A third embodiment will be described with reference to FIG. 5. Hereinafter, a structure different from the structures of the first and second embodiments will be mainly described.

In the constant current generator 30 of the first and second embodiments, the electric current passing through the first constant current source 32 is added to the electric current passing through the second constant current source 33 by turning on the switch 31. In the present embodiment, on the other hand, the switch 31 is configured such that the electric current passing through one of the first and second constant current sources 32, 33 is supplied to the driver circuit 40 as the constant current.

Figure 5:
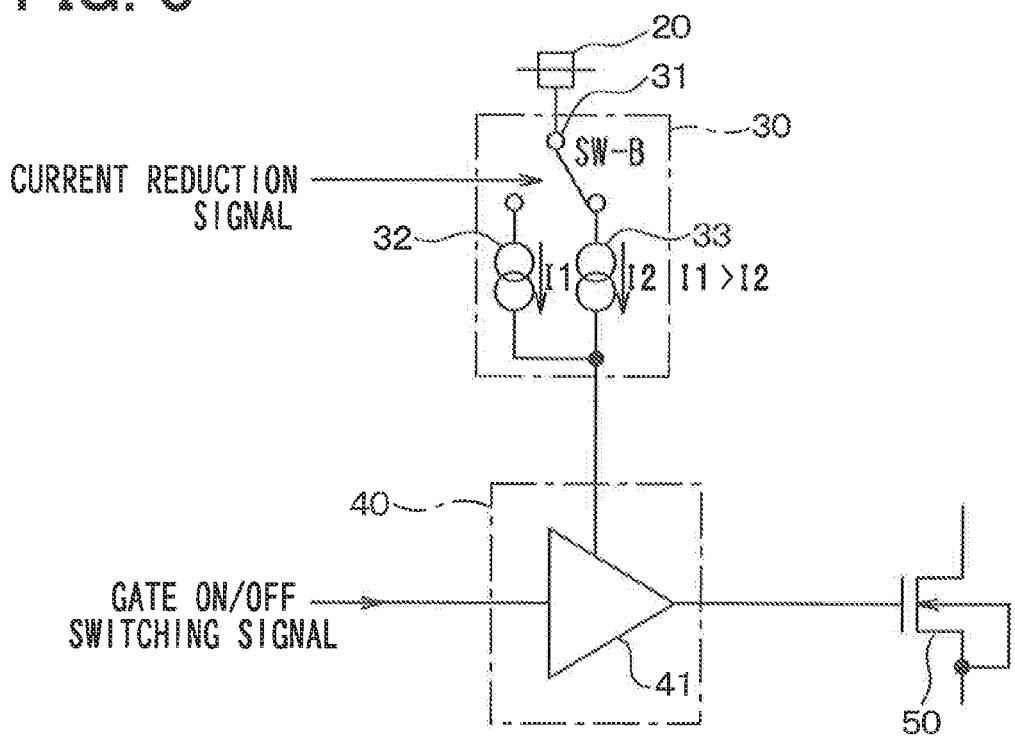
FIG. 5 is a detailed circuit diagram of a load driver according to a third embodiment.

Referring to FIG. 5, the constant current generator 30 includes the switch 31 (SW-B), the first constant current source 32 and the second constant current source 33.

The first constant current source 32 is configured to generate a constant current I1 having the first current value. The second constant current source 33 is configured to generate a constant current I2 having the second current value smaller than the first current value. That is, the current capacity of each of the first and second constant current sources 32, 33 is predetermined to have the relationship of I1>I2.

The switch 31 has a single contact point on a first side and two contact points on a second side. The single contact point on the first side is connected to the power source 20. The two contact points on the second side are connected to the first constant current source 32 and the second constant current source 33, respectively.

The driver 40 and the switching element 50 have the similar structure to those of the first embodiment.

In the constant current generator 30 having the above described structure, during the on-period, that is, until the on-timing where the switching element 50 reaches the on state, the switch 31 is connected to the first constant current source 32 in accordance with the current reduction signal so that the electric current passing through the first constant current source 32 is supplied to the driver circuit 40. In such a case, an electric path from the power supply 20 to the driver circuit 40 via the first constant current source 32 is formed. Therefore, the constant current having the first current value is supplied to the driver circuit 40 from the first constant current source 32.

After the on-period has elapsed, that is, after the on-timing, the switch 31 is connected to the second constant current source 33 in accordance with the current reduction signal so that the electric current passing through the second constant current source 33 is supplied to the driver circuit 40. In such a case, an electric path from the power supply 20 to the driver circuit 40 via the second constant current source 33 is formed. Therefore, the constant current having the second current value is supplied to the driver circuit 40 from the second constant current source 33.

In this way, the constant current generator 30 can be configured to have the multiple constant current sources 32, 33 having the different current values, and the multiple constant current sources 32, 33 can be switched by the switch 31 in accordance with the current reduction signal.

Fourth Embodiment

A fourth embodiment will be described with reference to FIG. 4. Hereinafter, a structure different from those of the first through third embodiments will be mainly described.

In each of the above described embodiments, the constant current generator 30 is provided with the multiple constant current sources 32, 33 each allowing the predetermined value of the electric current. In the present embodiment, on the other hand, the constant current generator 30 is configured such that the value of the constant current supplied to the driver circuit 40 is adjusted in a constant current circuit of the constant current generator 30.

Figure 6:
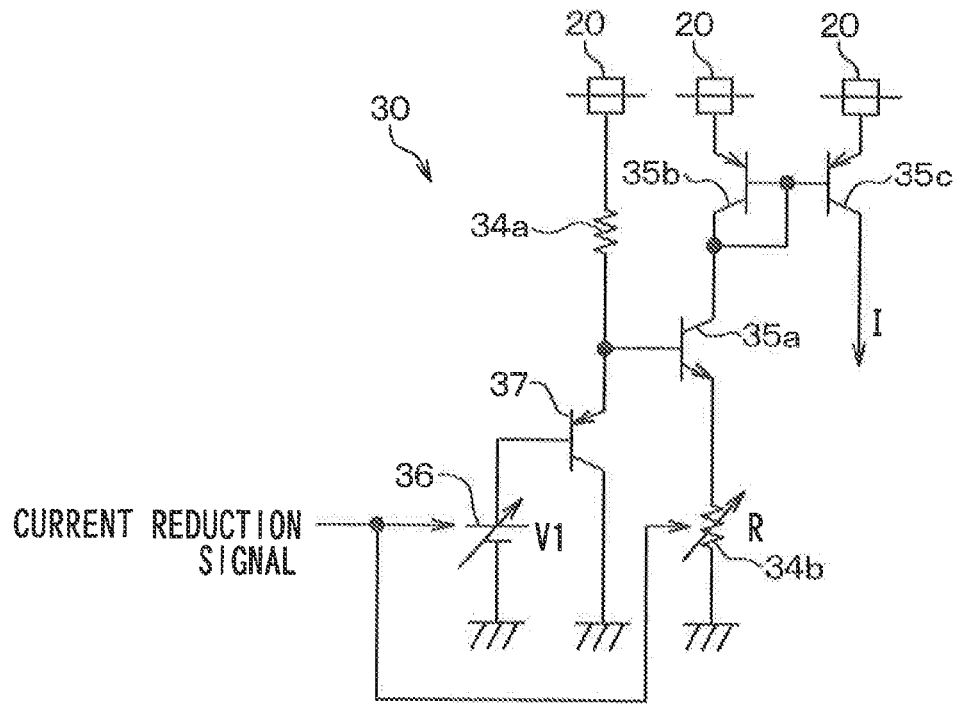
FIG. 6 is a detailed circuit diagram of a constant current generator of a load driver according to a fourth embodiment.

FIG. 6 is a circuit diagram of the constant current generator 30 of the present embodiment. As shown in FIG. 6, the constant current generator 30 has a constant current source including resistors 34a, 34b and transistors 35a, 35b, 35c. A gate voltage applied to the gate of the transistor 35a is controlled by a power source 36 (V1) and the transistor 37.

The resistor 34b has a variable resistance value. The resistance value of the resistor 34b is varied in accordance with the current reduction signal. For example, the resistor 34b is constructed of multiple resistors connected in series, and any of the multiple transistors is bypassed by a transistor. The combined resistance value of the multiple resistors is varied by turning on the transistor in accordance with the current reduction signal.

The transistor 35a is an NPN bipolar transistor. The transistors 35b, 35c, 37 are PNP bipolar transistors. The power source 36 generates a predetermined voltage. Further, the voltage of the power source 36 is variable. The voltage of the power source 36 is varied in accordance with the current reduction signal.

As an example, similar to the resistor 34b, the power source 36 is constructed of multiple power sources, and any of the multiple power sources is bypassed by a transistor. The combined voltage value of the multiple power sources is varied by turning on the transistor in accordance with the current reduction signal.

Moreover, the transistors 35b, 35c are configured to provide a current mirror circuit so that the electric current passing through the transistor 35a and the resistor 34b is transferred to the transistor 35c by the transistor 35b. The electric current (e.g., I in FIG. 6) passing through the transistor 35c is supplied to the driver circuit 40 as the constant current. The PNP transistor 37 is a collector-grounded type, and the voltage from the power source 36 is applied to the resistor 34b.

Therefore, assuming that the constant current is I, the voltage value of the power source 36 is V1, and the resistance value of the resistor 34b is R, the constant current I is expressed as I=V1/R. Namely, the constant current is in proportion to the voltage value of the power source 36, and is in inverse proportion to the resistance value of the resistor 34b.

As such, the constant current increases with an increase in the voltage value of the power source 36 or a decrease in the resistance value of the resistor 34b. The constant current reduces with a decrease in the voltage value of the power source 36 or an increase in the resistance value of the resistor 34b.

As described above, the constant current generator 30 is configured such that the value of the constant current increases with the increase in the voltage value of the power source 36, and reduces with the increase in the resistance value of the resistor 34b.

Further, during the on-period, that is, until the on-timing where the switching element 50 reaches the on state, the voltage value of the power source 36 is adjusted to a first voltage value and the resistance value of the resistor 34b is adjusted to a first resistance value in accordance with the current reduction signal. As such, the constant current generator 30 supplies the driver circuit 40 with the constant current having the first current value, which is generated in accordance with the expression of I=V1/R.

On the other hand, after the on-period has elapsed, that is, after the on-timing, the voltage value of the power source 36 is adjusted to a second voltage value and the resistance value of the resistor 34b is adjusted to a second resistance value. As such, the constant current generator 30 supplies the driver circuit 40 with the constant current having the second current value, which is smaller than the first current value.

As described above, the value of the constant current supplied to the driver circuit 40 is adjusted by varying the voltage value of the power source 36 and the resistance value of the resistor 34b.

In the present embodiment, the resistor 34b corresponds to a variable resistor, and the power source 36 corresponds to a variable power source.

Fifth Embodiment

A fifth embodiment will be described with reference to FIG. 7. Hereinafter, a structure different from those of the first through fourth embodiments will be mainly described.

The load driver of the present embodiment is characterized by maintaining the rising speed of a power element as the load 10 at a high level while reducing the consumption current in a case where the switching element 50 is connected to a power element as the load 10.

Figure 7:
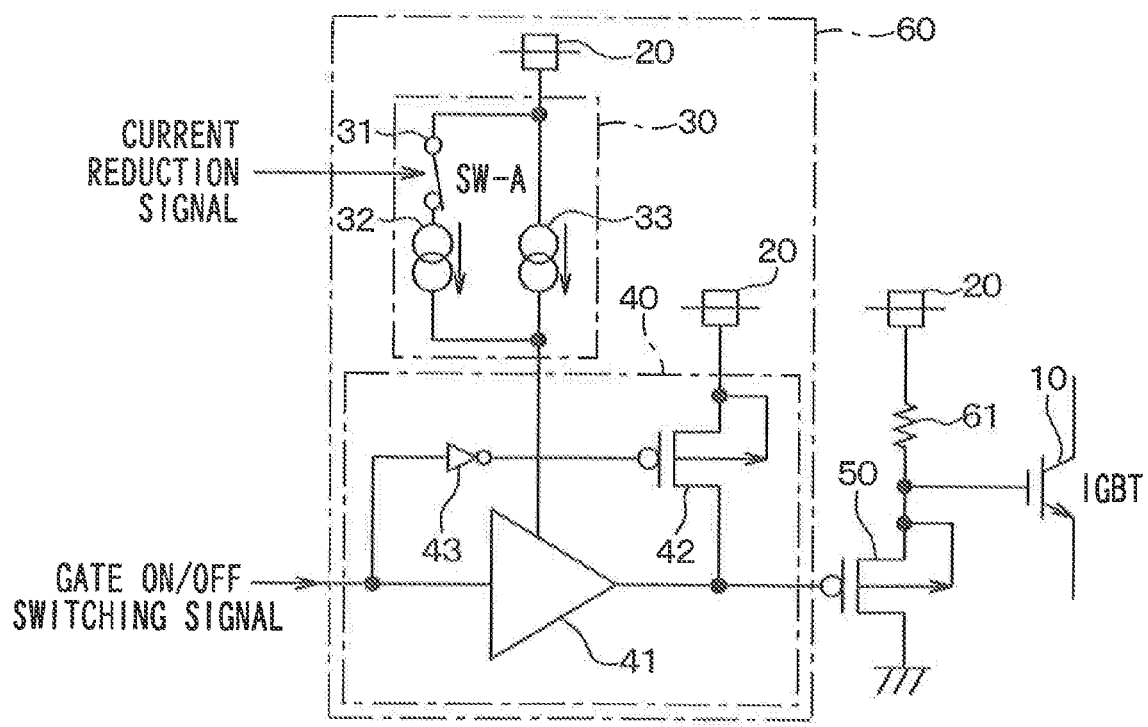
FIG. 7 is a detailed circuit diagram of a load driver according to a fifth embodiment.

FIG. 7 is a circuit diagram of the load driver, in a state of being connected to the load 10, according to the present embodiment. The load 10 is the power element constructed of a semiconductor switching element. For example, the power element is provided by an IGBT. Hereinafter, the load 10 is described as the power element 10.

The constant current generator 30 and the driver circuit 40 are configured to operate as a pre-driver unit 60 for driving the power element 10. The pre-driver unit 60 is connected to the switching element 50. The switching element 50 is connected to the power source 20 through a resistor 61. Further, a gate of the power element 10 is connected between the resistor 61 and the switching element 50.

In the present embodiment, the switching element 50 is provided by a P-channel MOSFET, for example. The driver circuit 40 includes a switching element 42 and an inverter 43, in addition to the amplifier 41. The switching element 42 is connected between the power source 20 and an output terminal of the amplifier 41.

The switching element 42 is provided by a P-channel MOSFET, for example. A source of the switching element 42 is connected to the power source 20, and a drain of the switching element 42 is connected to the output terminal of the amplifier 41.

The inverter 43 is an element that inverts the switching signal inputted into the driver circuit 40 and outputs the inverted switching signal to the switching element 42. The inverter 43 is connected to a gate of the switching element 42.

In such a structure, the pre-driver unit 60 drives the switching element 50 by the constant current having the first current value during the on-period where the power element 10 is turned on. On the other hand, after the on-period elapsed, the pre-driver unit 60 drives the switching element 50 by the constant current having the second current value. Namely, the constant current of the pre-driver unit 60 is reduced from the first current value to the second current value at the on-timing where the power element 10 reaches the on state. The value of the constant current can be adjusted by controlling the switch 31 of the constant current generator 30 in accordance with the current reduction signal, as described above.

Accordingly, the constant current of the pre-driver unit 60 can be reduced at the on-timing where the power element 10 becomes the on state. In such a structure, the consumption current in the pre-driver unit 60 is reduced while maintaining the rising speed of the power element 10 at a high level.

Sixth Embodiment

Figure 9:
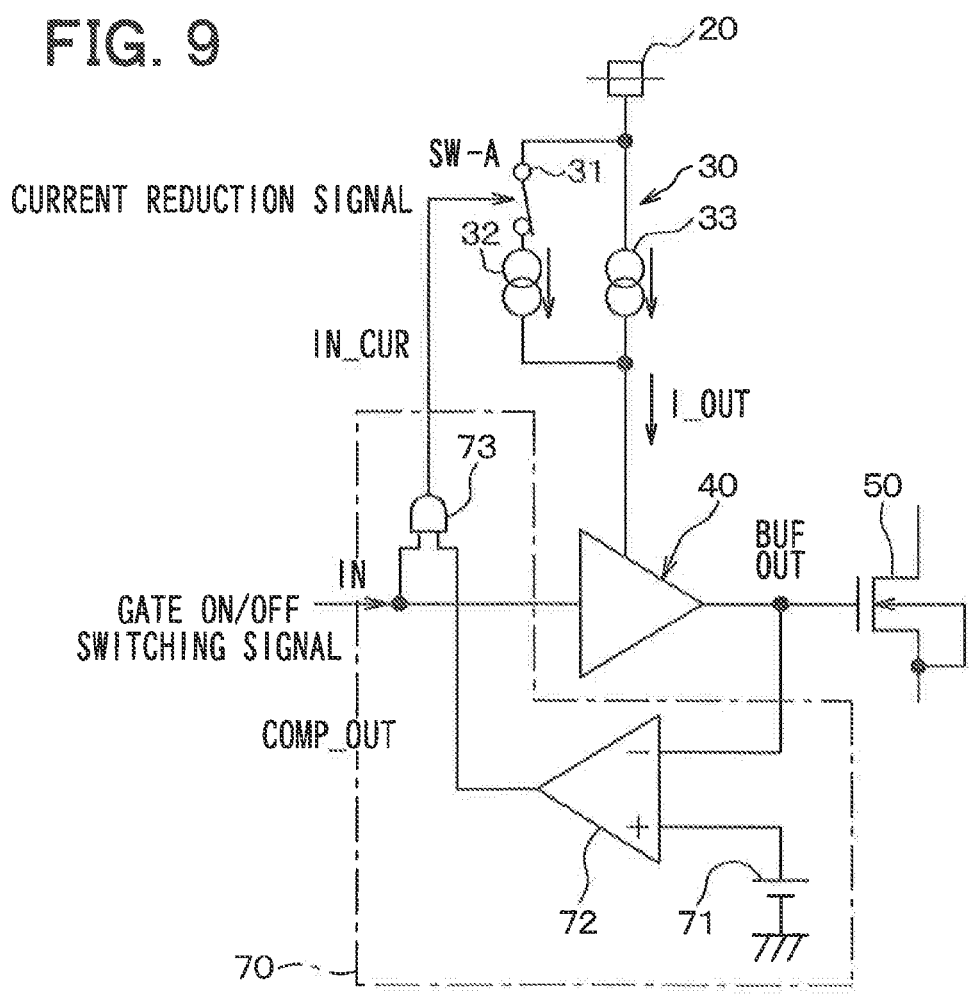
FIG. 9 is a detailed circuit diagram of a current reduction control circuit of the load driver according to the sixth embodiment.
Figure 10:
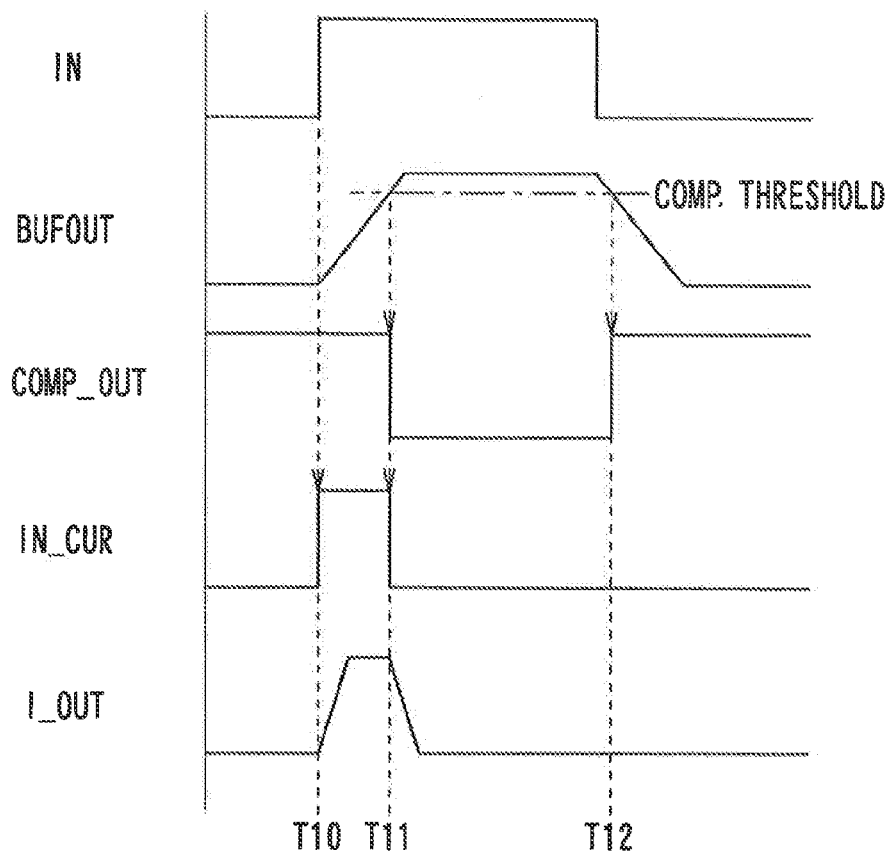
FIG. 10 is a time chart for explaining an operation of the load driver according to the sixth embodiment.

A sixth embodiment will be described with reference to FIGS. 8 through 10. Hereinafter, a structure different from those of the first through fifth embodiments will be mainly described.

In the above described embodiments, the current reduction signal is inputted into the constant current generator 30 from the external device at a predetermined timing, based on the rising time of the gate of the switching element 50 or the power element 10. Alternatively, the load driver can additionally have a circuit that generates the current reduction signal utilizing a timing to input the switching signal. In such a case, accuracy of the rising time, that is, the timing to control the value of the constant current can be improved by monitoring the gate voltage of the switching element 50 and the power element 10.

Hereinafter, a structure of the circuit that generates the current reduction signal will be described. FIG. 8 is a schematic view illustrating the load driver according to the present embodiment.

Figure 8:
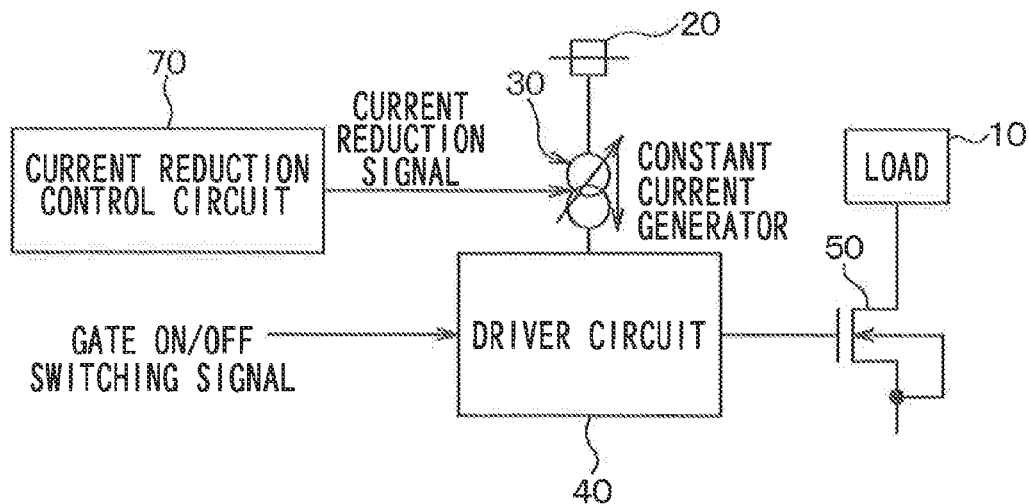
FIG. 8 is a detailed circuit diagram of a load driver according to a sixth embodiment.

As shown in FIG. 8, the load driver includes a current reduction control circuit 70 as the circuit that generates the current reduction signal. The current reduction control circuit 70 detects a timing that the driver circuit 40 turns on the switching element 50 during the switching signal to turn on the switching element 50 is inputted into the driver circuit 40 by comparing the output of the driver circuit 40 to a predetermined value, and generates the current reduction signal at the detected timing.

Next, a structure of the electric current reduction control circuit 70 will be described in detail with reference to FIG. 9. In the present embodiment, the constant current generator 30 exemplarily has the switch 31 (SW-A in FIG. 9), the first constant current source 32, and the second constant current source 33, similar to the constant current generator 30 of the first embodiment shown in FIG. 2. As shown in FIG. 9, the electric current reduction control circuit 70 includes a reference voltage source 71, a comparator 72 and an AND circuit 73.

The reference voltage source 71 generates a voltage having a predetermined value by dividing a source voltage (e.g., 5V) through multiple resistors. The predetermined value of the voltage is used as a comparator threshold of the comparator 72. The comparator 72 compares the output BUFOUT of the driver circuit 40 to the comparator threshold, and generates a compared result COMP_OUT.

The comparator threshold is inputted into a non-inverting input terminal of the comparator 72, and the output BUFOUT of the driver circuit 40 is inputted into an inversing input terminal of the comparator 72. The output of the driver circuit 40 corresponds to the gate voltage of the switching element 50.

The AND circuit 73 turns on or off the switch 31 of the constant current generator 30 based on the switching signal IN and the compared result of the comparator 72. An output IN_CUR of the AND circuit 73 corresponds to the current reduction signal.

That is, when both the switching signal and the compared result of the comparator 72 are at the high level, the AND circuit 73 generates a high level signal as the off command of the current reduction signal to turn on the switch 31. On the other hand, at least one of the switching signal and the compared result of the comparator 72 is at the low level, the AND circuit 73 generates a low level signal as the on command of the current reduction signal to turn off the switch 31.

In this way, the current reduction control circuit 70 detects the on voltage of the gate of the switching element 50 by means of the comparator 72, and reduces the electric current I_OUT of the constant current generator 30 at the detected timing.

Next, an operation of the load driver shown in FIG. 9 will be described with reference to a time chart shown in FIG. 10.

Firstly, at a timing T10, the switching signal IN becomes the high level to turn on the switching element 50. At this timing, however, because the output BUFOUT of the driver circuit 40 is still lower than the comparator threshold, the output COMP_OUT of the comparator 72 is the high level and the output IN_CUR of the AND circuit 73 is the high level to indicate the off command of the current reduction signal.

Therefore, the constant current generator 30 turns on the switch 31 in accordance with the off command of the current reduction signal. Accordingly, the output I_OUT of the constant current generator 30 becomes the first current value due to the electric current passing through the first constant current source 32 and the electric current passing through the second constant current source 33 being added together. Thus, the constant current generator 30 supplies the constant current having the first current value to the driver circuit 40. With this, the output BUFOUT of the driver circuit 40 begins to rise in accordance with the first current value.

At a timing T11, when the output BUFOUT of the driver circuit 40 reaches the comparator threshold, the output COMP_OUT of the comparator 72 becomes the low level. Therefore, even if the switching signal IN is at the high level, the output IN_CUR of the AND circuit 73 becomes the low level indicating the on command of the current reduction signal.

The constant current generator 30 receives the on command of the current reduction signal, and turns off the switch 31. Therefore, the output I_OUT of the constant current generator 30 becomes the second current value smaller than the first current value, and is supplied to the driver circuit 40 as the constant current.

After the switching signal IN becomes the low level, the output BUFOUT of the driver circuit 40 becomes lower than the comparator threshold at a timing T12, and thus the output COMP_OUT of the comparator 72 becomes the high level. However, the switching signal IN is still at the low level. Therefore, the output IN_CUR of the AND circuit 73 is at the low level, that is, the on command of the current reduction signal continues, hence the electric current supplied to the driver circuit 40 does not increase.

As described above, the current reduction signal can be generated based on the switching signal IN and the output BUFOUT of the driver circuit 40 by employing the current reduction control circuit 70 in the load driver. Therefore, it is not necessary to input the current reduction signal into the load driver from the external device.

Seventh Embodiment

A seventh embodiment will be described with reference to FIGS. 11 through 13. Hereinafter, a structure different from that of the sixth embodiment will be mainly described. In the present embodiment, the current reduction control circuit 70 measures a timer period from a timing where the switching signal to turn on the switching element 50 is begun to be inputted into the driver circuit 40 to a timing where the driver circuit 40 drives the switching element 50 while the switching signal is being inputted into the driver circuit 40. The current reduction control circuit 70 outputs the current reduction signal when the timer period has elapsed.

Figure 11:
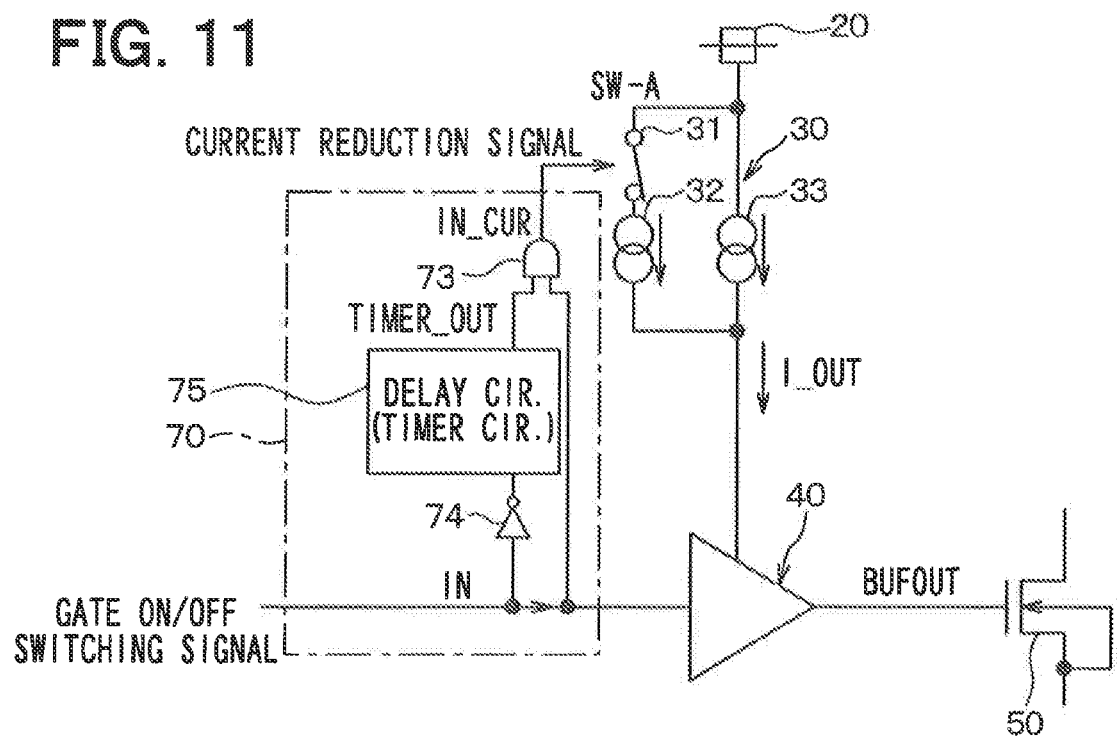
FIG. 11 is a detailed circuit diagram of a load driver according to a seventh embodiment of the present invention.

FIG. 11 is a circuit diagram of the load driver according to the present embodiment. As shown in FIG. 11, the current reduction control circuit 70 includes an inverter 74, a delay circuit 75, and an AND circuit 73.

The inverter 74 is an inverting element that inverts the switching signal IN and inputs the inverted switching signal IN into the delay circuit 75. The delay circuit 75 is a timer circuit that outputs the signal from the inverter 74 by delaying for the predetermined timer period. An output TIMER_OUT of the delay circuit 75 is at a high level signal during the timer period, and becomes a low level signal after the timer period has elapsed. The timer period is determined as a time period until the switching element 50 becomes the on state.

Figure 12A:
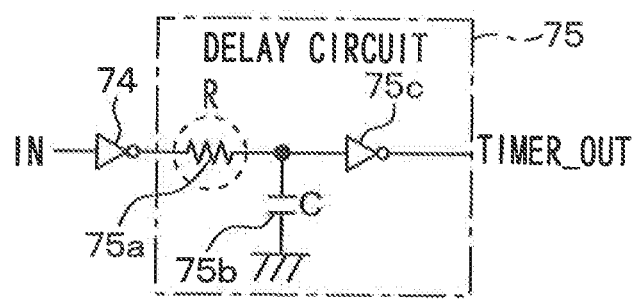
FIG. 12A is a detailed circuit diagram of a delay circuit of the load driver according to the seventh embodiment.
Figure 13:
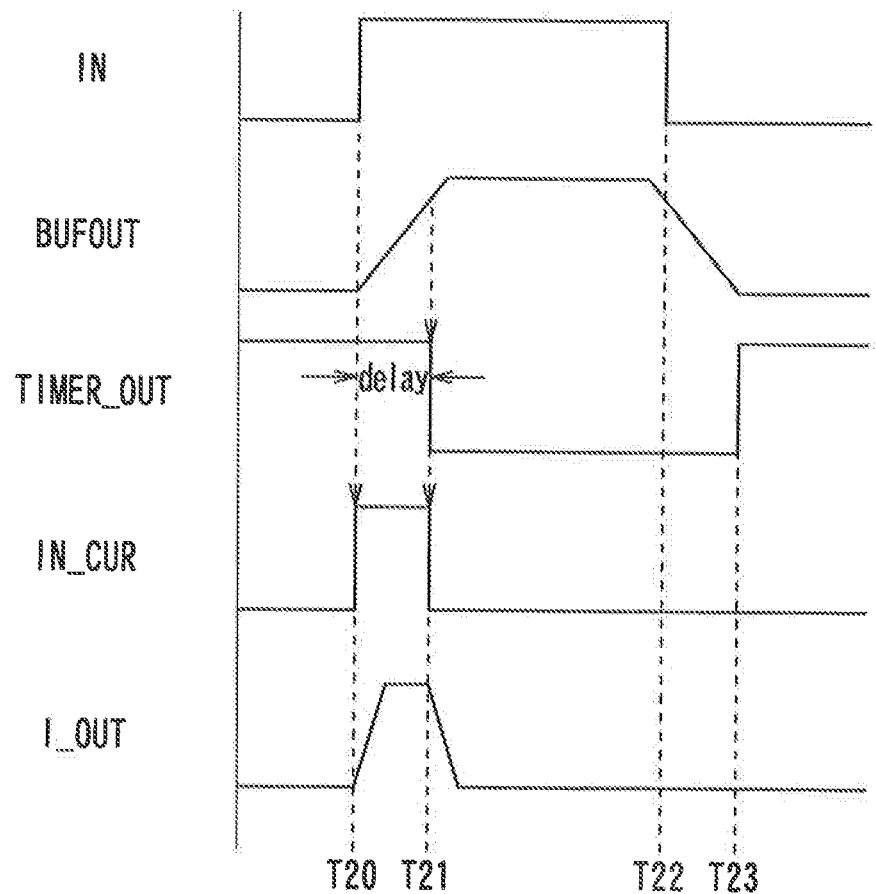
FIG. 13 is a time chart for explaining an operation of the load driver according to the seventh embodiment.

FIG. 12A is a circuit diagram of the delay circuit 75. As shown in FIG. 12A, the delay circuit 75 has a resistor 75a, a capacitor 75b, and an inverter 75c. The delay circuit 75 is configured as a CR circuit where a signal inputted therein is inverted at the inverter 75c by delaying for a time constant (the timer period), and outputted.

Figure 12B:
FIG. 12B is a diagram illustrating a variable resistor of the delay circuit as another example of the resistor according to the seventh embodiment.

The resistor 75a shown in FIG. 12A may be modified into a variable resistor 75a as shown in FIG. 12B. By trimming the resistance value, the timer period can be accorded with the on-period until the switching element 50 becomes the on state.

The AND circuit 73 is configured to turn on or off the switch 31 of the constant current generator 30 based on the switching signal IN and the output TIMER_OUT of the delay circuit 75. That is, when both the switching signal and the output of the delay circuit 75 are at the high level, the AND circuit 73 outputs the high level signal as the off command of the current reduction signal to turn on the switch 31. When at least one of the switching signal and the output of the delay circuit 75 is at the low level, the AND circuit 73 outputs the low level signal as the on command of the current reduction signal to turn off the switch 31.

As described above, the current reduction control circuit 70 measures the timer period from the timing where the switching signal is inputted into the driver circuit 40 by the delay circuit 75 to the timing where the driver circuit 40 turns on the switching element 50, and reduces the current I_OUT of the constant current generator 30 at the timing where the timer period has elapsed.

Next, an operation of the load driver shown in FIGS. 11 and 12 will be described with reference to a time chart shown in FIG. 13.

When the switching signal IN becomes the high level at a timing T20, the output BUFOUT of the driver circuit 40 begins to increase. Because the low level signal is inputted into the delay circuit 75 through the inverter 74, the output TIMER_OUT of the delay circuit 75 is at the high level corresponding to the off command of the current reduction signal by the inverter 75c until the timer period (i.e., delay period in FIG. 13) elapses.

Therefore, the constant current generator 30 turns on the switch 31 to generate the constant current having the first current value by adding the current passing through the first constant current source 32 to the current passing through the second constant current source 33. As such, the output I_OUT of the constant current generator 30 becomes the first current value. Accordingly, the constant current generator 30 supplies the constant current having the first current value to the driver circuit 40.

At a timing T21, since the timer period (delay) has elapsed, the output TIMER_OUT of the delay circuit 75 becomes the low level corresponding to the on command of the current reduction signal by the inverter 75c. Therefore, the constant current generator 30 turns off the switch 31. Accordingly, the output I_OUT of the constant current generator 30 becomes the second current value smaller than the first current value, and the current value of the constant current supplied to the driver circuit 40 is reduced.

At a timing T22, the switching signal IN becomes the low level to turn off the switching element 50. At a timing T23, that is, when the timer period (delay) has elapsed from the timing T22, the output TIMER_OUT of the delay circuit 75 becomes the high level. However, the switching signal IN is at the low level. Therefore, the output IN_CUR of the AND circuit 73 is at the low level corresponding to the on command of the current reduction signal. Accordingly, even if the output TIMER_OUT of the delay circuit 75 becomes the high level, the current supplied to the driver circuit 40 does not increase.

As described above, since the load driver has the current reduction control circuit 70 that measures the timer period through the delay circuit 75, the current reduction signal can be generated within the load driver. Therefore, it is not necessary to feed the current reduction signal from the external device.

In the present embodiment, the CR circuit is employed as an example of the delay circuit 75. Alternatively, a digital timer that counts the time using a clock may be employed. Further, the delay circuit 75 corresponds to a timer circuit.

Eighth Embodiment

Figure 14:
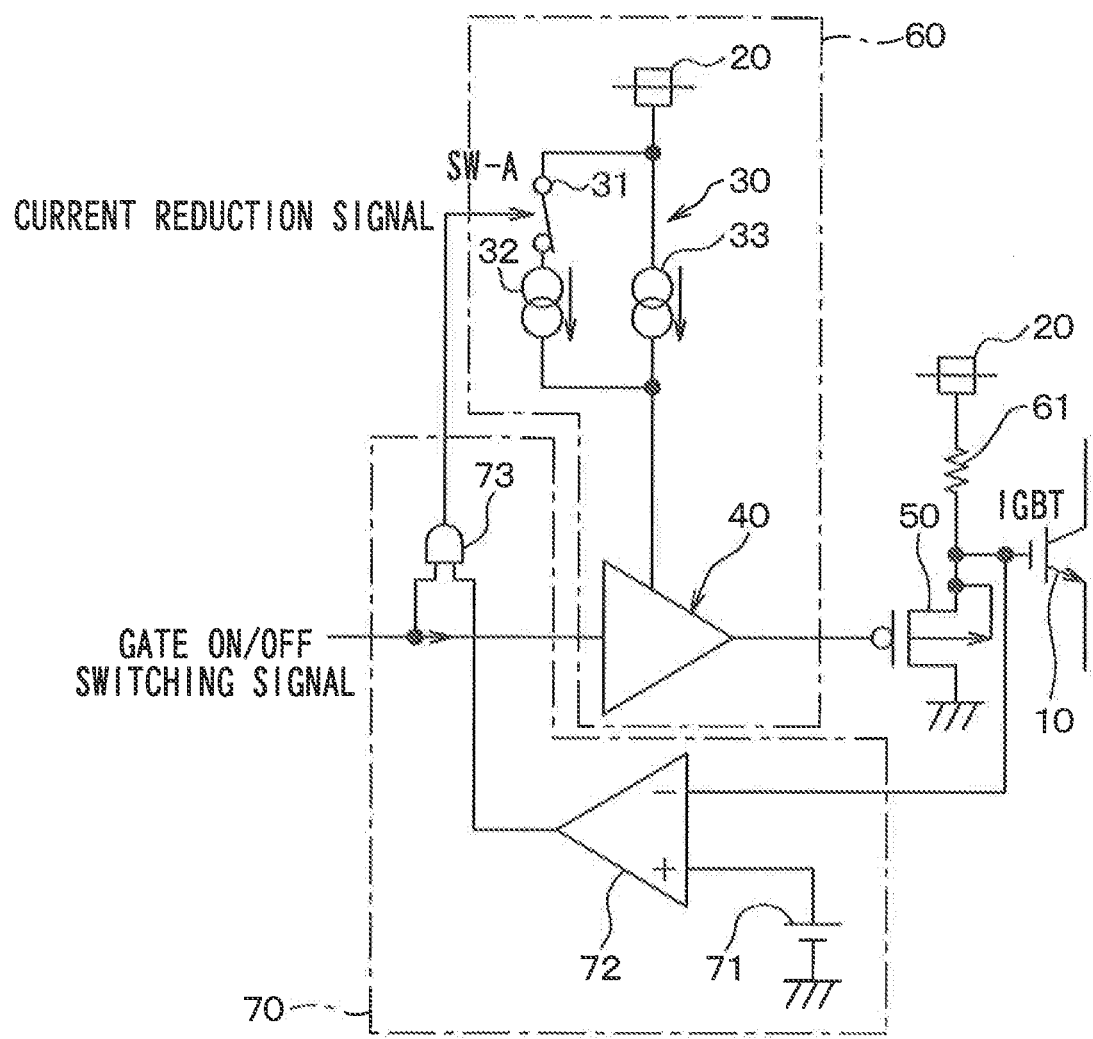
FIG. 14 is a detailed circuit diagram of a load driver according to an eighth embodiment of the present invention.

An eighth embodiment will be described with reference to FIG. 14. Hereinafter, a structure different from that of the sixth embodiment will be mainly described. FIG. 14 is a schematic diagram of a load driver according to the eighth embodiment. As shown in FIG. 14, the power element 10 can be employed as the load 10, and the current reduction control circuit 70 can be added to the pre-driver unit 60. Also, the switching element 50 is a P-channel MOSFET, for example.

It is to be noted that an on state of the power element 10 means a conducted state, and an off state of the power element 10 means a non-conducted state. This can be applied to the other embodiments.

In a case where the power element 10 is employed as the load 10, a voltage is applied to the gate of the power element 10 by turning off the switching element 50 through the driver circuit 40, and the constant current supplied to the driver circuit 40 is reduced after the power element 10 becomes the on state. In the present embodiment, therefore, the current reduction control circuit 70 detects the timing where the power element 10 becomes the on state while the switching signal is inputted into the driver circuit 40 by comparing the gate voltage of the power element 10 to the comparator threshold, and outputs the on command of the current reduction signal at the detected timing. Namely, the comparator 72 of the current reduction control circuit 70 compares the gate voltage of the power element 10 and the comparator threshold.

In such a structure, the current reduction signal to reduce the current value of the constant current of the constant current generator can be generated within the load driver. It is not necessary to feed the current reduction signal from the external device.

Ninth Embodiment

Figure 15:
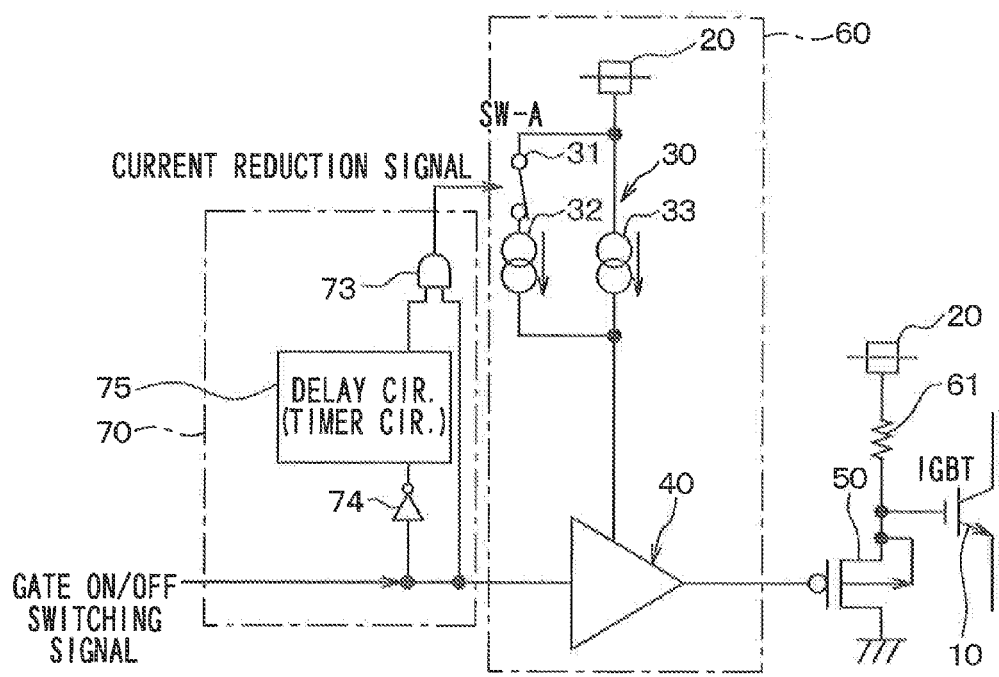
FIG. 15 is a detailed circuit diagram of a load driver according to a ninth embodiment of the present invention.

A ninth embodiment will be described with reference to FIG. 15. Hereinafter, a structure different from that of the seventh embodiment will be mainly described. FIG. 15 is a circuit diagram of a load driver according to the ninth embodiment.

As shown in FIG. 15, the power element 10 is employed as the load 10. Also, the load driver is provided with the current reduction control circuit 70 shown in FIG. 11. In the example of FIG. 15, the switching element 50 is a P-channel MOSFET.

The current reduction control circuit 70 detects the timer period from the timing where the switching signal is begun to be inputted into the driver circuit 40 to the timing where the power element 10 becomes the on state while the switching signal is inputted into the driver circuit 40 by means of the delay circuit 75, and outputs the on command of the current reduction signal when the timer period has elapsed. That is, the timer period is determined to the period of time until the power element 10 becomes the on state.

As described above, the current reduction control circuit 70 including the delay circuit 75 can be employed in the load driver.

Tenth Embodiment

Figure 16:
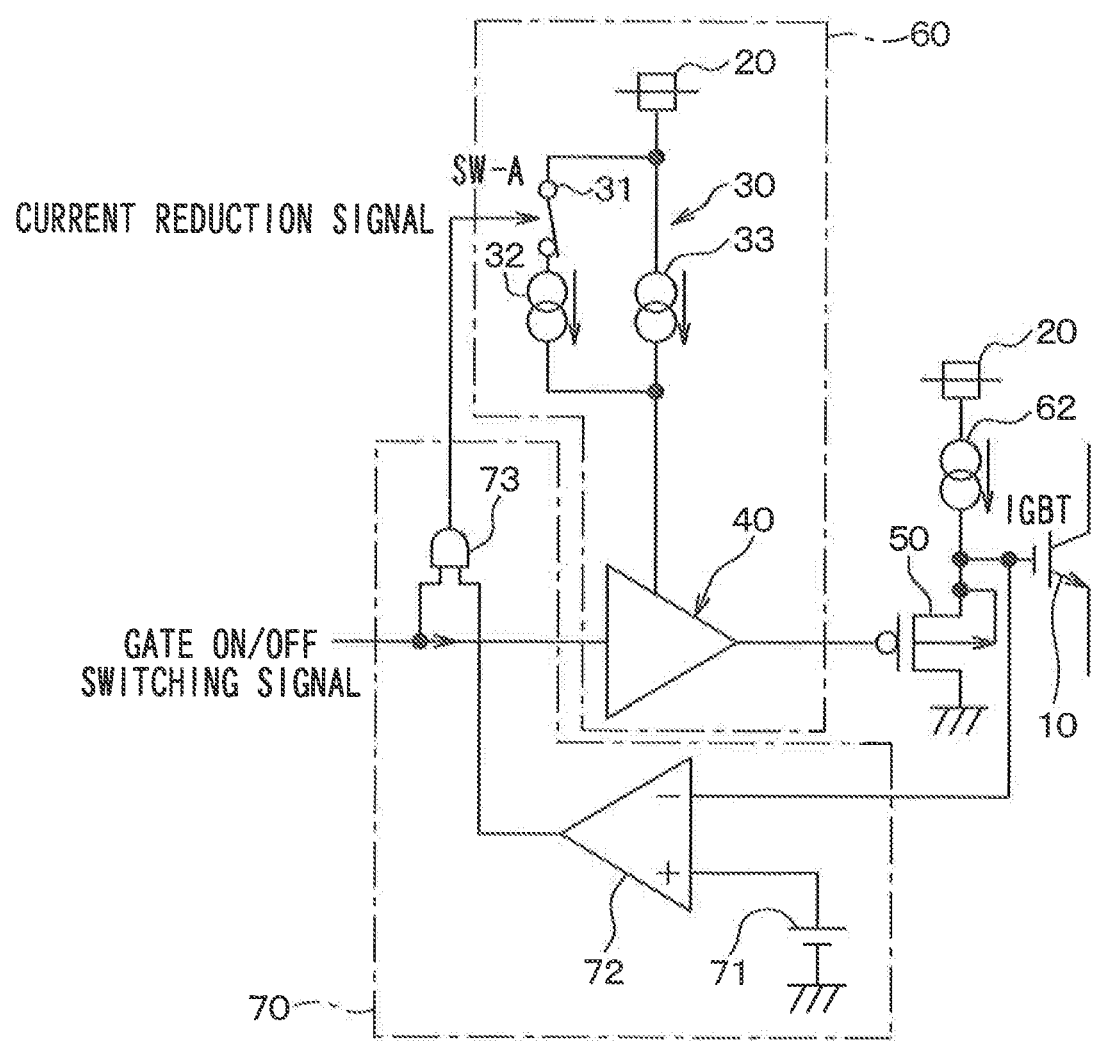
FIG. 16 is a detailed circuit diagram of a load driver according to a tenth embodiment of the present invention.

A tenth embodiment will be described with reference to FIG. 16. Hereinafter, a structure different from that of the eighth embodiment will be mainly described. FIG. 16 is a circuit diagram of a load driver according to the tenth embodiment.

As shown in FIG. 16, the resistor 61 that pulls up the gate of the power element 10 can be replaced into a constant current source 62. In such a case, the switching element 50 is a P-channel MOSFET.

The constant current source 62 supplies a constant current to the gate of the power element 10 until the gate voltage of the power element 10 reaches a predetermined voltage, that is, the ON voltage when the switching element 50 is turned off. In this way, the gate of the power element 10 can be driven by the constant current supplied from the constant current source 62.

In such a case, the constant current source 62 corresponds to a third constant current source.

Eleventh Embodiment

An eleventh embodiment will be described with reference to FIG. 17. Hereinafter, a structure different from that of the ninth embodiment will be mainly described.

Figure 17:
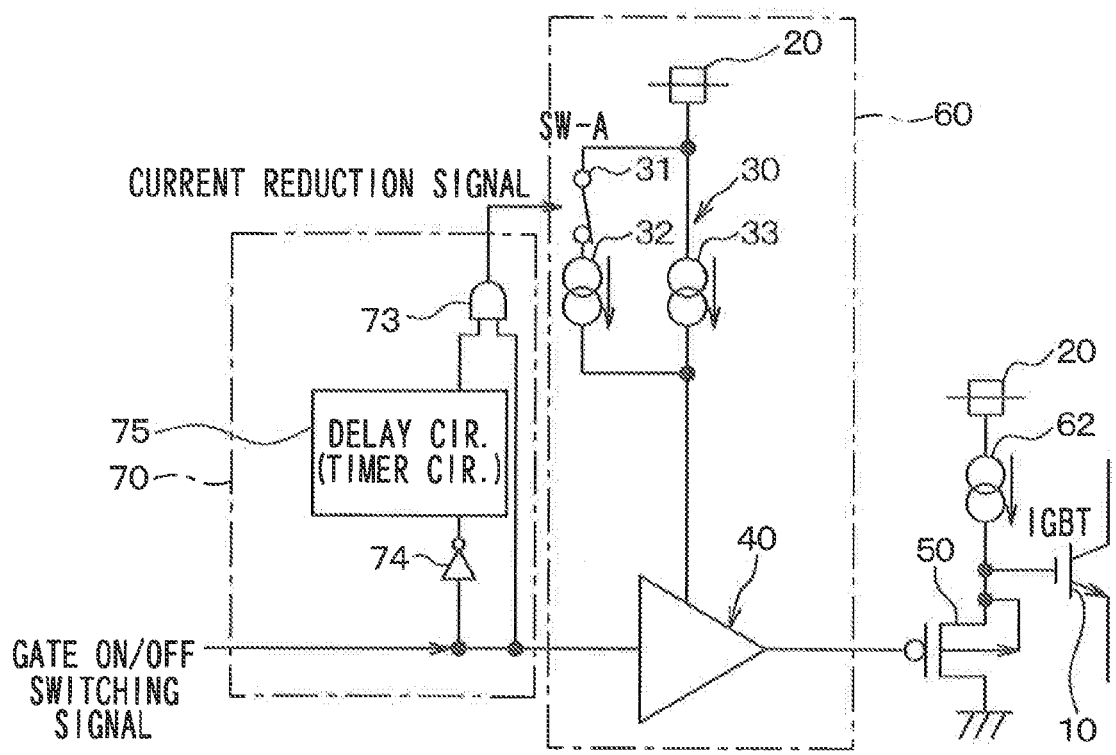
FIG. 17 is a detailed circuit diagram of a load driver according to an eleventh embodiment of the present invention.

FIG. 17 is a circuit diagram of a load driver according to the eleventh embodiment. As shown in FIG. 17, also in a case where the current reduction control circuit 70 is constructed of the delay circuit 75, the resistor 61 that pulls up the gate of the power element 10 can be replaced into the constant current source 62, similar to the tenth embodiment.

In such a case, the constant current source 62 corresponds to the third constant current source.

Twelfth Embodiment

A twelfth embodiment will be described with reference to FIGS. 18 through 20. Hereinafter, a structure different from those of the tenth and eleventh embodiments will be mainly described.

In the tenth and eleventh embodiments, the switching element 50 is driven by the constant current using the constant current source 62. In a load driver according to the twelfth embodiment, therefore, the current reduction signal is generated using the current passing through the constant current source 62.

Figure 18:
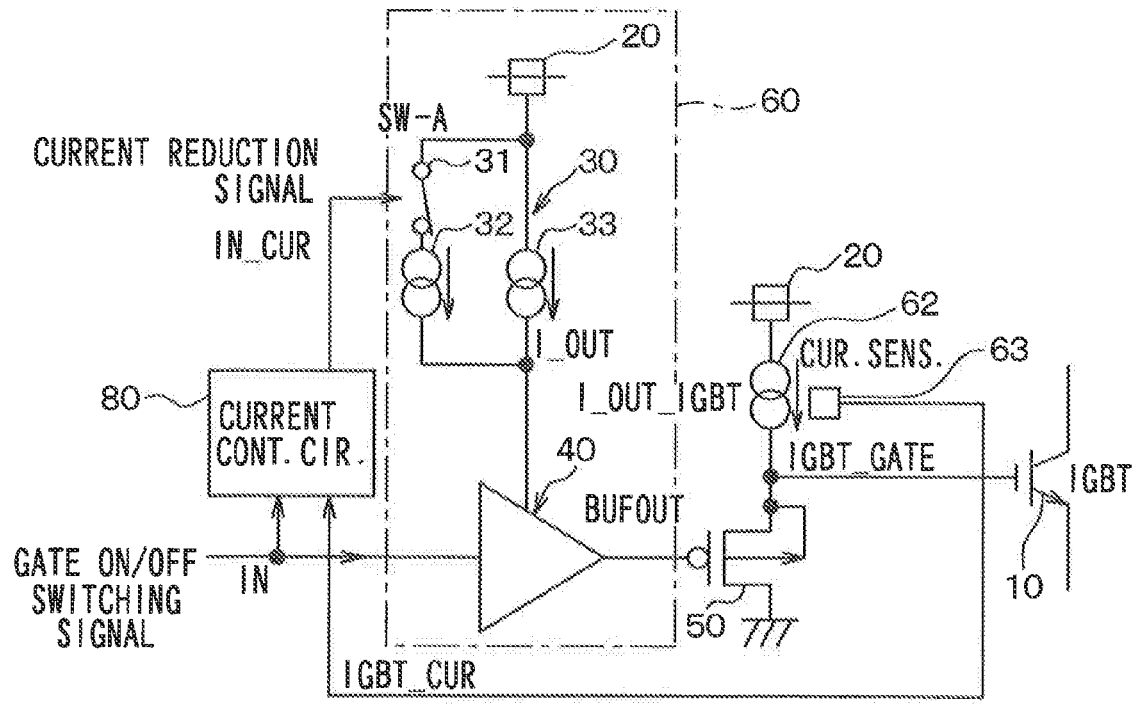
FIG. 18 is a detailed circuit diagram of a load driver according to a twelfth embodiment of the present invention.

FIG. 18 is a circuit diagram of the load driver according to the twelfth embodiment. As shown in FIG. 18, the load driver includes the pre-driver unit 60 including the constant current generator 30 and the driver circuit 40, the constant current source 62 that supplies the constant current to the gate of the power element 10 to drive the gate of the power element 10, the switching element 50 that turns on and off the power element 10, and a current control circuit 80.

Further, as a whole circuit structure for driving the power element 10 as the load, the load driver includes an electric current sensor 63 that monitors the current value of the constant current source 62.

The constant current source 62 supplies the switching element 50 with the constant current I_OUT_IGBT until the gate voltage of the power element 10 reaches the ON voltage when the switching element 50 is turned off.

The electric current sensor 63 detects the electric current passing through the constant current source 62. The electric current sensor 63 is, for example, a current detecting sensor that detects a magnetic field in a contact-less manner, such as a Hall element. The electric current sensor 63 outputs a high level signal when the detected current exceeds a determination threshold, and a low level signal when the detected current is below the determination threshold.

The current control circuit 80 outputs the current reduction signal based on the switching signal IN and a determination result IGBT_CUR of the electric current sensor 63. Specifically, the current control circuit 80 receives the switching signal IN and the detection results of the electric current sensor 63, and outputs the on command of the current reduction signal when the determination result from the electric current sensor 63 is below the determination threshold after receiving the switching signal IN to turn on the power element 10.

Figure 19:
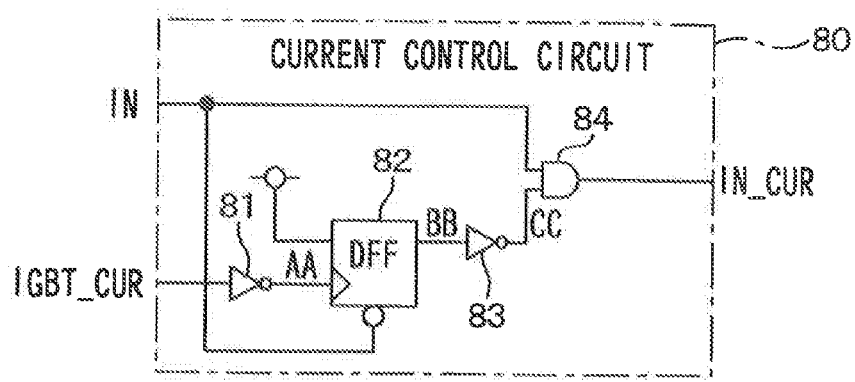
FIG. 19 is a detailed circuit diagram of a current control circuit of the load driver according to the twelfth embodiment.
Figure 20:
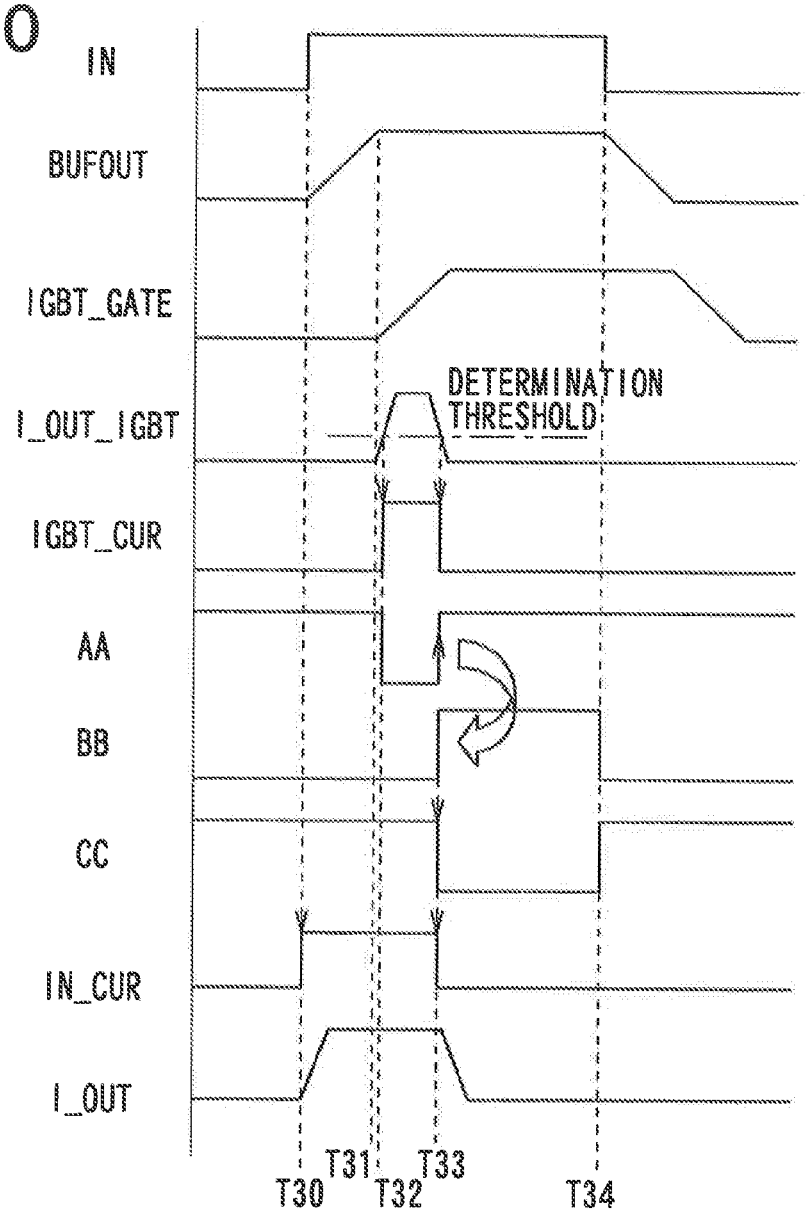
FIG. 20 is a time chart for explaining an operation of the load driver according to the twelfth embodiment.

FIG. 19 is a circuit diagram of the current control circuit 80. As shown in FIG. 19, the current control circuit 80 includes an inverter 81, a D-type flip-flop (DFF) 82, an inverter 83 and an AND circuit 84.

The inverter 81 inverts the determination result of the current sensor 63, and sends the inverted result into a CLK terminal of the D-type flip-flop 82. An input terminal of the D-type flip-flop 82 is applied with a constant voltage from the power source. Therefore, an output BB of the D-type flip-flop 82 is controlled at a timing where the output AA of the inverter 81 changes from the low level to the high level. The inverter 83 inverts the output B of the D-type flip-flop 82, and sends the inverted output to the AND circuit 84.

The AND circuit 84 generates an output IN_CUR to turn on or off the switch 31 based on the switching signal IN and an output CC of the inverter 83. When both the switching signal IN and the output CC of the inverter 83 are at the high level, the AND circuit 84 outputs the high level signal as the off command of the current reduction signal to turn on the switch 31. On the other hand, when at least one of the switching signal and the output CC of the inverter 83 is at the low level, the AND circuit 84 outputs the low level signal as the on command of the current reduction signal to turn off the switch 31.

As described above, the current control circuit 80 is configured to reduce the current I_OUT of the constant current generator 30 based on the current passing through the constant current source 62.

Next, an operation of the load driver shown in FIG. 18 will be described with reference to a time chart shown in FIG. 20.

At a timing T30, the switching signal IN becomes the high level. Also, because the current does not pass through the constant current source 62, the determination result I_OUT_IGBT of the electric current sensor 63 becomes the low level output. Therefore, the output AA of the inverter 81 is kept at the high level, and the output B of the D-type flip-flop 82 is kept at the low level. As such, because the output CC of the inverter 83 is at the high level, the output IN_CUR of the AND circuit 84 corresponds to the off command of the current reduction signal.

Therefore, the output I_OUT of the constant current generator 30 becomes the first current value where the current passing through the first constant current source 32 is added to the current of the second constant current source 33. The constant current generator 30 supplies the constant current having the first current value to the driver circuit 40. As such, the output BUFOUT of the driver circuit 40 begins to increase in response to the first current value.

At a timing T31, when the switching element 50 is turned off by the driver circuit 40, the current I_OUT_IGBT passing through the constant current source 62 increases as well as the gate voltage IGBT_GATE of the power element 10 increases.

At a timing T32, when current I_OUT_IGBT passing through the constant current source 62 exceeds the determination threshold, the determination result IGBT_CUR of the electric current sensor 63 becomes the high level. Therefore, the output AA of the inverter 81 changes from the high level to the low level.

Thereafter, the gate voltage of the power element 10 increases. When the gate voltage of the power element 10 increases to the level of the power source voltage of the constant current source 62, that is, at a timing T33, the current from the constant current source 62 is stopped. Therefore, the current I_OUT_IGBT passing through the constant current source 62 is below the determination threshold.

With this, the determination result IGBT_CUR of the electric current sensor 63 becomes the low level, and thus the output AA of the inverter 81 changes from the low level to the high level. At this timing, the output B of the D-type flip-flop 82 becomes the high level, and the output CC of the inverter 83 becomes the low level. Therefore, the output IN_CUR of the AND circuit 84 becomes the on command of the current reduction signal. With this, because the constant current generator 30 turns off the switch 31, the output I_OUT of the constant current generator 30 becomes the second current value by the current passing through the second current source 33. Thus, the constant current having the second current value is supplied to the driver circuit 40.

At a timing T34, when the switching signal IN becomes the low level, the output IN_CUR of the AND circuit 84 is at the low level. That is, the on command of the current reduction signal is continued.

As described above, the current reduction signal to reduce the current value of the constant current generator 30 can be generated using the current passing through the constant current source 62. It is not necessary to input the current reduction signal into the load driver from the external device.

In the present embodiment, the electric current sensor 63 determines the current using the determination threshold and outputs the determination result. Alternatively, it may be possible that the electric current sensor 63 merely detects the current, and the determination whether the current exceeds the determination threshold is made in the current control circuit 80.

Thirteenth Embodiment

A thirteenth embodiment will be described with reference to FIG. 21. Hereinafter, a structure different from that of the eighth embodiment will be mainly described.

Figure 21:
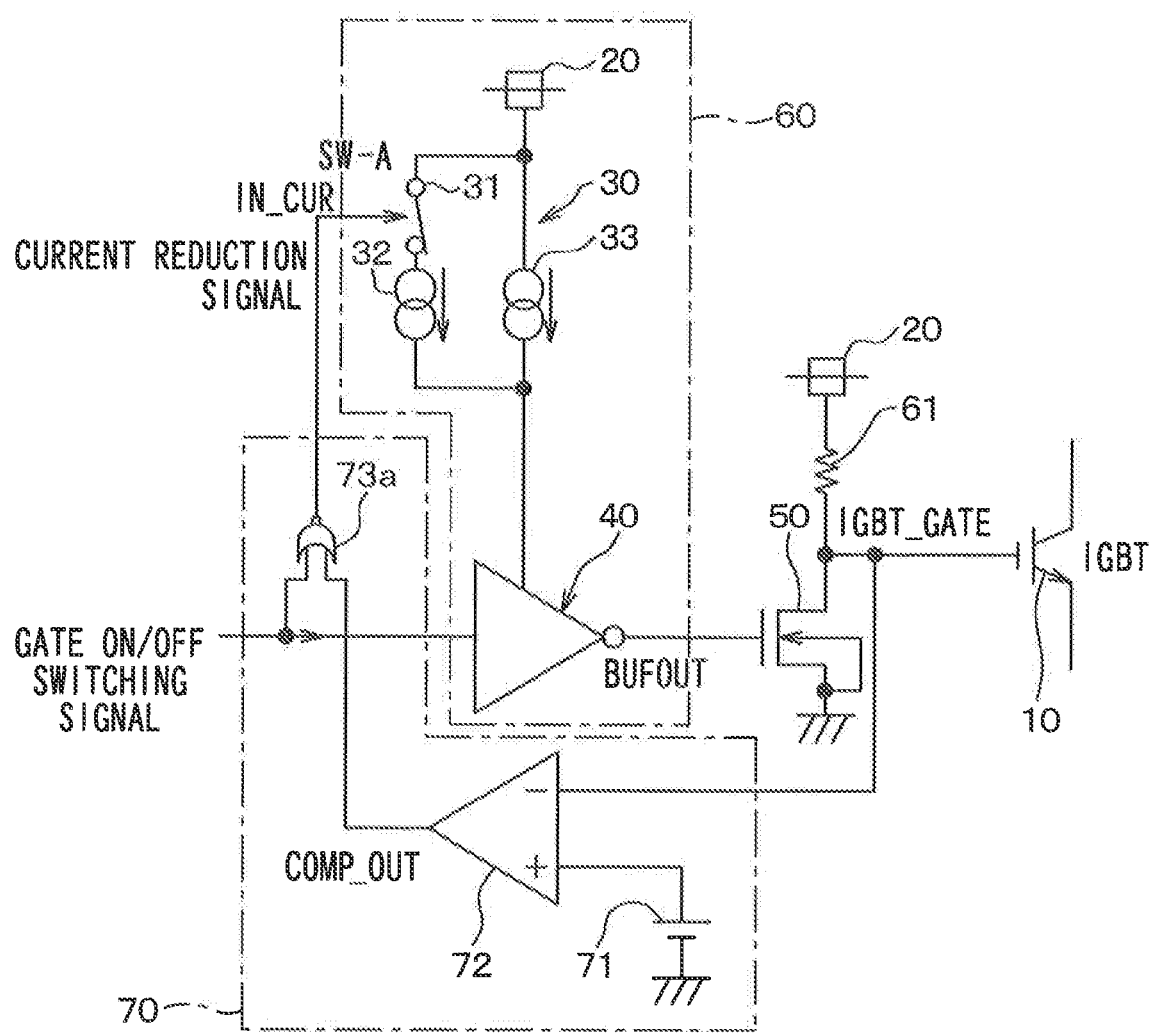
FIG. 21 is a detailed circuit diagram of a load driver according to a thirteenth embodiment of the present invention.

FIG. 21 is a circuit diagram of a load driver according to the thirteenth embodiment. As shown in FIG. 21, the logic of turning on the gate of the power element 10 can be accorded with that of the eighth embodiment by configuring the driver circuit 40 of the pre-driver unit 60 as an inverted output and constructing the switching element 50 of a N-channel MOSFET.

The present embodiment is employed in a case of turning off the power element 10. When the output of the driver circuit 40 is at the high level, that is, when the switching element 50 is turned on and the gate voltage of the power element 10 is at the low level, the current value of the constant current generator 30 is reduced to the second current value by the current reduction signal generated in the current reduction control circuit 70. The power element 10 is turned off by supplying the constant current having the second current value to the driver circuit 40. Therefore, also in the case of turning off the power element 10, an advantageous effect similar to that of the fifth embodiment can be achieved.

The current reduction control circuit 70 has a NOR circuit 73a that outputs a NOR logic of the switching signal IN and the output COMP_OUT of the comparator 72. The output IN_CUR of the NOR circuit 73a provides the current reduction signal.

Fourteenth Embodiment

A fourteenth embodiment will be described with reference to FIG. 22. Hereinafter, a structure different from that of the thirteenth embodiment will be mainly described.

Figure 22:
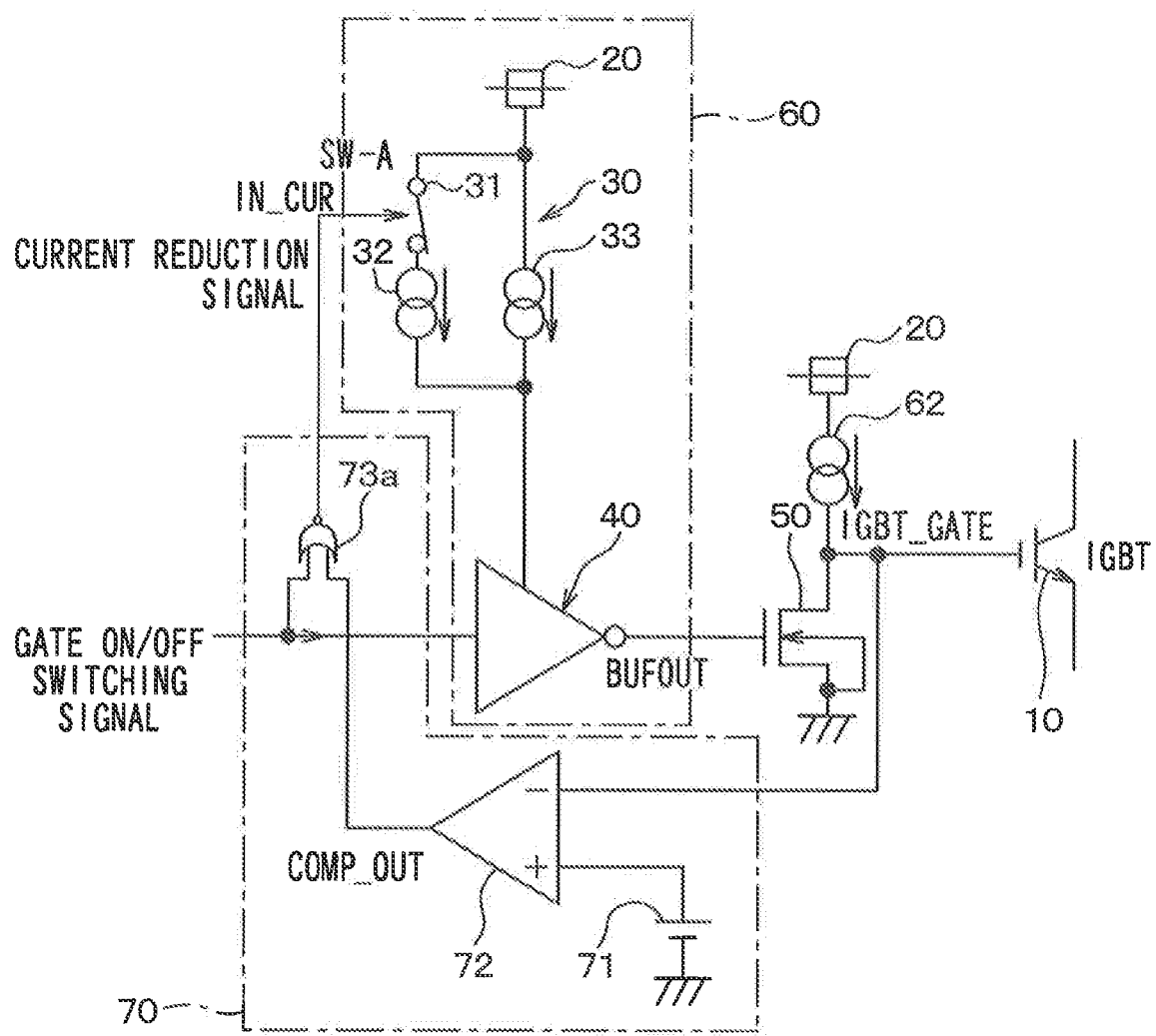
FIG. 22 is a detailed circuit diagram of a load driver according to a fourteenth embodiment of the present invention.

FIG. 22 is a circuit diagram of a load driver according to the fourteenth embodiment. As shown in FIG. 22, similar to the tenth and eleventh embodiments, the gate of the power element 10 can be driven by the constant current supplied from the constant current source 62.

In the thirteenth and fourteenth embodiments, the current reduction control circuit 70 exemplarily employs the comparator 72. Alternatively, the current reduction control circuit 70 can employ the delay circuit 75.

Fifteenth Embodiment

A fifteenth embodiment will be described with reference to FIGS. 23 and 24. Hereinafter, a structure different from that of the thirteenth embodiment will be mainly described.

Figure 23:
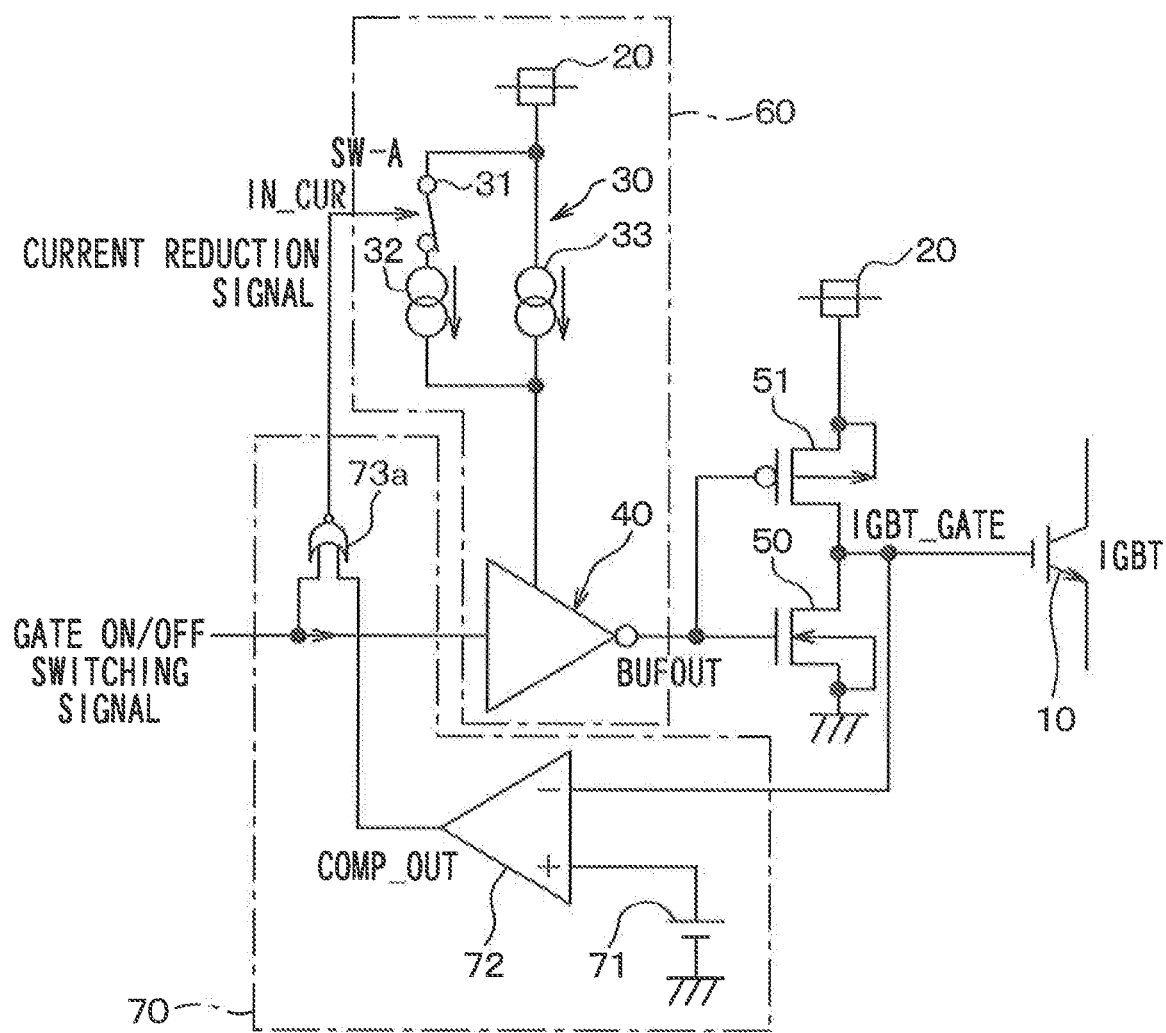
FIG. 23 is a detailed circuit diagram of a load driver according to a fifteenth embodiment of the present invention.
Figure 24:
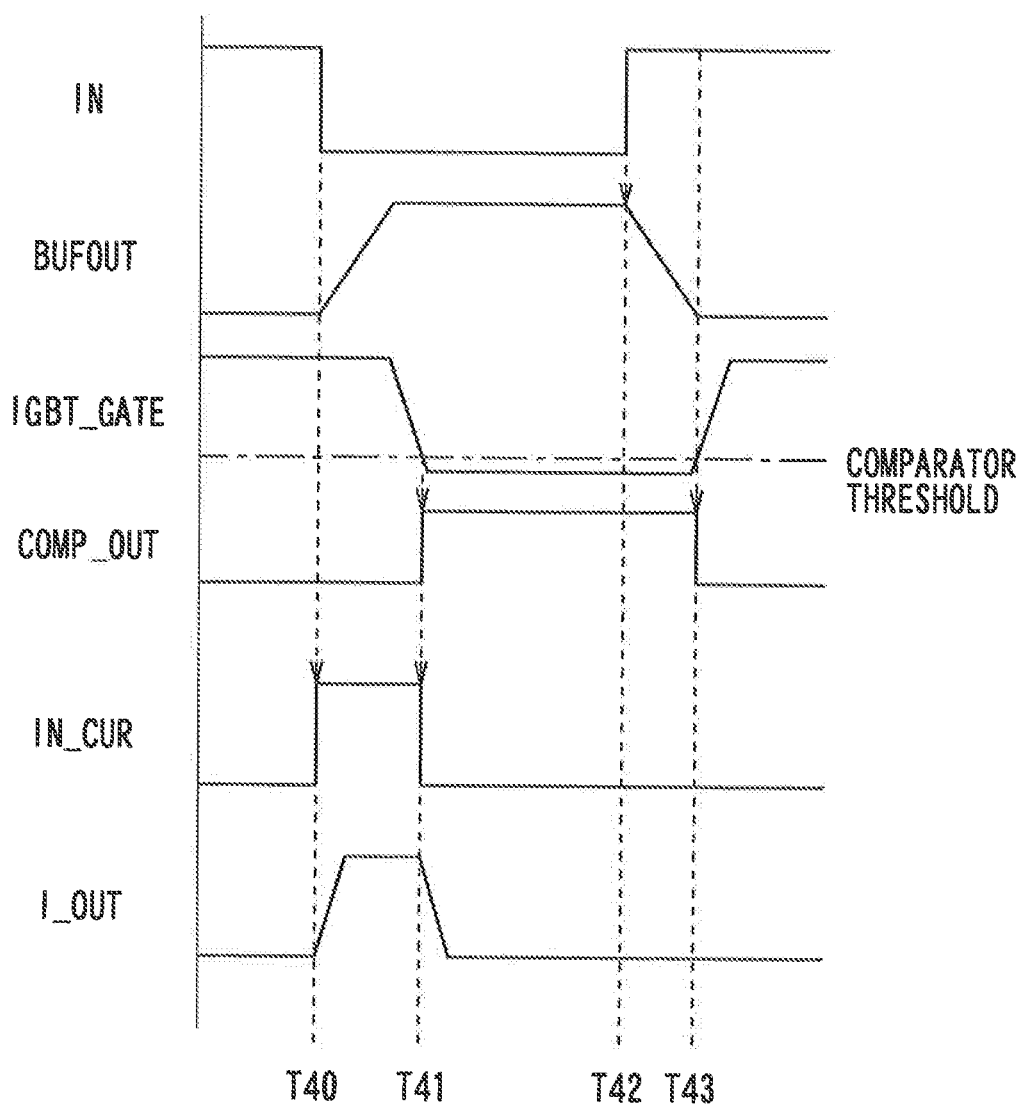
FIG. 24 is a time chart for explaining an operation of the load driver according to the fifteenth embodiment.

FIG. 23 is a circuit diagram of a load driver according to the fifteenth embodiment. As shown in FIG. 23, a P-channel MOSFET and an N-channel MOSFET are connected between the power source 20 and the reference voltage line as switching elements 51, 50, respectively. The P-channel MOSFET is closer to the power source 20 than the N-channel MOSFET. The switching elements 50, 51 constitutes an inverter.

Specifically, the switching element 50 corresponds to the switching element 50 of the thirteenth embodiment. Further, the P-channel switching element 51 is employed in place of the resistor 61 in the structure of the thirteenth embodiment.

The gate of the power element 10 is connected to a point between the switching element 50 and the switching element 51. Therefore, when the output BUFOUT of the driver circuit 40 is at the high level, the switching element 50 is turned on and the switching element 51 is turned off. As such, the gate voltage of the power element 10 is lowered. On the other hand, when the output BUFOUT of the driver circuit 40 is at the low level, the switching element 50 is turned off and the switching element 51 is turned on. As such, the gate voltage of the power element 10 is increased.

Next, an operation of the load driver shown in FIG. 23 will be described with reference to a time chart shown in FIG. 24.

Firstly, when the switching signal IN is at the high level, the output BUFOUT of the driver circuit 40 is at the low level because the driver circuit 40 generates an inverted-output. Further, the switching element 50 is in the off state, and the switching element 51 is in the on state. Therefore, the gate voltage IGBT_GATE of the power element 10 is at the high level, and thus the power element 10 is in the on state.

Since the switching signal IN is at the high level, the output IN_CUR of the NOR circuit 73a is at the low level corresponding to the on command of the current reduction signal. Therefore, the constant current generator 30 supplies the constant current having the second current value to the driver circuit 40.

At a timing T40, when the switching signal IN becomes the low level, the switching element 50 is turned on and the switching element 51 is turned off. Therefore, the gate voltage IGBT_GATE of the power element 10 begins to decrease. Right after the timing T40, the gate voltage IGBT_GATE of the power element 10 is at the level equal to or higher than the comparator threshold. Therefore, the output COMP_OUT of the comparator 72 is at the low level.

At a timing 141, when the gate voltage IGBT_GATE of the power element 10 becomes lower than the comparator threshold, the output COMP_OUT of the comparator 72 becomes the high level. Therefore, even if the switching signal IN is at the low level, the output IN_CUR of the NOR circuit 73a is at the low level corresponding to the on command of the current reduction signal. As such, the constant current generator 30 supplies the constant current having the second current value smaller than the first current value to the driver circuit 40.

At a timing T42, when the switching signal IN becomes the high level to turn on the power element 10, the output BUFOUT of the driver circuit 40 declines to the low level. With this, because the switching element 50 is turned off and the witching element 51 is turned on, the gate voltage begins to increase.

At a timing T43, when the gate voltage IGBT_GATE of the power element 10 exceeds the comparator threshold, the output COMP_OUT of the comparator 72 becomes the low level. At this timing, since the switching signal IN has been already at the high level, the output IN_CUR of the NOR circuit 73a is maintained at the low level corresponding to the on command of the current reduction signal. Therefore, the current value supplied to the driver circuit 40 is not increased.

As described above, the power element 10 can be driven by the inverter including the switching element 50, 51. In such a case, the switching element 50 corresponds to a first switching element, and the switching element 51 corresponds to a second switching element.

Sixteenth Embodiment

A sixteenth embodiment will be described with reference to FIGS. 25 through 28. In general, the driving part of the power element 10 such as the IGBT is provided with a protecting function against short-circuit and overcurrent. The present embodiment has a structure of determining short-circuit (overcurrent) by clamping the gate voltage of the power element 10 on a constant voltage when the protection function receives a short-circuit (overcurrent) signal.

Figure 25:
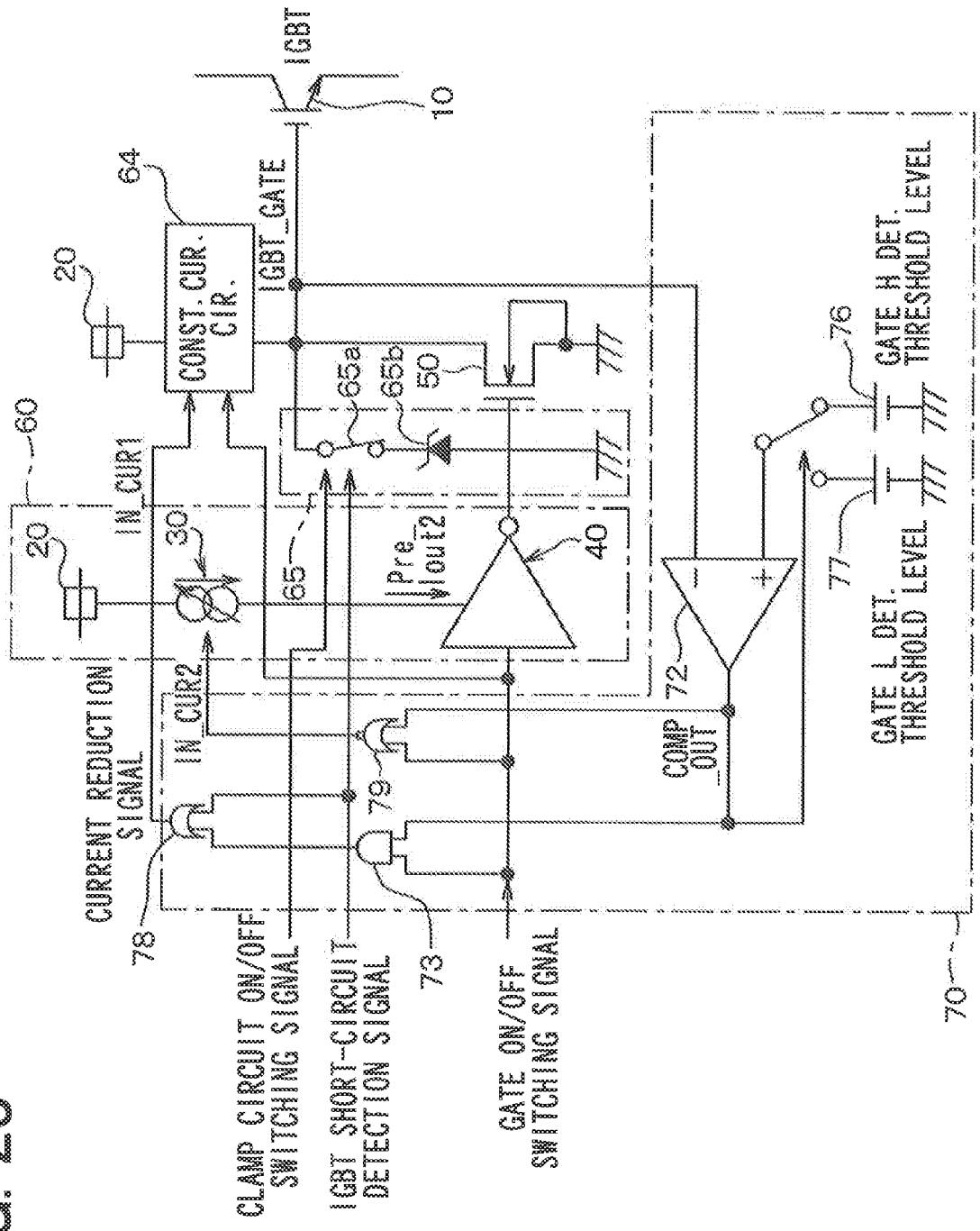
FIG. 25 is a detailed circuit diagram of a load driver according to a sixteenth embodiment of the present invention.

FIG. 25 is a circuit diagram of a load driver according to the sixteenth embodiment. As shown in FIG. 25, the pre-driver unit 60 includes the constant current generator 30, the driver circuit 40 and the current reduction control circuit 70. As a whole structure for driving the power element 10, the load driver includes the switching element 50, a constant current circuit 64, and a clamp circuit 65, in addition to the pre-driver unit 60.

The switching element 50 is a N-channel MOSFET. The driver circuit 40 drives the switching element 50 by the inverted-output. The constant current generator 30 includes the switch 31 (e.g., SW-A in FIG. 2), the first constant current source 32 and the second constant current source 33, similar to the constant current generator 30 of the first embodiment shown in FIG. 2.

The constant current circuit 64 is connected between the power source 20 and the switching element 50. The constant current circuit 64 supplies the gate of the power element 10 with the constant current until the gate voltage of the power element 10 reaches the predetermined voltage, that is, the ON voltage when the switching element 50 is driven.

Figure 26B:
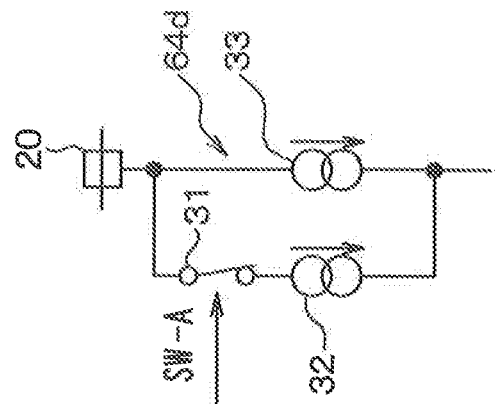
FIG. 26B is a detailed circuit diagram of a constant current generator of the constant current circuit shown in FIG. 26A.
Figure 26A:
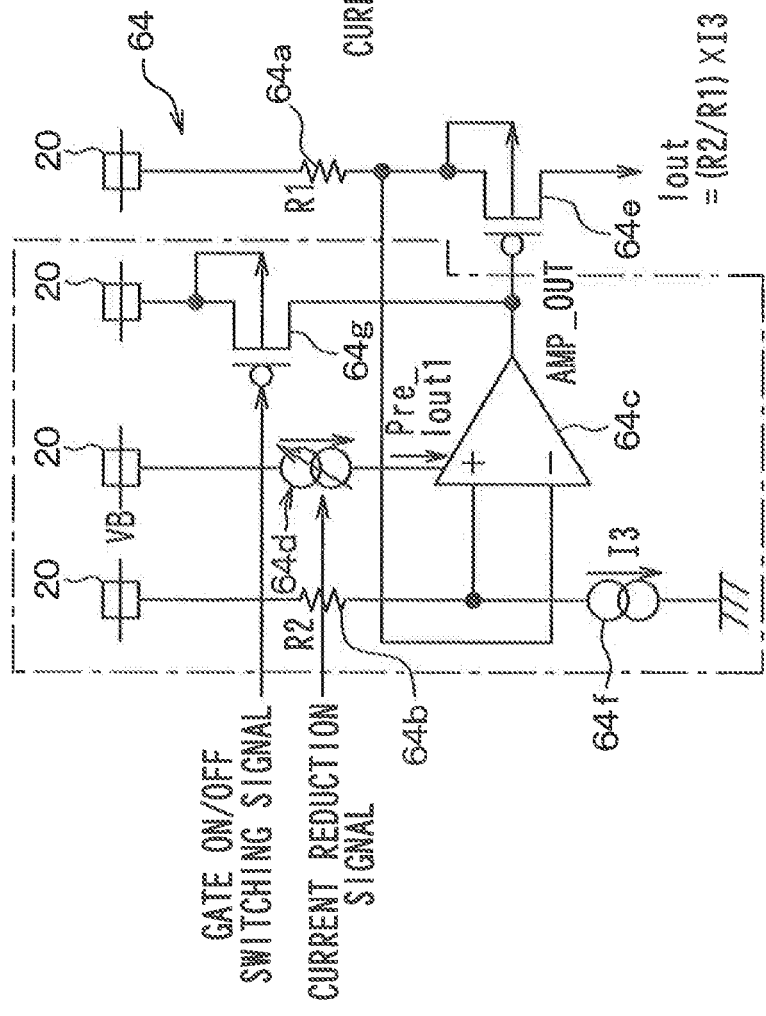
FIG. 26A is a detailed circuit diagram of a constant current circuit of the load driver according to the sixteenth embodiment.

FIG. 26A is a circuit diagram of the constant current circuit 64. As shown in FIG. 26A, the constant current circuit 64 includes a resistor 64a (R1), a resistor 64b (R2), an operation amplifier 64c, a constant current generator 64d, a switching element 64e, a constant current source 64f and a switching element 64g. In the structure shown in FIG. 26A, the resistor 64b, the operation amplifier 64c, the constant current generator 64d, the constant current source 64f and the switching element 64g constitute the pre-driver unit for driving the switching element 64e. The pre-driver unit corresponds to a section surrounded by a dashed chain line in FIG. 26A.

The resistor 64a is a sensing resistor through which a current corresponding to the constant current supplied to the gate of the power element 10 passes. A first end of the resistor 64a is connected to the power source 20 (VB), and a second end of the resistor 64a is connected to the switching element 64e. A first end of the resistor 64b is connected to the power source 20, and a second end of the resistor 64b is connected to the constant current source 64f.

The operation amplifier 64c has a function of adjusting the value of the constant current (Iout) supplied to the gate of the power element 10 by performing a feedback-control of the current passing through the resistor 64a based on the voltage at the second end of the resistor 64b.

A non-inverting input terminal of the operation amplifier 64c is connected to a connecting point between the second end of the resistor 64b and the constant current source 64f. Therefore, the non-inverting input terminal of the operation amplifier 64c is applied with a first voltage corresponding to the second end of the resistor 64b. That is, assuming that the voltage of the power source 20 is VB, the current passing through the resistor 64b is I3, and the resistance value of the resistor 64b is R2, the first voltage corresponds to a voltage where the reference voltage is subtracted from the power source voltage of the power source 20 (i.e., VB−I3×R2).

On the other hand, an inverting input terminal of the operation amplifier 64c is connected to the second end of the resistor 64a. Therefore, the inverting input terminal of the operation amplifier 64c is applied with a second voltage corresponding to the second end of the resistor 64a. That is, assuming that the current passing through the resistor 64a is Iout, and the resistance value of the resistor 64a is R1, the second voltage corresponds to a voltage where a voltage depression of the resistor 64a is subtracted from the power source voltage of the power source 20 (i.e., VB−Iout×R1).

The constant current generator 64d generates the constant current that determines a capacity of the operation amplifier 64c, that is, the switching speed. As shown in FIG. 26B, the constant current generator 64d has the switch 31 (SW-A), the first constant current source 32 and the second constant current source 33. Therefore, when the switch 31 is turned on in accordance with the on command of the current reduction signal, the constant current having the first current value in which the current passing through the first constant current source 32 is added to the current passing through the second constant current source 33 is supplied to the operation amplifier 64c. On the other hand, when the switch 31 is turned off, only the current passing through the second constant current source 33 is applied to the operation amplifier 64c as the constant current having the second current value.

It is to be noted that the constant current generator 64d has the similar structure as that of the constant current generator 30 described above. However, the constant current generator 64d may have any other structures, such as the structure of the third embodiment.

The switching element 64e is a semiconductor element that is driven by the output of the operation amplifier 64c. The switching element 64e is a P-channel MOSFET, for example. The gate of the switching element 64e is connected to an output terminal of the operation amplifier 64c, and the source of the switching element 64e is connected to the second end of the resistor 64a. Further, the drain of the switching element 64e is connected to the gate of the power element 10.

The constant current source 64f supplies a constant current I3 to the resistor 64b. The constant current source 64f is connected between the second end of the resistor 62b and the reference voltage line such as the ground.

The switching element 64g is connected between the power source 20 and the output terminal of the operation amplifier 64c. The switching element 64g is driven by the switching signal. The switching element 64g is a P-channel MOSFET, for example. Therefore, the source of the switching element 64g is connected to the power source 20, and the drain of the switching element 64g is connected to the output terminal of the operation amplifier 64c.

The constant current circuit 64 having the above described structure performs a feedback-control of the value of the current passing through the resistor 64a such that the first voltage corresponding to the second end of the resistor 64a and the second voltage corresponding to the second end of the resistor 64b are equal to each other.

Specifically, because the input terminals of the operation amplifier 64c have the equal potential, the operation amplifier 64c controls the switching element 64e so that the first voltage (VB=Iout×R1) corresponding to the second end of the resistor 64 and the second voltage (VB−I3×R2) corresponding to the second end of the resistor 64b are equal to each other. Therefore, the constant current Iout passing through the resistor 64a is defined as Iout=(R2/R1)×I3, and the current passing through the resistor 64a is supplied to the gate of the power element 10 as the constant current having a constant current value.

As defined by the above expression Iout=(R2/R1)×I3, the current proportional to the value of the current passing through the resistor 64b passes through the resistor 64a. Therefore, because the current I3 of the constant current source 64f passes through the resistor 64b, the current proportional to the current I3 passes through the resistor 64a.

The clamp circuit 65 has a function of restricting breakage of the power element 10 due to overshoot and surge in the short-circuit by avoiding a rapid change in the gate voltage. That is, the clamp circuit 65 clamps the voltage applied to the gate of the power element 10 on the clamp voltage in accordance with a clamp circuit ON/OFF switching signal, which is fed from an external device. The clamp circuit 65 has a switch 65a and a zener diode 65b, which are connected in series. The switch 65a is connected to the gate of the power element 10.

The clamp circuit 65 is configured to receive an IGBT short-circuit detection signal indicating the short-circuit of the power element 10. When receiving the IGBT short-circuit detection signal, the clamp circuit 65 clamps the gate voltage of the power element 10 on the clamp voltage that is lower than the predetermined voltage.

The switch 65a is turned on or off in accordance with the IGBT short-circuit signal. The short-circuit of the power element 10 is detected by a short-circuit detection circuit (not shown) or the like, and is fed into the clamp circuit 65 in the form of the IGBT short-circuit detection signal.

The current reduction control circuit 70 generates the off command of the current reduction signal to the constant current circuit 64 at a timing where the driver circuit 40 turns off the switching element 50 and the power element 10 reaches the on state while the switching signal is inputted into the driver circuit 40. Also, the current reduction control circuit 70 generates the off command of the current reduction signal to the constant current generator 30 at a timing where the driver circuit 40 turns on the switching element 50 and the power element 10 reaches the off state while the switching signal is inputted into the driver circuit 40. Specifically, the current reduction control circuit 70 includes the comparator 72, the AND circuit 73, a reference voltage source 76, a reference voltage source 77, an OR circuit 78 and a NOR circuit 79.

The reference voltage source 76 is a voltage source where a gate H determination threshold is set for determining whether the gate voltage IGBT_GATE of the power element 10 is at the high level. The reference voltage source 77 is a voltage source where a gate L determination threshold is set for determining whether the gate voltage IGBT_GATE of the power element 10 is at the low level.

The reference voltage source 76 and the reference voltage source 77 are selectively connected to the non-inverting input terminal of the comparator 72 in accordance with the output COMP_OUT of the comparator 72. When the output COMP_OUT of the comparator 72 is at the high level, the non-inverting input terminal of the comparator 72 is switched to the reference voltage source 76. When the output COMP_OUT of the comparator 72 is at the low level, the non-inverting input terminal of the comparator 72 is switched to the reference voltage source 77.

Therefore, the comparator 72 generates the high level signal when the gate voltage IGBT_GATE of the power element 10 is lower than the gate L determination threshold, and generates the low level signal when the gate voltage IGBT_OUT exceeds the gate H determination threshold.

The AND circuit 73 outputs the high level signal only when both the switching signal IN and the output COMP_OUT of the comparator 72 are at the high level.

The OR circuit 78 outputs the high level signal when one of the output of the AND circuit 73 and the IGBT short-circuit detection signal is at the high level. The output IN_CUR1 of the OR circuit 78 corresponds to the current reduction signal for controlling the current value Pre_Iout1 of the constant current circuit 64. In the present embodiment, the OR circuit 78 outputs the off command of the current reduction signal in a period from a timing where the high level signal of the IGBT short-circuit detection signal is inputted from an external device to a timing where the input of the IGBT short-circuit detection signal is released, that is, until when the low level signal of the IGBT short-circuit detection signal is inputted.

The NOR circuit 79 outputs the high level signal only when the switching signal IN and the output COMP_OUT of the comparator 72 are at the low level. The output IN_CUR2 of the NOR circuit 79 corresponds to the current reduction signal for controlling the current value Pre_Iout 2 of the constant current generator 30.

In the OR circuit 78 and the NOR circuit 79, the output at the low level corresponds to the on command of the current reduction signal, and the output at the high level corresponds to the off command of the current reduction signal.

In the load driver having the above described structure, the current reduction control circuit 70 controls the current value supplied to the driver circuit 40 in accordance with the on command or the off command of the current reduction signal, which is indicated by the output IN_CUR2 of the NOR circuit 79.

Moreover, the constant current circuit 64 drives the gate of the power element 10 with the constant current having the first current value in accordance with the off command of the current reduction signal indicated by the output IN_CUR1 of the current reduction control circuit 70 until the on-period where the power element 10 is turned on elapses, that is, until the on-timing where the power element 10 reaches the on state.

After the on-period has elapsed, the constant current circuit 64 drives the switching element 64e with the constant current having the second current value smaller than the first current value in accordance with the on command of the current reduction signal indicated by the output IN_CUR1 of the current reduction control circuit 70.

An operation of the load driver will be described in detail with reference to a time chart shown in FIG. 27.

Firstly, the power element 10 is in the on state until a timing T50. Until the timing T50, the constant current generator 30 supplies the constant current having the second current value to the driver circuit 40 in accordance with the on command of the current reduction signal from the current reduction control circuit 70.

At the timing T50, when the switching signal IN becomes the low level to turn off the power element 10, the switching signal IN indicating the low level and the low level signal of the comparator 72 are inputted into the NOR circuit 79. Therefore, the output IN_CUR2 of the NOR circuit 79 becomes the off command of the current reduction signal, and the constant current generator 30 supplies the current Pre_Iout 2 having the first current value to the driver circuit 40. Since the output COMP_OUT of the comparator 72 is at the low level, the threshold of the comparator 72 is set to the gate L determination threshold.

After the timing T50, the gate voltage IGBT_GATE of the power element 10 reduces. Further, at a timing 151, when the gate voltage IGBT_GATE of the power element 10 becomes lower than the gate L determination threshold, the output COMP_OUT of the comparator 72 becomes the high level.

Therefore, the output IN_CUR2 of the NOR circuit 79 indicates the on command of the current reduction signal, and thus the constant current generator 30 supplies the current Pre_Iout2 having the second current value smaller than the first current value to the driver circuit 40.

In this way, in the period from the timing T50 to the timing T51, the gate of the power element 10 is quickly turned down by quickly turning on the N-channel switching element 50 with the increase in the current value supplied to the driver circuit 40. Further, because the AND circuit 73 receives the low level signal from the comparator 72, the output to the OR circuit 78 is also at the low level. With this, the IGBT short-circuit detection signal inputted to the OR circuit 78 is also at the low level. Therefore, the output IN_CUR1 of the current reduction control circuit 70 toward the constant current circuit 64 maintains the on command of the current reduction signal.

At a timing T52, when the switching signal IN becomes the high level to turn on the power element 10, the AND circuit 73 receives the switching signal IN indicating the high level and the high level signal of the comparator 72. With this, the output of the AND circuit 73 becomes the high level, and thus the output IN_CUR1 of the OR circuit 78 toward the constant current generator 64d becomes the off command of the current reduction signal. Therefore, the current Pre_Iout1 supplied to the operation amplifier 64c increases to the first current value.

Therefore, at a timing T53, because the current Iout supplied from the constant current circuit 64 to the switching element 50 increases, the gate voltage of the power element 10 quickly increases with the increase in the current Iout of the constant current circuit 64. Since the output COMP_OUT of the comparator 72 is at the high level, the threshold of the comparator 72 is set to the gate H determination threshold.

At a timing T54, when the gate voltage IGBT_GATE of the power element 10 exceeds the gate H determination threshold, the output COMP_OUT of the comparator 72 becomes the low level. With this, because the output of the AND circuit 73 becomes the low level, the output IN_CUR1 of the OR circuit 78 indicates the on command of the current reduction signal, and thus the constant current generator 64d supplies the current Pre_Iout1 having the second current value smaller than the first current value to the operation amplifier 64c.

In this way, in the period from the timing T52 to the timing T54, the gate of the power element 10 is quickly turned on by increasing the current supplied from the constant current circuit 64 to the gate of the power element 10 with the increase in the current supplied to the operation amplifier 64c. Further, since the NOR circuit 79 receives the high level signal as the switching signal IN, the output IN_CUR2 of the NOR circuit 79 becomes the low level. Therefore, the output IN_CUR2 of the current reduction control circuit 70 to the constant current generator 30 maintains the on command of the current reduction signal.

The gate voltage of the power element 10 becomes in a full-on-period after the timing T54 through a mirror period and a clamp voltage holding period from the timing T52 to the timing T54. The gate voltage in the mirror period is a mirror voltage that is determined by a property of the IGBT as the power element 10 such as an amplification factor, and becomes a constant voltage firstly after the timing T52. The clamp voltage holding period corresponds to a period where the gate voltage becomes the constant voltage again after the mirror period.

In the clamp voltage holding period, the switch 65a is turned on in accordance with the clamp circuit ON/OFF switching signal inputted into the clamp circuit 65 to hold the gate voltage at the clamp voltage. Therefore, surge breakage in the short-circuit when the power element 10 is turned on is reduced. When the switch 65a is turned off in accordance with the clamp circuit ON/OFF switching signal, the gate voltage increases and the power element 10 becomes in the full-on state at the timing T54.

Figure 28:
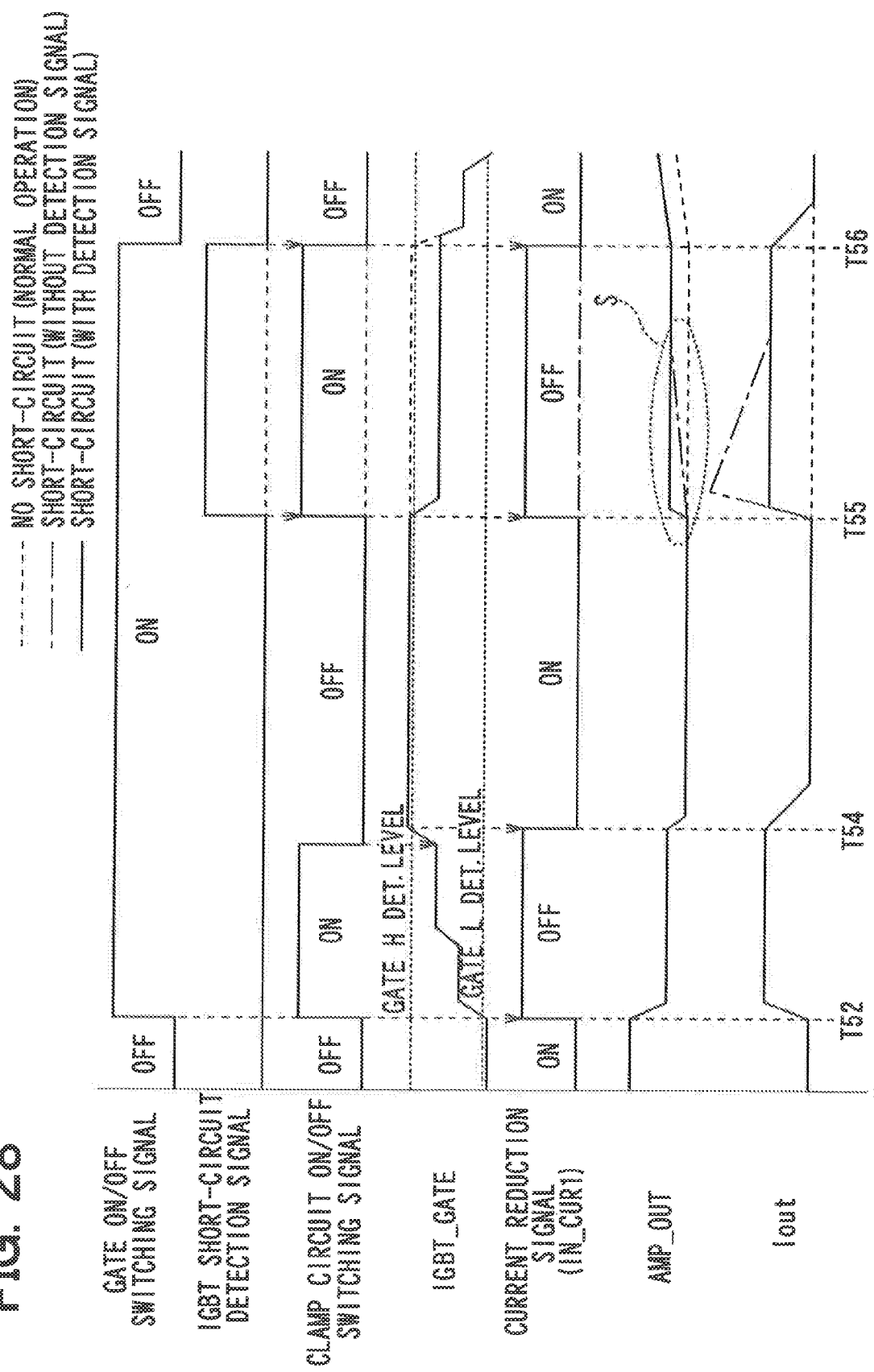
FIG. 28 is a time chart for explaining an operation of the load driver in a case where a power element is short-circuited according to the sixteenth embodiment.

Next, an operation of the load driver in a case where the short-circuit is detected when the power element 10 is tuned on will be described with reference to a time chart shown in FIG. 28. In FIG. 28, the operation until the timing T54 is same as the operation shown in FIG. 27. In FIG. 28, dashed-line waveforms indicates a regular operation where a short-circuit does not occur in the power element 10.

At a timing T55, when the short-circuit of the power element 10 is detected, the clamp circuit ON/OFF switching signal for turning on the switch 65a and the IGBT short-circuit detection signal indicating the high level are inputted into the load driver. With this, the clamp circuit 65 tries to hold the gate voltage on the clamp voltage, and thus the gate voltage reduces to the clamp voltage from the full-on voltage.

Also, because the OR circuit 78 receives the IGBT short-circuit detection signal indicating the high level, the output IN_CUR1 of the OR circuit 78 indicates the off command of the current reduction signal. With this, the current Pre_Iout1 of the constant current generator 64d increases, and the output AMP_OUT of the operation amplifier 64c increases.

Namely, the current reduction of the constant current generator 64d is released at the timing where the short-circuit of the power element 10 is detected to restore the current capacity of the operation amplifier 64c, which has been reduced. Therefore, as shown by a portion S encircled by a dotted line in FIG. 28, the current capacity of the operation amplifier 64c is smoothly increased to the stable output level. Accordingly, the responsiveness of the circuit controlling the constant current improves with the increase in the current capacity of the operation amplifier 64c, and thus the overshoot of the current Iout after the timing T55 is reduced.

If the current capacity of the operation amplifier 64c is not recovered, the slew rate of the operation amplifier 64c is kept at a low level. Therefore, the gate control of the switching element 64e is delayed, and the responsiveness of the entire system of the constant current circuit 64 is degraded. In such a case, therefore, it takes time to increase the output AMP_OUT to the stable output level, as shown by the portion S in FIG. 28. Therefore, the overshoot of the constant current Iout is large, and the period is long. As a result, the current consumption and heat generation increase.

Therefore, as described above, when the power element 10 is short-circuited, the current capacity of the constant current circuit 64 is increased. Accordingly, the responsiveness of the constant current circuit 64 improves. Also, the overshoot is reduced, and the consumption current is reduced.

After a timing T56, the similar operation to the operation in the period from the timing 150 to the timing T51 is carried out to turn off the power element 10.

As the power element 10 is turned off, the IGBT short-circuit detection signal is changed from the high level to the low level, that is, the input of the IGBT short-circuit detection signal is released. Also, the clamp circuit ON/OFF switching signal becomes the low level.

Accordingly, since the current capacity of the constant current circuit 64 is increased by the current reduction control circuit 70 when the power element 10 is short-circuited, the current consumption in the constant current generator 64 is reduced, and the gate voltage of the power element 10 is promptly increased.

In the present embodiment, the gate level of the power element 10 is exemplarily monitored by the comparator 72 of the current reduction control circuit 70. Alternatively, the structure including the delay circuit 75 of the seventh embodiment or the structure including the current control circuit 80 of the twelfth embodiment may be employed to monitor the gate level of the power element 10.

Seventeenth Embodiment

Figure 29:
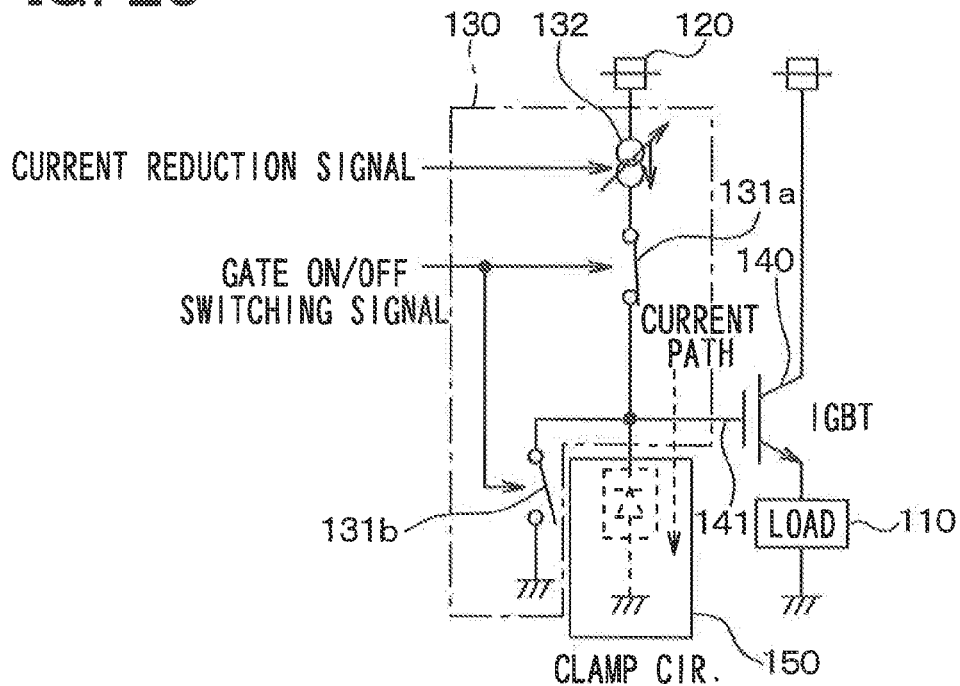
FIG. 29 is a schematic circuit diagram of a load driver, in a state of being connected to a load, according to a seventeenth embodiment.

A seventeenth embodiment will be described with reference to FIGS. 29 through 31. A load driver according to the present embodiment is, for example, used to drive the load such as a motor.

Figure 39:
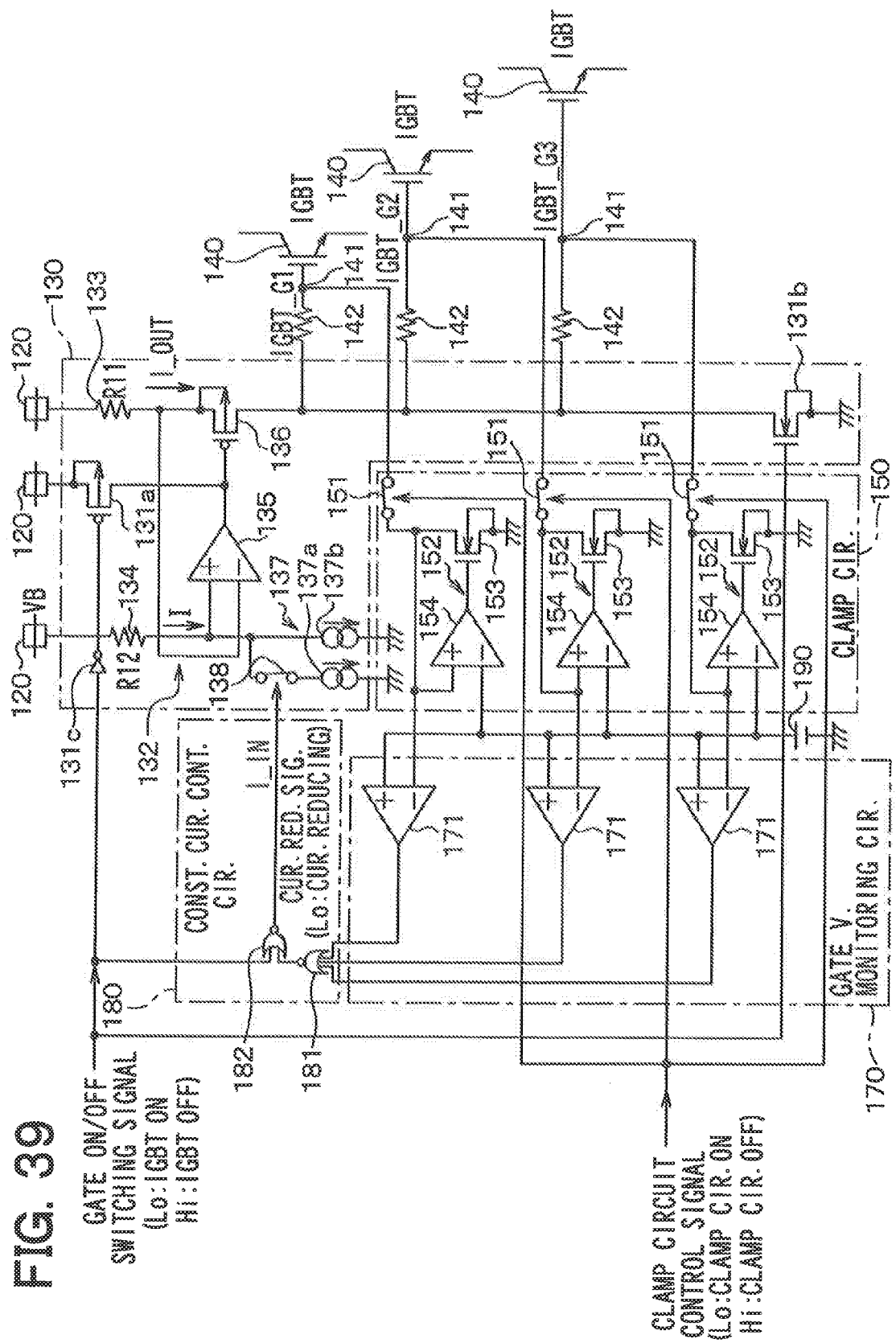
FIG. 39 is a detailed circuit diagram of the load driver shown in FIG. 38.

FIG. 39 is a schematic circuit diagram, in a state of being connected to the load 110, according to the present embodiment. As shown in FIG. 39, the load driver includes a driver circuit 130, a power element 140 and a clamp circuit 150. The driver circuit 130 is connected to a power source 120. The power element 140 and the clamp circuit 150 are connected to the driver circuit 130.

The power element 140 is a semiconductor switching element for driving the load 110. In the present embodiment, the power element 140 is an IGBT, for example. A driving terminal 141 of the power element 140, which serves as a gate terminal, is connected to the driver circuit 130. The load 110 is connected to an emitter of the power element 140, for example.

The driver circuit 130 includes a first switch 131a and a second switch 131b, which are driven in accordance with the gate ON/OFF switching signal from an external device. The driver circuit 130 supplies the constant current to the driving terminal 141 of the power element 140 by driving the first switch 131a and the second switch 131b, thereby to turn on and off the power element 140. Hereinafter, the gate ON/OFF switching signal is simply referred to as the switching signal.

The driver circuit 130 includes a variable constant current circuit 132 to adjust the value of the constant current supplied to the driving terminal 141 in accordance with the current reduction signal supplied from an external device. The variable constant current circuit 132 reduces the value of the constant current supplied to the driving terminal 141 after the voltage applied to the driving terminal 141 reaches a predetermined voltage.

The clamp circuit 150 has a function of restricting the power element 140 from being damaged due to the overshoot and the surge. The clamp circuit 150 clamps the voltage applied to the driving terminal 141 on the predetermined voltage so as to restrict a sudden change in the voltage applied to the driving terminal 141. The clamp circuit 150 is connected between the driving terminal 141 and the reference voltage line such as the ground.

As described above, as the driver circuit 130 supplies the constant current to the driving terminal 141, the voltage applied to the driving terminal 141 rises. When the voltage applied to the driving terminal 141 reaches the predetermined voltage, the clamp circuit 150 clamps the voltage applied to the driving terminal 141 on the predetermined voltage.

In the drawings, the reference voltage line is grounded, for example. However, the reference voltage line may have a potential, other than the ground.

The clamp circuit 150 clamps the voltage applied to the driving terminal 141 on the predetermined voltage in accordance with a control signal fed from an external device. The clamp circuit 150 includes a diode element, for example. The camp circuit 150 is operated by the control signal having a low level.

Next, a structure of the driver circuit 130 of the load driver will be described in detail with reference to FIG. 30. As described above, the driver circuit 130 includes the variable constant current circuit 132, the first switch 131a and the second switch 131b.

First, a structure of the variable constant current circuit 132 will be described. As shown in FIG. 30, the variable constant current circuit 132 includes a first resistor 133 (R11), a second resistor 134 (R12), an operation amplifier 135, a switching element 136, and a constant current source 137.

The first resistor 133 is provided for sensing the current that corresponds to the constant current passing through the driving terminal 141 of the power element 140. A first end of the first resistor 133 is connected to the power source (VB), and a second end of the first resistor 133 is connected to the switching element 136. A first end of the second resistor 134 is connected to the power source 120, and a second end of the second resistor 134 is connected to the constant current source 137.

The operation amplifier 135 performs a feedback-control with regard to the current passing through the first resistor 133 based on the voltage at the second end of the second resistor 134 to adjust the value of the constant current supplied to the driving terminal 141.

A non-inverting input terminal (+) of the operation amplifier 135 is connected to a connecting point between the second end of the second resistor 134 and the constant current source 137. Therefore, the non-inverting input terminal of the operation amplifier 135 is applied with a first voltage corresponding to the voltage at the second end of the second resistor 134. That is, assuming that the voltage of the power source is VB, the electric current passing through the second resistor 134 is I, and the resistance value of the second resistor 134 is R12, the first voltage corresponds to a voltage obtained by subtracting the reference voltage from the power source voltage (i.e., VB−I×R12).

An inverting input terminal (−) of the operation amplifier 135 is connected to the second end of the first resistor 133. Therefore, the inverting input terminal of the operation amplifier 135 is applied with a second voltage corresponding to the voltage at the second end of the first resistor 133. That is, assuming that the current passing through the first resistor 133 is Iout and the resistance value of the first resistor 133 is R11, the second voltage corresponds to a voltage obtained by subtracting the voltage drop at the first resistor 133 from the power source voltage (i.e., VB−Iout×R11).

The switching element 136 is a semiconductor element that is driven by an output of the operation amplifier 135. In the present embodiment, the switching element 136 is a P-channel MOSFET, for example.

A gate of the switching element 136 is connected to an output terminal of the operation amplifier 135, and a source of the switching element 136 is connected to the second end of the first resistor 133. Further, a drain of the switching element 136 is connected to the driving terminal 141 of the power element 140.

The constant current source 137 can vary the value I of the current passing through the second resistor 134. The constant current source 137 includes a switch 138, a first constant current source 137a, and a second constant current source 137b.

The first constant current source 137a is connected to the second end of the second resistor 134 through the switch 138. The second constant current source 137b is directly connected to the second end of the second resistor 134. The switch 138 is turned on or off in accordance with the on command or the off command of the current reduction signal.

The first constant current source 137a and the second constant current source 137b may have the same current capacity or have different current capacities. The current capacity of each of the first and second constant current sources 137a, 137b is determined depending on the value (intensity) of the constant current to be supplied to the second resistor 134 by the turning on and off of the switch 131.

In such a structure, when the switch 138 is turned on in accordance with the on command of the current reduction signal, the electric current having the first current value passes through the second resistor 134 due to the electric current passing through the first constant current source 137a being added to the electric current passing through the second constant current source 137b.

When the switch 138 is turned off in accordance with the off command of the current reduction signal, the current passing through the first constant current source 137a is cut off from the path between the power source 120 and the reference voltage line. Therefore, only the electric current passing through the second constant current source 137b passes through the second resistor 134. That is, the value of the electric current passing through the second constant current source 137b is defined as the second current value. Therefore, when the switch 138 is turned off, the electric current having the second current value smaller than the first current value passes through the second resistor 134.

The first switch 131a is connected between the power source 120 and the output terminal of the operation amplifier 135. In the present embodiment, the first switch 131a is provided by a P-channel MOSFET, for example. Therefore, a source of the first switch 131a is connected to the power source 120, and a drain of the first switch 131a is connected to the output terminal of the operation amplifier 135.

The second switch 131b is connected between the driving terminal 141 and the reference voltage line such as the ground. In the present embodiment, the second switch 131b is provided by an N-channel MOSFET, for example. Therefore, a source of the second switch 131b is connected to the driving terminal 141 and a drain of the second switch 131b is connected to the reference voltage line, such as the ground.

Further, an inverter 131c is connected to the gate of the first switch 131a. The switching signal is inputted into the first switch 131a through the inverter 131c. Also, the switching signal is directly inputted into the second switch 131b. As such, the switching signal inputted into one of the first and second switches 131a, 131b is reversed relative to the switching signal inputted into the other of the first and second switches 131a, 131b.

The load driver has the above described circuit structure. The switching signal and the current reduction signal are inputted into the load driver from the external device, such as an external ECU.

Next, an operation of the load driver will be described with reference to FIG. 31. FIG. 31 is a time chart including a gate waveform of the power element 40, the switching signal for driving the power element 40, the control signal for operating the clamp circuit 50, and the current reduction signal.

When the switching signal is at the high level, the first switch 131a is turned on, and the power source voltage is applied to the gate of the switching element 136. Therefore, the switching element 136 is in an off state. Also, the second switch 131b is turned on, and the current passes from the driving terminal 141 to the reference voltage line. Therefore, the power element 140 is in an off state.

On the other hand, when the switching signal is at the low level, the first switch 131a is turned off. Therefore, the switching element 136 is driven by the output of the operation amplifier 135. Also, since the second switch 131b is turned off, the constant current is supplied to the clamp circuit 150 through the driving terminal 141.

As described above, the driver circuit 130 turns off the power element 140 in accordance with the switching signal being at the high level, and turns on the power element 140 in accordance with the switching signal being at the low level.

At a timing T10 after an off section (period), when the switching signal changes from the high level to the low level, the first switch 131a and the second switch 131b are turned off. Thus, the switching element 136 is driven by the operation amplifier 135. Also, the control signal is inputted into the clamp circuit 150 to operate the clamp circuit 150. Therefore, a current path from the power source 120 to the clamp circuit 150 via the first resistor 133, the switching element 136 and the driving terminal 141 is formed, and the constant current is supplied to the driving terminal 141.

Further, the switch 138 of the constant current source 137 is turned on in accordance with the current reduction signal. Thus, the electric current having the first current value passes through the second resistor 134 due to the electric current passing through the first constant current source 137a being added to the electric current passing through the second constant current source 137b.

In the present embodiment, a state where the switch 138 of the constant current source 137 is turned off in accordance with the current reduction signal is referred to as a current reduction mode off state, and a state where the switch 138 of the variable constant current circuit 132 is turned off in accordance with the current reduction signal is referred to as a current reduction mode on state. That is, at the timing T110, a current reduction mode is turned off.

When the constant current is supplied to the driving terminal 141 in the above described manner, the gate voltage of the power element 140 rises with the gradient according to the value of the constant current. When the gate voltage reaches a threshold voltage of the power element 140, the power element 140 becomes the on state and the gate voltage reaches a mirror voltage.

The mirror voltage is determined by a property of the power element 140, such as an amplification factor of the IGBT. The mirror voltage becomes a constant voltage in a mirror section (period) from the timing T110 to a timing T111.

The variable constant current circuit 132 performs the feedback control of the electric current passing through the first resistor 133 so that the first voltage corresponding to the second end of the first resistor 133 is equal to the second voltage corresponding to the second end of the second resistor 134.

Specifically, the input terminals of the operation amplifier 135 have the same potential. Therefore, the operation amplifier 135 controls the switching element 136 so that the first voltage (i.e., VB−Iout×R11) corresponding to the second end of the first resistor 133 and the second voltage (i.e., VB−I× R12) corresponding to the second end of the second resistor 134 are equal to each other. Therefore, the constant current Iout passing through the first resistor 133 is expressed as Iout=(I×R12)/R11, and is supplied to the driving terminal 141 of the power element 140 as the constant current having the constant value.

As expressed above (i.e., Iout=(I×R12)/R11), the value of the electric current passing through the first resistor 133 is proportional to the value of the electric current passing through the second resistor 134. Further, since the electric current passing through the first constant current source 137a is added to the electric current passing through the second constant current source 137, the electric current having the first current value passes through the second resistor 134 as the current I. Therefore, the electric current proportional to the first current value passes through the first resistor 133.

After the mirror period elapses, the gate voltage rises again from the timing T111. Then, when the voltage applied to the driving terminal 141, that is, the gate voltage reaches the predetermined voltage, the switch 138 of the constant current source 137 is turned off in accordance with the current reduction signal.

That is, the current reduction mode is turned on.

Therefore, the electric current having the second current value smaller than the first current value passes through the second resistor 134 as the electric current I. That is, only the electric current passing through the second constant current source 137b passes through the second resistor 134 as the electric current I.

Since the electric current proportional to the second current value passes through the first resistor 133, the value of the electric current passing through the first resistor 133 is reduced smaller than that when the switch 138 of the constant current source 137 is turned on. Therefore, the value of the constant current passing through the driving terminal 141 is reduced smaller than that before the current reduction mode is turned off. Accordingly, the amount of consumption of the constant current passing through the clamp circuit 150 is reduced.

The clamp circuit 150 is in an operation from the timing T110. The clamp circuit 150 is operated to clamp the voltage applied to the driving terminal 141 on the predetermined voltage in a clamp voltage holding period (clamping section) from the timing T111 where the mirror period ends to a timing T113.

In the clamp voltage holding period, the voltage applied to the driving terminal 141 is clamped on the predetermined voltage. Therefore, the overshoot of the gate voltage is restricted, and hence the power element 140 is protected. Thereafter, at the timing T113, the clamp circuit 150 is turned off in accordance with the control signal.

Further, at the timing T113, the switch 138 of the constant current source 137 is turned on in accordance with the current reduction signal. That is, when the current reduction mode is turned off, the electric current proportional to the first current value passes through the driving terminal 141 of the power element 140.

In other words, the value of the constant current passing through the driving terminal 141 returns to the original value. With this, the gate voltage of the power element 140 rises, and reaches the maximum driving voltage. The maximum driving voltage is equal to or substantially equal to the power source voltage. The maximum driving voltage corresponds to the voltage to bring the IGBT of the power element 140 to the fully on state. Hereinafter, the maximum driving voltage is simply referred to as the driving voltage.

Then, after the voltage applied to the driving terminal 141 reaches the driving voltage, the switch 138 of the constant current source 137 is turned off again at a timing T114 in accordance with the current reduction signal. Therefore, the current reduction mode is turned on. Accordingly, the value of the constant current supplied to the driving terminal 141 is reduced.

After a full-on section (period) from the timing T113 to a timing T115, the switching signal inputted into the driver circuit 130 is changed from the low level to the high level at the timing T115. That is, the first switch 131*a* and the second switch 131*b* are turned on and the switching element 136 is turned off, in accordance with the off command to turn off the power element 140. With this, the electric charge charged at the driving terminal 141 is released to the reference voltage line through the second switch 131*b*.

After the mirror period from the timing T115 to a timing T116, the gate voltage of the driving terminal 141 drops to a minimum value at the timing T116. Therefore, the gate voltage is lower than the threshold voltage of the power element 140, and hence the power element 140 is turned off. Accordingly, the power element 140 is in the off state in the off section (period) from the timing T116 to the timing T110.

As described above, in the present embodiment, the current reduction mode is turned off at the timings T110, T113 where the voltage applied to the driving terminal 141 is increased, thereby to increase the current capacity of the driver circuit 130. With this, the value of the constant current supplied to the driving terminal 141 of the power element 140 is increased. As such, the period of time required to increase the gate voltage is shortened, and switching loss is reduced.

The current reduction mode is turned on at the timings T112 and T114 where the voltage applied to the driving terminal 141 is clamped on the predetermined voltage, thereby to reduce the current capacity of the driver circuit 130. Therefore, the value of the constant current is reduced.

In this way, since the current flowing into the clamp circuit 150 is reduced, the consumption value of the constant current for driving the power element 140 is reduced in the period where the power element 140 is turned on, that is, from the timing T110 to the timing T115.

Since the driver circuit 130 has the variable constant current source 137, the current capacity of the driver circuit 130 is controlled by controlling the constant current source 137 in accordance with the current reduction signal.

In the case where the gate voltage is further increased to the maximum driving voltage from the predetermined voltage, a period of time required to increase the gate voltage from the predetermined voltage to the maximum driving voltage can be shortened by increasing the value of the constant current source. Accordingly, the switching loss of the power element 140 is reduced.

Eighteenth Embodiment

An eighteenth embodiment will be described with reference to FIG. 32. Hereinafter, a structure different from that of the seventeenth embodiment will be mainly described.

In the seventeenth embodiment, the value of the constant current supplied to the driving terminal 141 of the power element 140 is controlled by adjusting the current capacity of the constant current source 137 of the driver circuit 130. In the present embodiment, the value of the constant current supplied to the driving terminal 141 is controlled by adjusting the resistance value of the second resistor 134.

Figure 32:
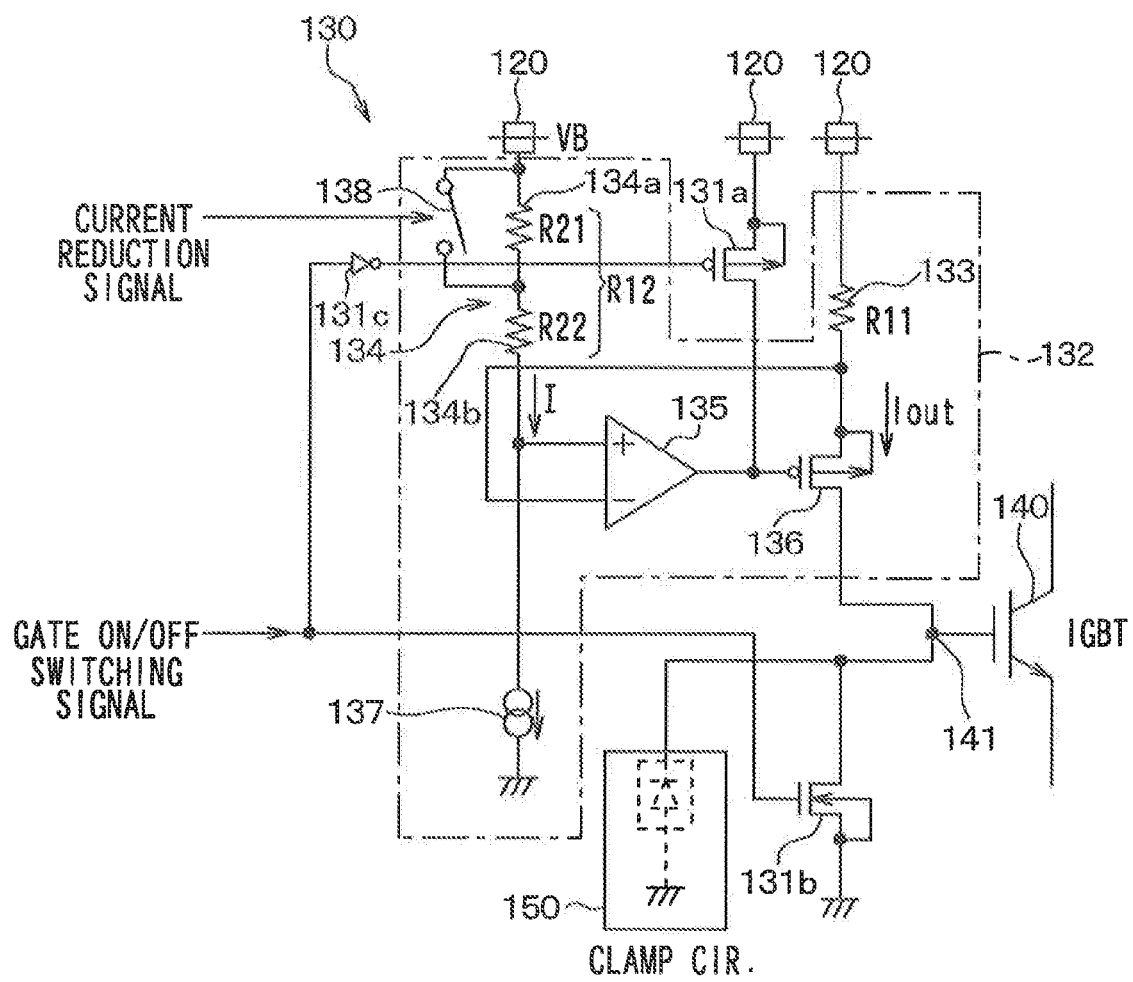
FIG. 32 is a detailed circuit diagram of a load driver according to an eighteenth embodiment.

FIG. 32 is a circuit diagram of the load driver according to the present embodiment. As shown in FIG. 32, the second resistor 134 of the variable constant current circuit 132 includes a resistor element 134*a* (R21) and a resistor element 134*b* (R22). The resistor element 134*a* and the resistor element 134*b* are connected in series.

A first end of the resistor element 134*a* is connected to the power source 120, and a second end of the resistor element 134*a* is connected to a first end of the resistor element 134*b*. A second end of the resistor element 134*b* is connected to the non-inverting input terminal of the operation amplifier 135.

The switch 138 is connected in parallel with the resistor element 134*a*. The switch 138 is turned on and off in accordance with the current reduction signal. When the switch 138 is turned on, the resistance value of the second resistor 134 is provided only by the resistance value of the resistor element 134*b*. When the switch 138 is turned off, the resistance value of the second resistor 134 is provided by the combined resistance value of the resistor element 134*a* and the resistor element 134*b*.

The resistance value of the second resistor 134 when the switch 138 is turned on is defined as a first resistance value. The resistance value of the second resistor 134 when the switch 138 is turned off is defined as a second resistance value. The first resistance value is provided by the resistance value of the resistor element 134*b*. Since the second resistance value is provided by the compound resistance value of the resistor element 134*a* and the resistor element 134*b*, the second resistance value is greater than the first resistance value. Accordingly, the resistance value of the second resistor 134 is variable by means of the switch 138.

In the present embodiment, the constant current source 137 is configured to supply the electric current having a constant value I. The constant current source 137 is connected to the second end of the resistor element 134*b* and the non-inverting input terminal of the operation amplifier 135.

The inverter 131*c*, the first switch 131*a*, the second switch 131*b*, the operation amplifier 135, the switching element 136, the first resistor 133, the clamp circuit 150, and the power element 140 have the structure similar to those of the seventeenth embodiment.

In such a configuration, the first voltage corresponding to the second end of the first resistor 133 and the second voltage corresponding to the second end of the resistor element 134*b* are applied to the operation amplifier 135. The operation amplifier drives the switching element 136 so that the first voltage and the second voltage become equal to each other.

Assuming that the resistance value of the second resistor 134 is R12 and the electric current passing through the second resistor 134 is I, the electric current Iout passing through the first resistor 133 is expressed as Iout=(I×R12)/R11. When the electric current passing through the second resistor 134 has a constant value, the electric current passing through the first resistor 133 is proportional to the resistance value of the second resistor 134.

In the present embodiment, the electric current Iout passing through the first resistor 133 is controlled by adjusting the resistance value R12 of the second resistor 134. The current capacity of the driver circuit 130 is controlled by controlling the electric current Iout.

Figure 31:
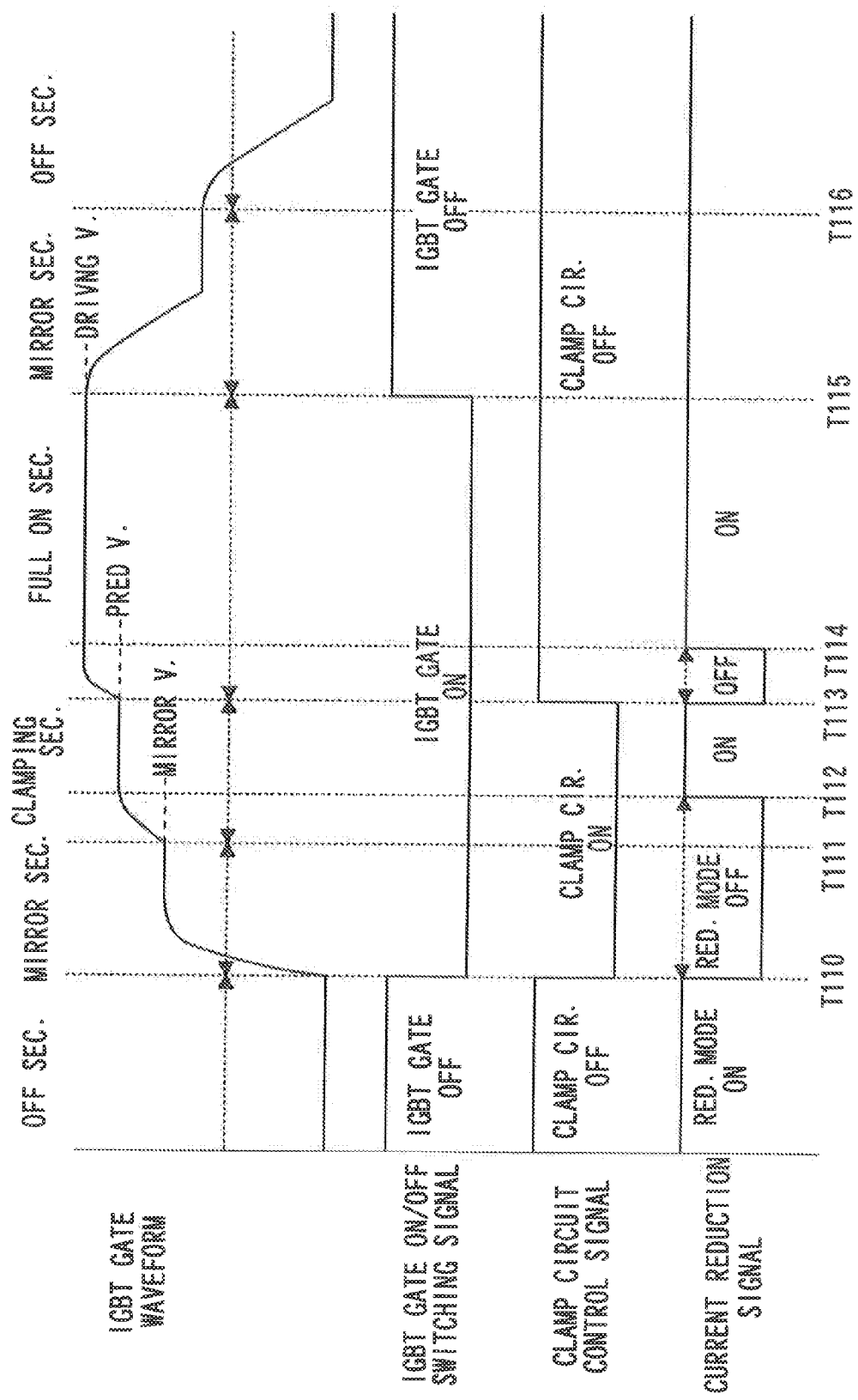
FIG. 31 is a time chart for explaining an operation of the load driver, which includes a gate waveform of a power element, a switching signal for driving the power element, a control signal for controlling a clamp circuit and a current reduction signal, according to the seventeenth embodiment.

Specifically, the switch 138 is in the off state in accordance with the off command of the current reduction signal in a period from the timing T110 to the timing T112 of FIG. 31 where the voltage applied to the driving terminal 141 reaches the predetermined voltage. That is, the current reduction mode is in the off state in the period from the timing T110 to the timing T112.

Therefore, the resistance value of the second resistor 134 is the second resistance value provided by the compound resistance value of the resistor element 134a and the resistor element 134b. The electric current proportional to the second resistance value passes through the first resistor 133.

Also in the period from the timing T113 to the timing T114 of FIG. 31, the switch 138 is in the off state, and the electric current proportional to the second resistance value passes through the first resistor 133.

The switch 138 is turned on in accordance with the on command of the current reduction signal after the voltage applied to the driving terminal 141 reaches the predetermined voltage. That is, the current reduction mode is in the on state from the timing T112 to the timing T113 of FIG. 31. Therefore, the resistance value of the second resistor 134 is the first resistance value provided only by the resistance value of the resistor element 134b. The electric current passing through the first resistor 133 is proportional to the first resistance value smaller than the second resistance value. As such, the electric current passing through the first resistor 133 is reduced smaller than that when the switch 138 is turned off. Accordingly, the value of the constant current passing through the driving terminal 141 is reduced.

As described above, the current capacity of the driver circuit 130 can be reduced by reducing the resistance value of the second resistor 134.

Therefore, since the value of the constant current passing through the driving terminal 141 is reduced, the amount of electric current consumed in the clamp circuit 150 during the period where the power element 140 is in the on state, that is, in the period from the timing 1110 to the timing T115 in FIG. 31 can be reduced.

In such a case, the second resistor 134 including the resistor element 134a, the resistor element 134b and the switch 138 constitutes a second resistor unit.

Nineteenth Embodiment

A nineteenth embodiment will be described with reference to FIGS. 33 and 34. Hereinafter, a structure different from that of the seventeenth embodiment will be mainly described.

In the seventeenth embodiment, the current reduction signal for turning on and off the switch 138 is fed from an external device. In the present embodiment, the current reduction signal is generated using the existing switching signal and control signal.

Figure 33:
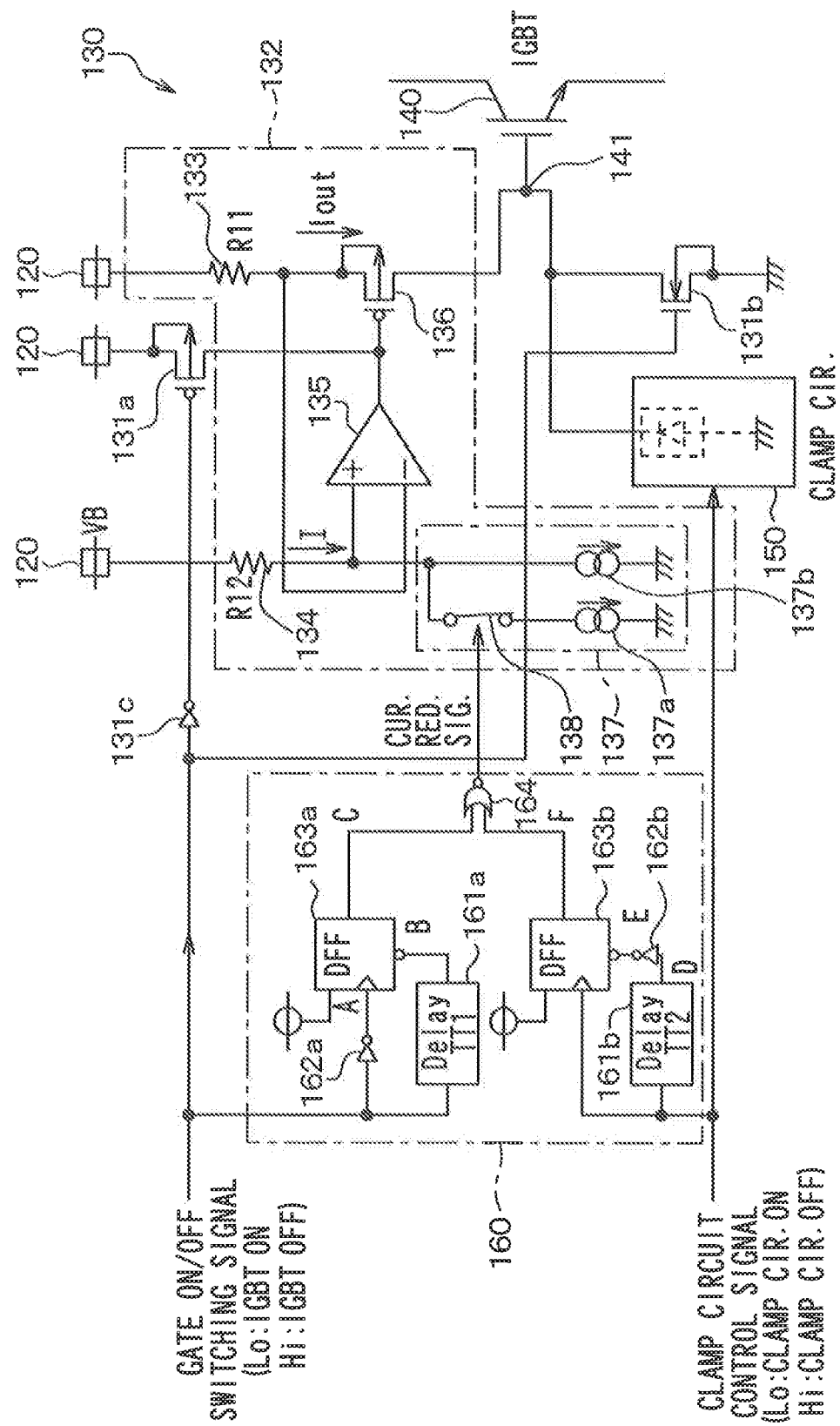
FIG. 33 is a detailed circuit diagram of a load driver according to a nineteenth embodiment.

FIG. 33 is a circuit diagram of the load driver according to the present embodiment. As shown in FIG. 33, the control signal is fed into the clamp circuit 150. When the control signal is at the low level, the clamp circuit 150 is turned on. When the control signal is at the high level, the clamp circuit 150 is turned off.

Figure 30:
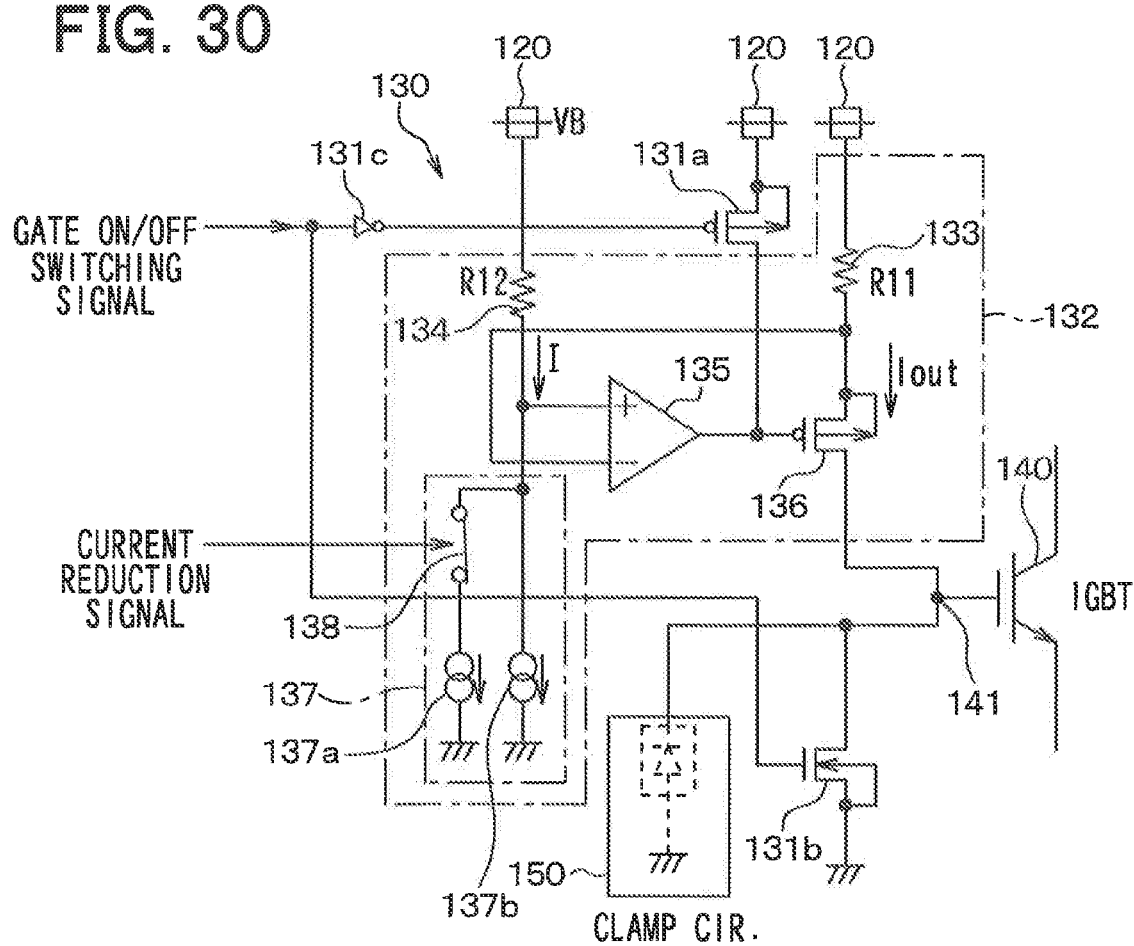
FIG. 30 is a detailed circuit diagram of the load driver shown in FIG. 29.

In the load driver of the present embodiment, a current reduction signal generating circuit 160 is added to the structure shown in FIG. 30. The current reduction signal generating circuit 160 generates the current reduction signal for controlling the switch 138 based on the switching signal and the control signal.

The current reduction signal generating circuit 160 includes a delay circuit 161a into which the switching signal is inputted, and a flip-flop 163a into which the switching signal inverted by an inverter 162a and an output of the delay circuit 161a are inputted. The current reduction signal generating circuit 160 includes a delay circuit 161b into which the control signal is inputted, and a flip-flop 163b into which the control signal and an output of the delay circuit 161b inverted by the inverter 162b are inputted. In the present embodiment, the delay circuit 161a has a delay time TT1, and the delay circuit 161b has a delay time TT2.

The current reduction signal generating circuit 160 further includes a NOR circuit 164 that outputs a NOR logic of each of the flip-flops 163a, 163b. The output of the NOR circuit 164 is fed into the switch 138 of the constant current source 137 as the current reduction signal.

Figure 34:
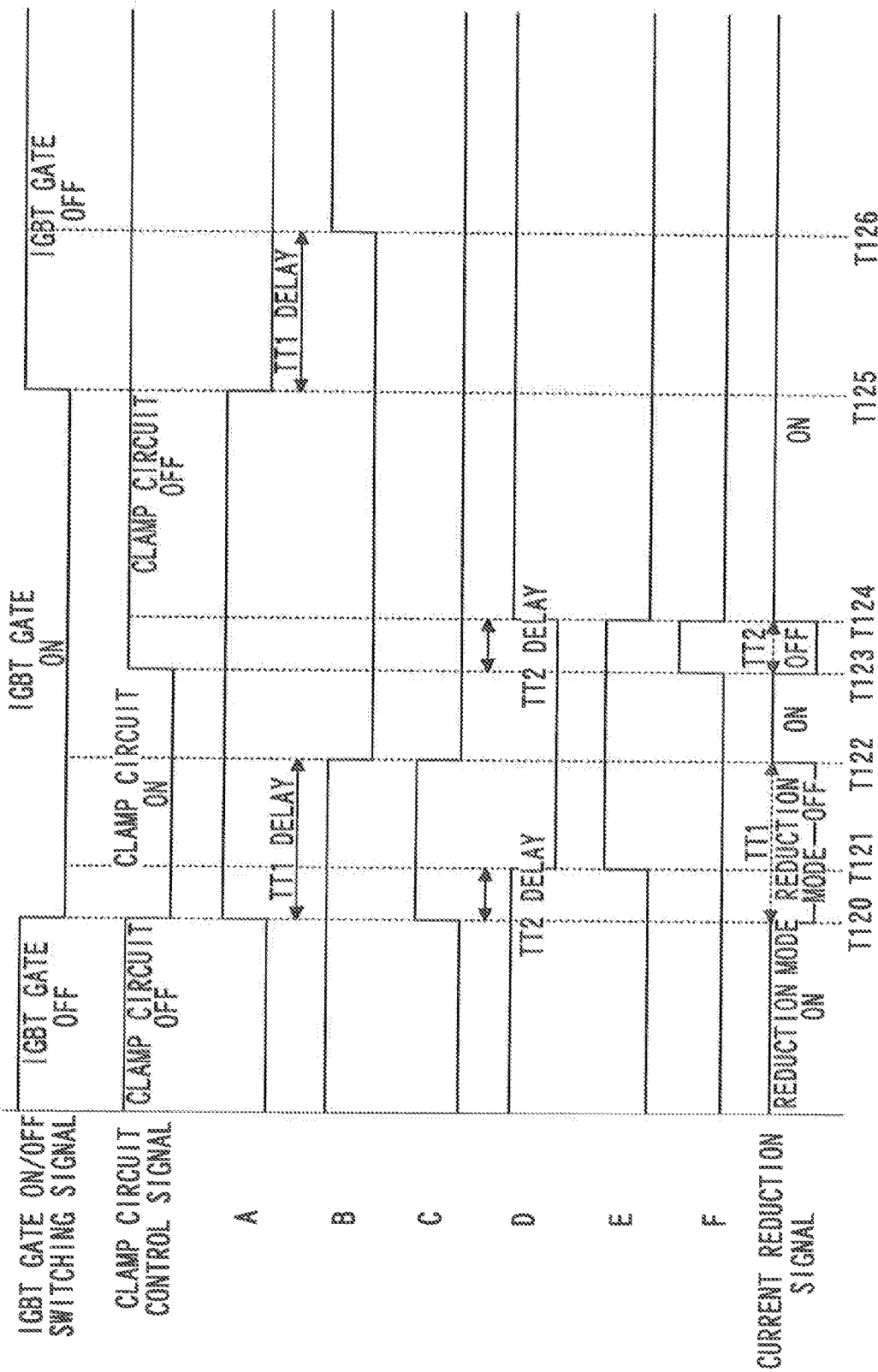
FIG. 34 is a time chart for explaining an operation of a current reduction signal generating circuit.

Next, an operation of the current reduction signal generating circuit 160 will be described with reference to FIG. 34, FIG. 34 is a time chart including the switching signal, the control signal, an output A of the inverter 162a of the inverter 162a, an output B of the delay circuit 161a, an output C of the flip-flop 163a, an output D of the delay circuit 161b, an output E of the inverter 162b, an output F of the flip-flop 163b, and the current reduction signal.

At a timing T120, when the switching signal and the control signal are switched from the high level to the low level, respectively, the power element 140 is turned on and the clamp circuit 150 is operated. The switching signal is at the low level from the timing T120 to a timing T125. The control signal is at the low level from the timing T120 to a timing T123.

Therefore, since the output A of the inverter 162a corresponds to the inverted output of the switching signal, the output A of the inverter 162a is at the high level from the timing T120 to the timing T125. Because the delay circuit 161a generates the output B by delaying the switching signal for the delay time TT1, the output B of the delay circuit 161a is at the high level until the timing T122 (e.g., TT1 DELAY), and is at the low level from the timing T122 to a timing T126.

The flip-flop 163a generates the output C by fetching a high level voltage that is inputted into an input terminal of the flip-flop 163a by detecting an edge where the output A of the inverter 162a rises from the low level to the high level. The output C is maintained at the high level until the output B of the delay circuit 161a becomes the low level and the output of the flip-flop 163a becomes the low level by resetting of the output. Therefore, the flip-flop 163a outputs the high level signal from the timing T120 to the timing T122.

The delay circuit 161b outputs the control signal by delaying for the delay time TT2. Therefore, the output D of the delay circuit 161b is at the high level until the timing T121 (e.g., TT2 DELAY), and is at the low level from the timing T121 to the timing T124.

The output E of the inverter 162b corresponds to an inverted output of the delay circuit 161b. Therefore, the output E of the inverter 162b is at the high level from the timing T121 to the timing T124.

The flip-flop 163b outputs the signal being at the high level when the control signal and the output of the inverter 162b are at the high level. Therefore, the flip-flop 163b outputs the signal being at the high level from the timing T123 to the timing T124.

The output of the NOR circuit 164 corresponds to the inverted output of the output C of the flip-flop 163a and the inverted output of the output F of the flip-flop 163b. Therefore, the current reduction signal is at the low level in a period from the timing T120 to the timing T122 where the output C of the flip-flop 163a is at the high level. That is, the current reduction mode is in the off state from the timing T120 to the timing T122.

The current reduction signal is at the low level in a period from the timing T123 to the timing T124 where the output F of the flip-flop 163b is at the high level. That is, the current reduction mode is in the off state from the timing T123 to the timing T124.

The current reduction signal generated in the above manner has the waveform similar to that of the seventeenth embodiment shown in FIG. 31. It is to be noted that the timing T120 of the present embodiment corresponds to the timing T110 of the seventeenth embodiment. Similarly, the timing T122, T123, and T124 of the present embodiment correspond to the timing T112, T113, T114 of the seventeenth embodiment shown in FIG. 31, respectively.

The current reduction signal generating circuit 160 generates the current reduction signal to turn off the switch 138, thereby to reduce the value of the constant current supplied to the driving terminal 141, when the voltage applied to the driving terminal 141 reaches the predetermined voltage.

After the clamping of the voltage to the predetermined voltage by the clamping circuit 150 is released, the current reduction signal generating circuit 160 outputs the current reduction signal to turn on the switch 138, thereby to restore the value of the constant current supplied to the driving terminal 141.

After the voltage applied to the driving terminal 141 reaches the power source voltage or the maximum driving voltage that is substantially the same as the power source voltage, the current reduction signal generating circuit 160 outputs the current reduction signal to turn off the switch 138 again, thereby to reduce the value of the constant current supplied to the driving terminal 141.

As described above, the current reduction signal for controlling the switch 138 can be generated using the switching signal and the control signal. The current reduction signal generating circuit 160 can be provided by a logic circuit. Therefore, it is less likely that the consumption current will increase.

Twentieth Embodiment

A twentieth embodiment will be described with reference to FIGS. 35 and 36. Hereinafter, a structure different from that of the nineteenth embodiment will be described.

In the present embodiment, the current reduction signal generating circuit 160 generates the current reduction signal so that the voltage applied to the driving terminal 141 rises from the predetermined voltage to the maximum driving voltage by monitoring the voltage applied to the driving terminal 141.

Figure 35:
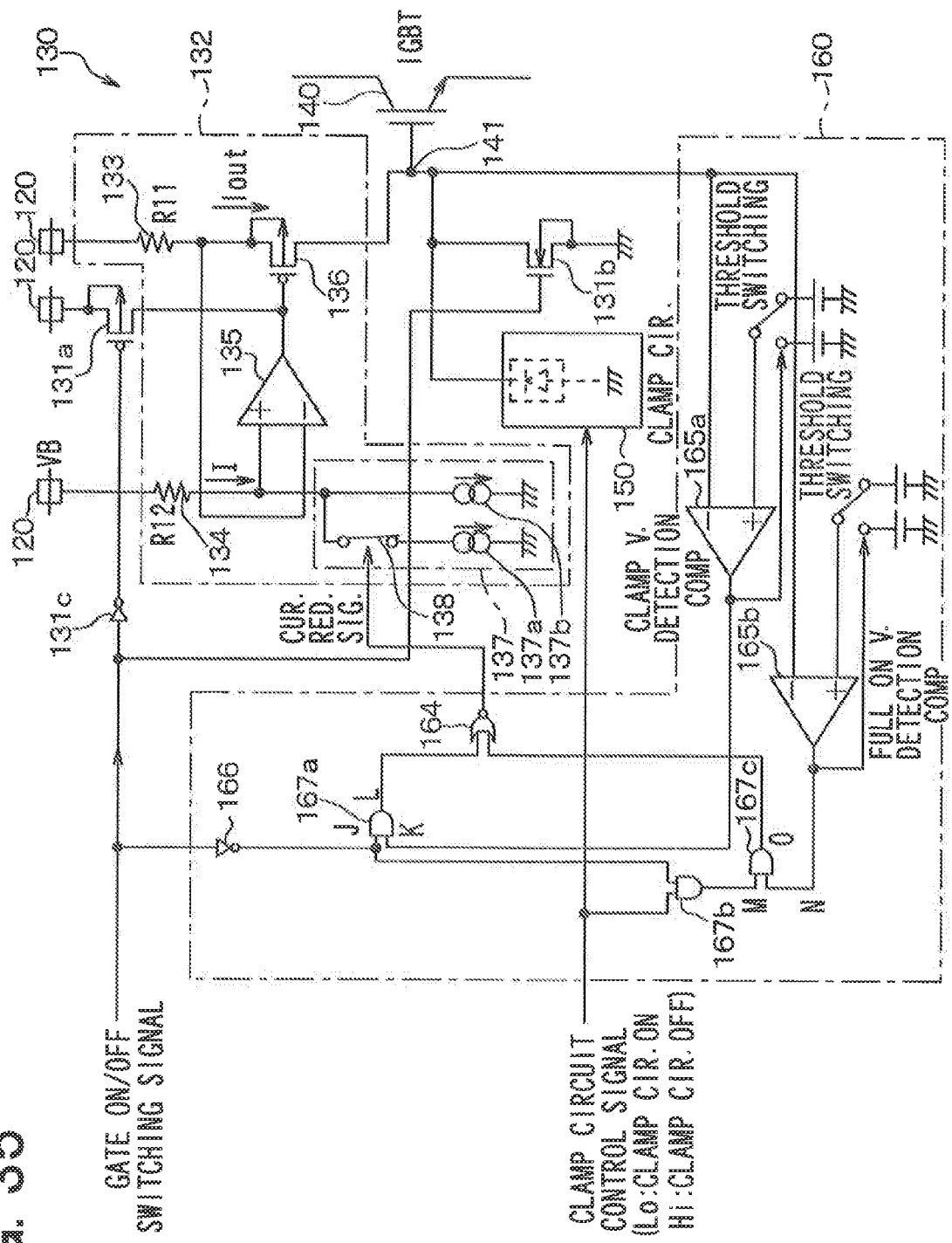
FIG. 35 is a detailed circuit diagram of a load driver according to a twentieth embodiment.

FIG. 35 is a circuit diagram of the load driver according to the present embodiment. As shown in FIG. 35, the current reduction signal generating circuit 160 includes two comparators 165a, 165b, an inverter 166, three AND circuits 167a, 167b, 167c and a NOR circuit 164.

The comparator 165a detects the clamp voltage (predetermined voltage) by comparing the voltage applied to the driving terminal 141 to a threshold. The comparator 165b detects the full-on voltage (maximum driving voltage) by comparing the voltage applied to the driving terminal 141 to a threshold. Each of the comparators 165a, 165b switches the threshold by the output thereof so that the low level signal is outputted when the voltage applied to the driving terminal 141 exceeds the threshold.

The inverter 166 inverts the switching signal and inputs the inverted switching signal into the AND circuit 167a. The AND circuit 167a generates an AND logic of the output of the inverter 166 and the output of the comparator 165a. The AND circuit 167b generates an AND logic of the output of the inverter 166 and the control signal. The AND circuit 167c generates an AND logic of the output of the AND circuit 167b and the output of the comparator 165b. The NOR circuit 164 generates a NOR logic of the output of the AND circuit 167a and the output of the AND circuit 167b as the current reduction signal.

Next, an operation of the current reduction signal generating circuit 160 having the above described structure will be described with reference to FIG. 36. FIG. 36 is a time chart including the switching signal, the control signal, an output J of the inverter 166, an output K of the comparator 165a, an output L of the AND circuit 167a, an output M of the AND circuit 167b, an output N of the comparator 165b, an output O of the AND circuit 167b, and the current reduction signal.

Figure 36:
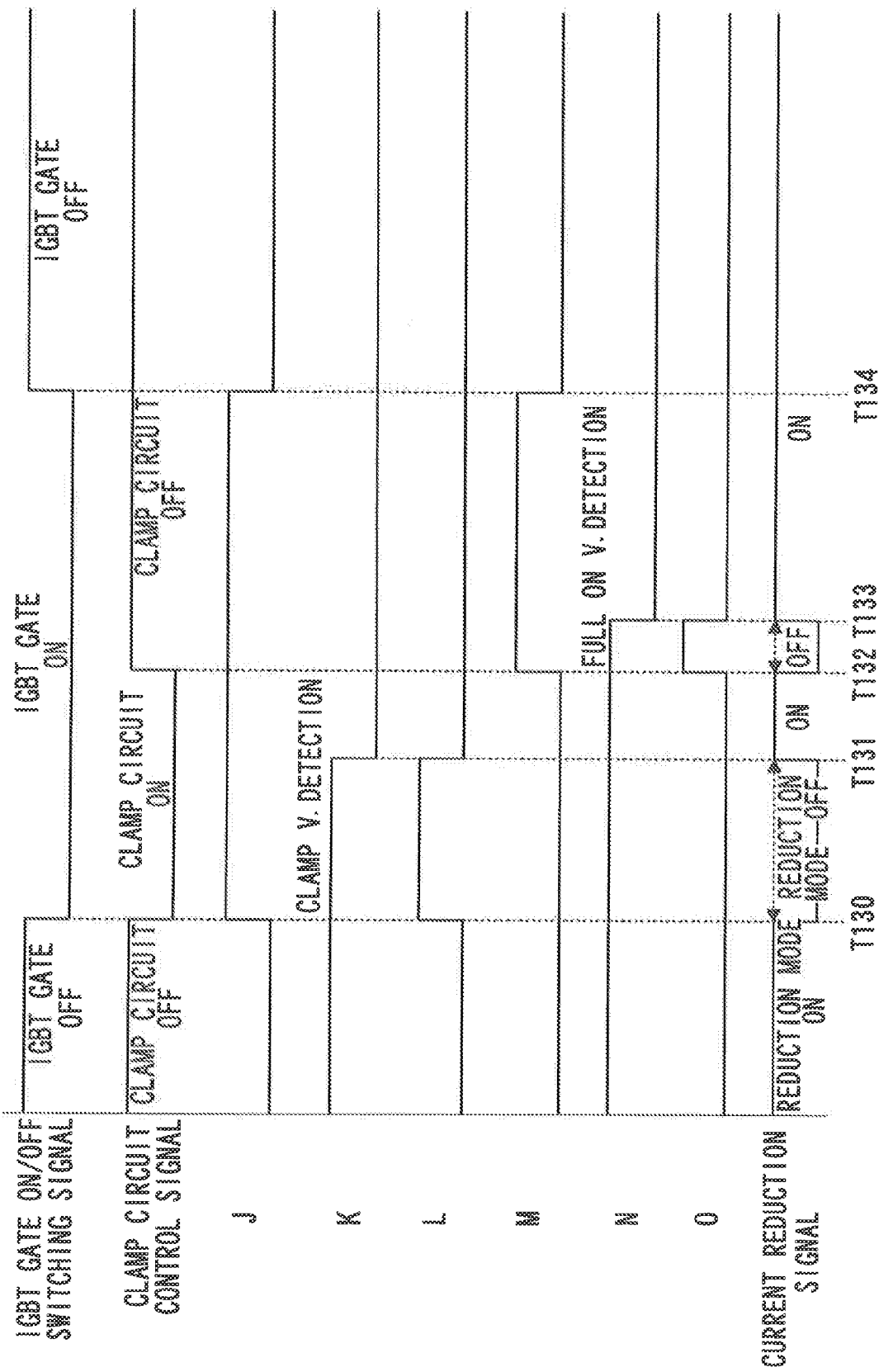
FIG. 36 is a time chart for explaining an operation of a current reduction signal generating circuit according to the twentieth embodiment.

As shown in FIG. 36, the switching signal is at the low level from the timing T130 to the timing T134, and the control signal is at the low level from the timing T130 to the timing T132.

The output J of the inverter 166 corresponds to the inverted output of the switching signal. Therefore, the output J of the inverter 166 is at the high level from the timing T130 to the timing T134. The output K of the comparator 165a is at the high level until the voltage applied to the driving terminal 141 reaches the predetermined voltage, and is at the low level after the voltage applied to the driving terminal 141 reaches the predetermined voltage.

The AND circuit 167a generates the signal being at the high level when the output J of the inverter 166 and the output K of the comparator 165a are at the high level. Therefore, the AND circuit 167a outputs the signal being at the high level from the timing T130 to the timing T131.

On the other hand, the output M of the AND circuit 167b is at the high level when the output J of the inverter 166 and the control signal are at the high level. The output J of the inverter 166 is at the high level from the timing T130 to the timing T134. The control signal is at the high level after the timing T132. Therefore, the output M of the AND circuit 167b is at the high level from the timing T132 to the timing T134.

The output N of the comparator 165b is at the high level until the timing T133 where the voltage applied to the driving terminal 141 reaches the maximum driving voltage. Therefore, the output O of the AND circuit 167c is a the high level from the timing T132 to the timing T133 where the output M of the comparator 167b and the output N of the comparator 165b are at the high level.

The output of the NOR circuit 164 corresponds to the inverted output of the output L of the AND circuit 167a and the inverted output of the output O of the AND circuit 167c. Therefore, the current reduction signal is at the low level in a period from the timing T130 to the timing T131 where the output L of the AND circuit 167a is at the high level. That is, the current reduction mode is in the off state in the period from the timing T130 to the timing T131.

The current reduction signal is at the low level in a period from the timing T132 to the timing T133 where the output of the AND circuit 167c is at the high level. That is, the current reduction mode is in the off state in the period from the timing T132 to the timing T133.

The timing T130 of the present embodiment corresponds to the T110 of the seventeenth embodiment. Similarly, the timings T131, T132 and T133 of the present embodiment correspond to the timings T112, T113 and T114 of the seventeenth embodiment, respectively.

As described above, the current reduction timing can be determined in accordance with the clamp voltage (predetermined voltage) and the full-on voltage (maximum driving voltage) by monitoring the voltage applied to the driving terminal 141 through the comparators 165a, 165b. Further, since the voltage applied to the driving terminal 141, that is, the gate voltage is monitored, the current reduction timing can be accurately determined.

Twenty-First Embodiment

Figure 37:
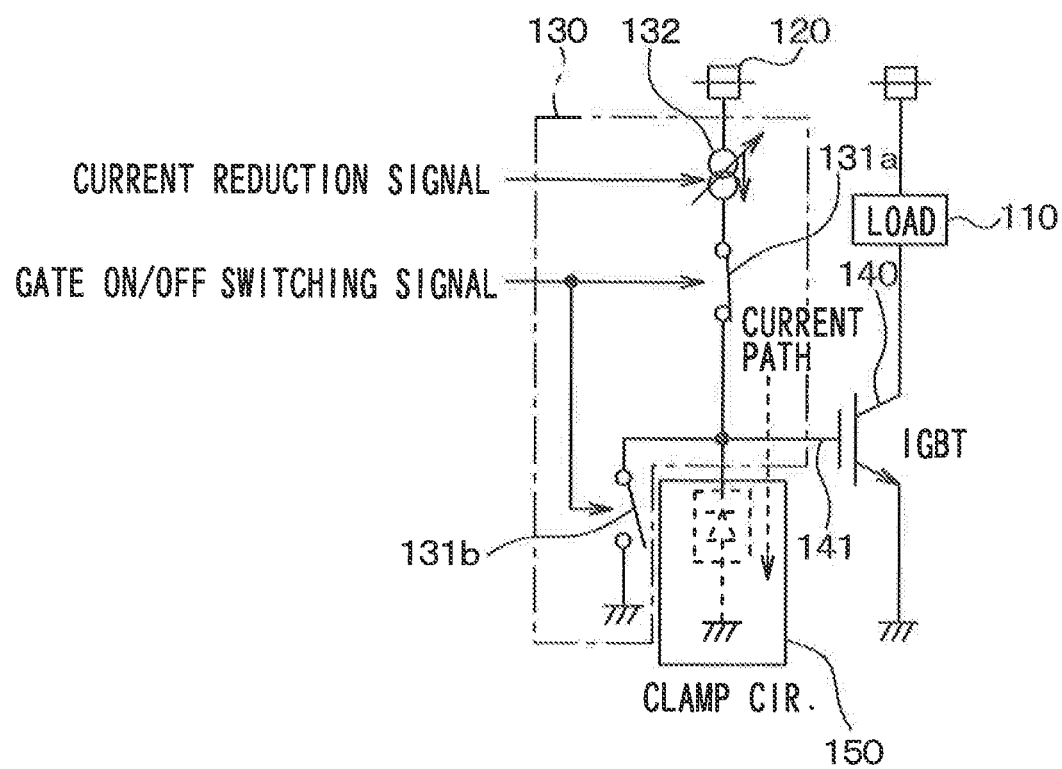
FIG. 37 is a schematic circuit diagram of a load driver, in a state of being connected to a load, according to a twenty-first embodiment.

A twenty-first embodiment will be described with reference to FIG. 37. Hereinafter, a structure different from those of the above described embodiments will be mainly described.

In the above described embodiments, the load 110 is connected to the emitter of the power element 140. Alternatively, the load 110 can be connected to the collector of the power element 140, as shown in FIG. 37.

Twenty-Second Embodiment

A twenty-second embodiment will be described with reference to FIG. 38. Hereinafter, a structure different from those of the above described embodiments will be mainly described.

In the above described embodiments, the driver circuit 130 drives the single power element 140. In the present embodiment, the diver circuit 130 is configured to drive multiple power elements 140.

In a case of driving the multiple power elements (e.g., N number of power elements) 140, it is considered that the gate voltage of any of the multiple power elements 140 reaches the predetermined voltage as the clamp voltage first, and the gate voltage of any other multiple power elements reaches the predetermined voltage last due to unevenness of the gate capacities of the multiple power elements 140.

Further, in a case where the current reduction signal for reducing the electric current of the driver circuit 130 is generated by monitoring the predetermined voltage, if the electric current of the driver circuit 130 is reduced at once when the gate voltage of any one of the multiple power elements 140 reaches the predetermined voltage, the time required to reach the predetermined voltage for the other power elements 140 whose gate voltage has not reached the predetermined voltage increases due to the electric current for charging the other power elements 140 being reduced. As a result, the switching loss of the power elements 140 increases.

Therefore, in the present embodiment, in the case where the multiple power elements 140 are driven by the driver circuit 130, the constant current of the driver circuit 130 is reduced after the gate voltage of all the power elements 140 reach the predetermined voltage as the clamp voltage. Hereinafter, the structure of the load driver will be described with reference to FIG. 38.

Figure 38:
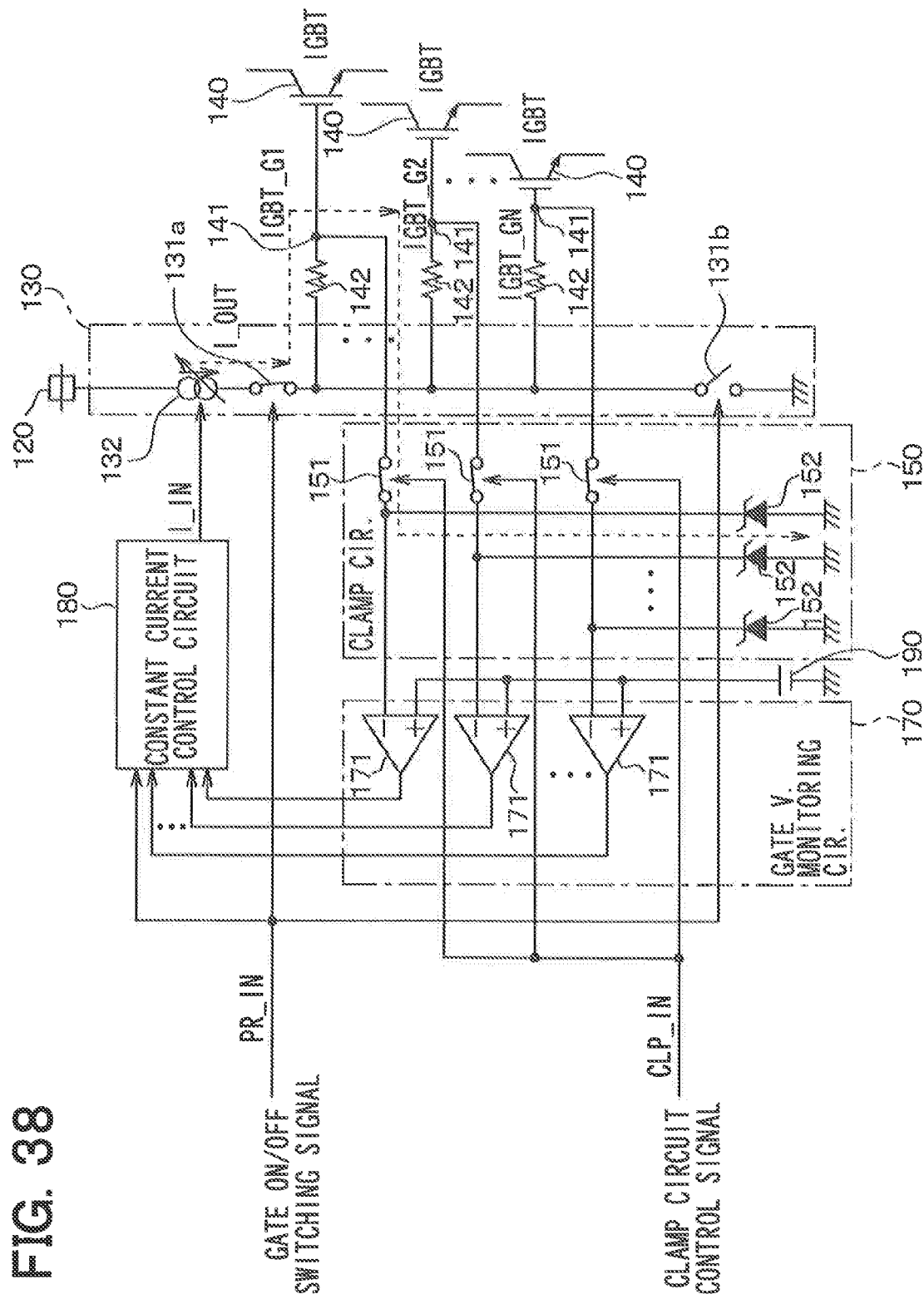
FIG. 38 is a schematic circuit diagram of a load driver according to a twenty-second embodiment.

FIG. 38 is a circuit diagram of the load driver according to the present embodiment. As shown in FIG. 38, the load driver includes the driver circuit 130, the multiple power elements 140 connected to the driver circuit 130, the clamp circuit 150, a gate voltage monitoring circuit 170 and a constant current control circuit 180.

The driving terminal 141 of each of the power elements 140 is connected to the first switch 131a through the resistor 142. In FIG. 38, three power elements 140 are illustrated as an example. The number N of the power elements 140 is two or more than two. The number N of the power elements 140 in the load driver is suitably determined. The load 110 is connected to the emitter or the collector of each power element 140.

The driver circuit 130 turns on the power elements 140 by supplying the constant current to the driving terminal 141 of each power element 140 in accordance with the switching signal PR_IN.

The clamp circuit 150 includes a switch 151 and a clamp portion 152 for each power element 140. The switch 151 is connected to the corresponding driving terminal 141, and the clamp portion 152 is connected between the corresponding switch 151 and the reference voltage line such as the ground. The switch 151 is turned on in accordance with the control signal CLP_IN having the low level Lo, for example.

When the voltage applied to the driving terminal 141 of each power element 140 reaches the predetermined voltage by the constant current supplied by the driver circuit 130, the clamp circuit 150 clamps the voltage applied to each driving terminal 141 on the predetermined voltage in accordance with the control signal. Therefore, the constant current I_OUT is supplied from the driver circuit 130 to the clamp portion 152 via the resistor 142 and the switch 151.

In FIG. 38, the clamp portion 152 is provided by a zener diode. The structure of the clamp portion 152 will be described later in detail with reference to FIG. 39.

The gate voltage monitoring circuit 170 is connected to the driving terminals 141 of the power elements 140 through the switches 151 of the clamp circuit 150. The gate voltage monitoring circuit 170 monitors whether the gate voltage applied to the driving terminal 141 of the power element 140 reaches the predetermined voltage as the clamp voltage, and generates a gate voltage monitoring signal when the gate voltage reaches the predetermined voltage.

As described above, since the load driver has the multiple power elements 140, the gate voltage monitoring circuit 170 monitors the gate voltage applied to the driving terminal 141 of each of the power elements 140, and generates the gate voltage monitoring signal for each power element 140. The gate voltage monitoring circuit 170 includes comparators 171 for monitoring the gate voltages of the power elements 140.

The constant current control circuit 180 generates the current reduction signal I_IN for controlling the switch 138 of the variable constant current circuit 132 based on the switching signal and the gate voltage monitoring signal. The constant current control circuit 180 receives the gate voltage monitoring signal corresponding to each driving terminal 141 from the gate voltage monitoring circuit 170.

The constant current control circuit 180 generates the current reduction signal to turn off the switch 138 when all the gate voltage monitoring signals indicate that the voltage of the corresponding driving terminal 141 reaches the predetermined voltage. With this, the value of the constant current supplied to each driving terminal 141 is reduced.

Next, a circuit structure of the load driver will be described in detail with reference to FIG. 39. The driver circuit 130 has the structure similar to that of the seventeenth embodiment shown in FIG. 30, for example.

As shown in FIG. 39, each clamp portion 152 of the clamp circuit 150 includes an N-channel switching element 153 and an operation amplifier 154. The switching element 153 is connected between the switch 151 and the reference voltage line such as the ground.

A non-inverting input terminal (+) of the operation amplifier 154 is connected to a connecting point between the switch 151 and the switching element 153. That is, the non-inverting input terminal of the operation amplifier 154 is applied with the voltage of the driving terminal 141. An inverting input terminal (−) of the operation amplifier 154 is connected to a reference power source 190. The inverting input terminal of the operation amplifier 154 is applied with the reference voltage.

The reference power source 190 is disposed in the load driver. Further, an output terminal of the operation amplifier 154 is connected to a gate of the switching element 153.

In the clamp circuit 150, the output of the operation amplifier increases when the voltage of the driving terminal 141 rises in a condition where the switch 151 is in the on state. That is, the operation amplifier 154 generates the output so that the two inputs become equal to each other.

Therefore, the output of the operation amplifier 154 increases with the increase in the voltage of the driving terminal 141. As a result, the switching element 153 is turned on. Accordingly, the voltage of the driving terminal 141 is clamped on the predetermined voltage as the clamp voltage.

The gate voltage monitoring circuit 170 has the comparator 171 for each of the power element 140. A non-inverting input terminal (+) of each comparator 171 is applied with the voltage of the corresponding driving terminal 141 through the switch 151 of the clamp circuit 150. An inverting input terminal (−) of each comparator 171 is applied with the reference voltage of the reference power source 190.

Therefore, each comparator 171 generates the signal having the low level when the voltage of the corresponding driving terminal 141 exceeds over the reference voltage and is clamped on the predetermined voltage. The output of each comparator 171 corresponds to the gate voltage monitoring signal. The low level signal generated from the comparator 171 indicates that the voltage of the corresponding driving terminal 141 has reached the predetermined voltage.

In this way, the gate voltage monitoring circuit 170 monitors the voltage of the driving terminal 141 of each power element 140, and generates the gate voltage monitoring signal of the corresponding power element 140.

The constant current control circuit 180 includes a first NOR circuit 181 and a second NOR circuit 182. The first NOR circuit 181 receives the output of each comparator 171, that is, the gate monitoring signal, and generates a signal having the high level when the outputs of all the comparators 171 are at the low level. That is, the first NOR circuit 181 generates the signal having the high level when the voltage of all the driving terminals 141 reaches the predetermined voltage.

The second NOR circuit 182 receives the switching signal and the outputs of the first NOR circuit 181, and generates a signal having a high level when all the signals have the low level. The output I_IN of the second NOR circuit 182 corresponds to the current reduction signal.

Therefore, when the second NOR circuit 182 outputs the signal having the high level as the current reduction signal, that is, when the voltages of all the driving terminals 141 reaches the predetermined voltage, the switch 138 of the constant current source 137 is turned on. The electric current supplied from the driver circuit 130 to the driving terminal 141 of each power element 140 increases.

When the second NOR circuit 182 outputs the signal having the low level as the current reduction signal, the switch 138 is turned off. Therefore, the electric current supplied from the driver circuit 130 to the driving terminal 141 of each power element 140 reduces.

Figure 40:
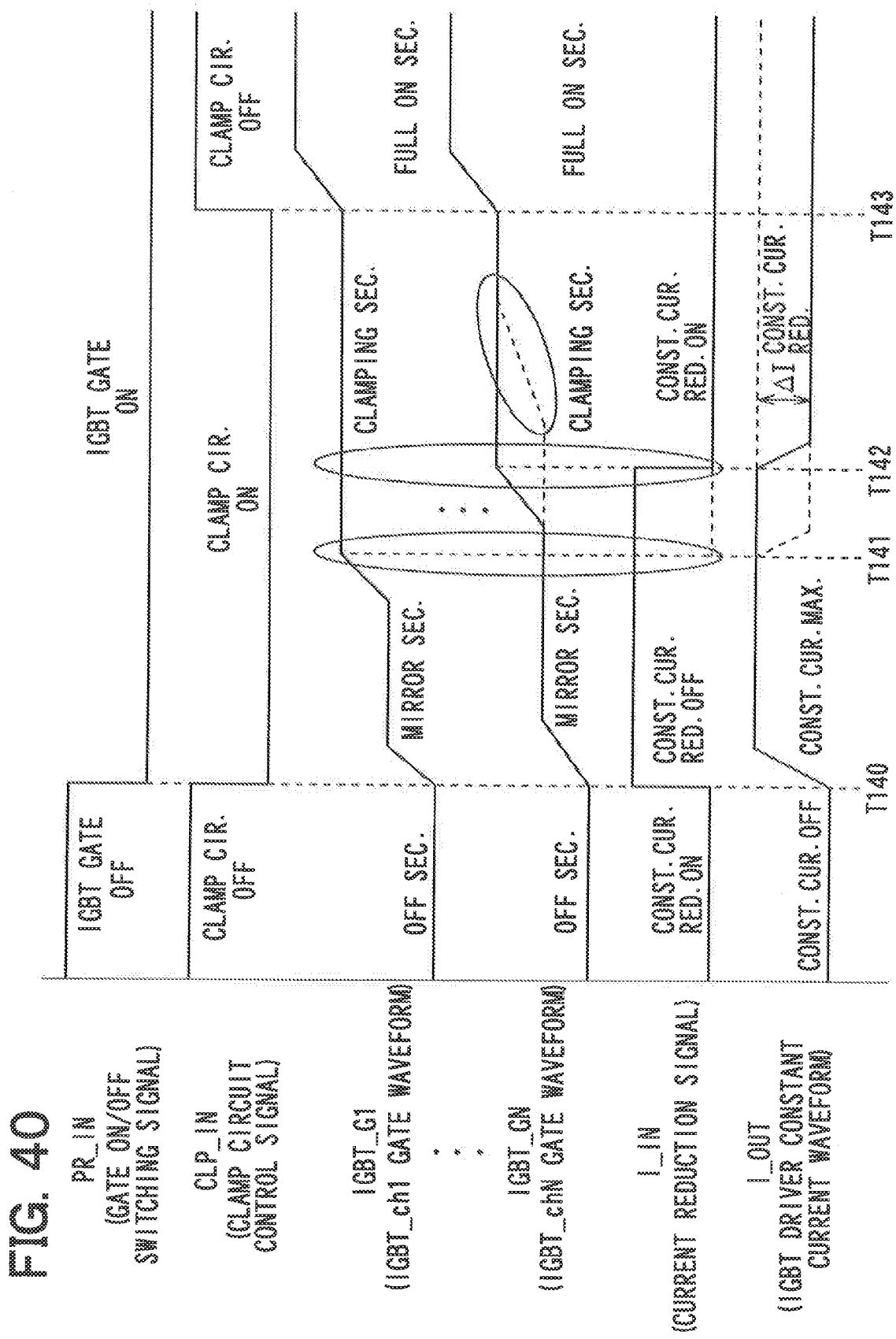
FIG. 40 is a time chart for explaining an operation of the load driver according to the twenty-second embodiment.

Next, an operation of the load driver shown in FIG. 39 will be described with reference to a time chart shown in FIG. 40.

At a timing 1140, the switching signal PR_IN inputted into the driver circuit 130 and the control signal CLP_IN inputted into the clamp circuit 150 change from the high level (Hi) to the low level (Lo). Therefore, in the clamp circuit 150, since the switches 151 are turned on, the voltage of each driving terminal 141 is applied to the corresponding comparator 171 of the gate monitoring circuit 170.

At this timing, since the voltage of each driving terminal 141 is low, the outputs of all the comparators 171 are at the high level. With this, the second NOR circuit 182 of the constant current control circuit 180 outputs the low level signal as the current reduction signal, and thus the switch 138 of the constant current source 137 is turned on.

Therefore, the electric current I_OUT supplied from the driver circuit 130 to each driving terminal 141 increases. With this, the voltage of each driving terminal 141 rises and reaches the mirror voltage. Also, the output of each operation amplifier 154 increases with an increase in the voltage of the corresponding driving terminal 141.

At a timing T141, the voltage of the driving terminal 141 of one of the power elements 140 reaches the clamp voltage first. That is, in the clamp circuit 150, since the operation amplifier 154 corresponding to this power element 140 turns on the switching element 153 so that the two inputs becomes equal to each other, the voltage of the driving terminal 141 that is electrically connected to the non-inverting input terminal of the operation amplifier 154 is clamped on the clamp voltage (predetermined voltage). This power element 140 is referred to as the power element IGBT_ch1. Also, the voltage of the driving terminal of the power element IGBT_ch1 is referred to as IGBT_G1.

The power element 140 having the driving terminal 141 whose voltage reaches the clamp voltage (predetermined voltage) last is referred to as the power element IGBT_chN. The voltage of the driving terminal 141 of the power element IGBT_chN is referred to as IGBT_GN.

In a conventional load driver, at the timing T141, the current reduction control circuit 180 outputs the current reduction signal to turn off the switch 138, and hence the electric current supplied from the driver circuit 130 to the driving terminals 141 of all the power elements 140 is reduced. Therefore, as shown by a dashed line of the IGBT_GN in FIG. 40, a period of time for charging the gate of the power element IGBT_chN is long, resulting in the switching loss. Also, a period of time where the electric current passes through each switching element 153 of the clamp circuit 150 is long, resulting in the current loss.

In the present embodiment, on the other hand, even if the voltage of the driving terminal 141 of one power element 140 reaches the predetermined voltage, only the output of the comparator 171 corresponding to this power element 140 becomes the low level. That is, since the outputs of all the comparators 171 are not at the low level, the output of the first NOR circuit 181 of the constant current control circuit 180 is maintained at the low level. Therefore, the electric current I_OUT supplied from the driver circuit 130 to each of the driving terminals 141 maintains the first current value larger than the second current value.

When the voltage IGBT_GN of the power element IGBT_chN reaches the predetermined voltage, the outputs of all the comparators 171 are at the low level. Therefore, the output of the first NOR circuit 181 becomes the high level.

Since the output of the second NOR circuit 182 becomes the low level as the current reduction signal, the switch 138 of the constant current source 137 is turned off. As such, the value I_OUT of the electric current supplied from the driver circuit 130 to the driving terminal 141 of each power element 140 is reduced by ΔI from the second current value.

Thereafter, the voltage of the driving terminals 141 of all the power elements 140 is maintained at the predetermined voltage until a timing T143. At the timing T143, when the clamp circuit 150 is turned off, that is, the switches 151 are turned off in accordance with the control signal, the voltage of each driving terminal 141 reaches the maximum driving voltage (i.e., full-on section).

As described above, in the case of driving the multiple power element 140 by the driver circuit 130, the constant current supplied from the variable constant current circuit 132 of the driver circuit 130 to the driving terminals 141 of the multiple power element 140 is reduced when the voltages of all the driving terminals 141 reach the predetermined voltage. Therefore, the electric current flowing into the clamp circuit 150 can be reduced while restricting the switching loss of the power element 140.

Twenty-Third Embodiment

A twenty-third embodiment will be described with reference to FIG. 41. Hereinafter, a structure different from that of the twenty-second embodiment will be mainly described.

Figure 41:
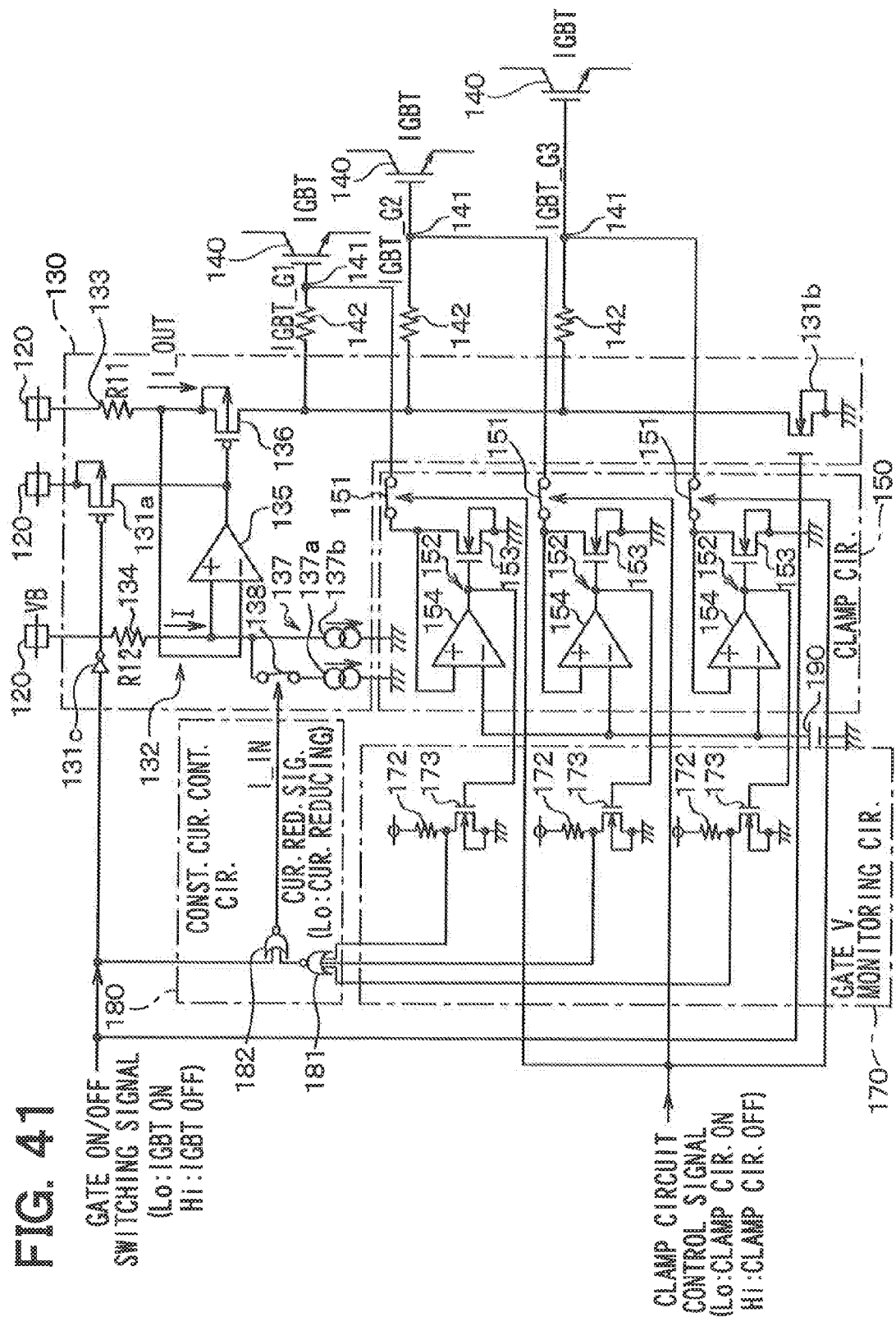
FIG. 41 is a circuit diagram of a load driver according to a twenty-third embodiment.

FIG. 41 is a circuit diagram of the load driver according to the present embodiment. As shown in FIG. 41, the gate voltage monitoring circuit 170 has a structure different from that of the twenty-second embodiment.

Specifically, the gate voltage monitoring circuit 170 includes a resistor 172 and an N-channel switching element 173 for each of the power elements 140. The resistor 172 is connected to an internal power source disposed inside of the load driver.

The switching element 173 is connected between the resistor 172 and the reference voltage line such as the ground. A gate of the switching element 173 is connected to the output terminal of the clamp circuit 150. The voltage at a connecting point between the resistor 172 and the switching element 173 is fed into the constant current control circuit 180 as the gate voltage monitoring signal.

The internal power source may have any power source voltage. However, the withstand voltage of the switching element 173 is reduced with a decrease in the power source voltage. Therefore, the size of the switching element 173 can be reduced.

In such a structure, before the voltage of the driving terminal 141 of the power element 140 reaches the predetermined voltage, the output of the operation amplifier 154 of the clamp circuit 150 is at the low level, and thus the switching element 173 is in an off state. Therefore, the voltage of the connecting point between the resistor 172 and the switching element 173 is equal to the voltage of the internal power source. As such, the signal having the high level is generated as the gate voltage monitoring signal.

When the voltage of the driving terminal 141 reaches the predetermined voltage, and the output of the operation amplifier 154 becomes the high level, the switching element 173 is turned on. Because the electric current occurs in the switching element 173, the voltage of the connecting point between the resistor 172 and the switching element 173 reduces. As a result, the signal having the low level is outputted as the gate voltage monitoring signal.

As described above, the gate voltage monitoring circuit 170 can be provided using the resistors 172 and the switching elements 173, in place of the comparators 171.

Twenty-Fourth Embodiment

A twenty-fourth embodiment will be described with reference to FIGS. 42 and 43. Hereinafter, a structure different from those of the twenty-second and twenty-third embodiments will be mainly described.

In the twenty-second and twenty-third embodiments, the value of the constant current generated by the variable constant current circuit 132 is reduced at a time after the voltages of all the driving terminals reach the predetermined voltage. In the present embodiment, on the other hand, the value of the constant current generated by the variable constant current circuit 132 is reduced stepwise after the voltages of all the driving terminals reach the predetermined voltage. In the present embodiment, three power element 140 are employed, for example.

Figure 42:
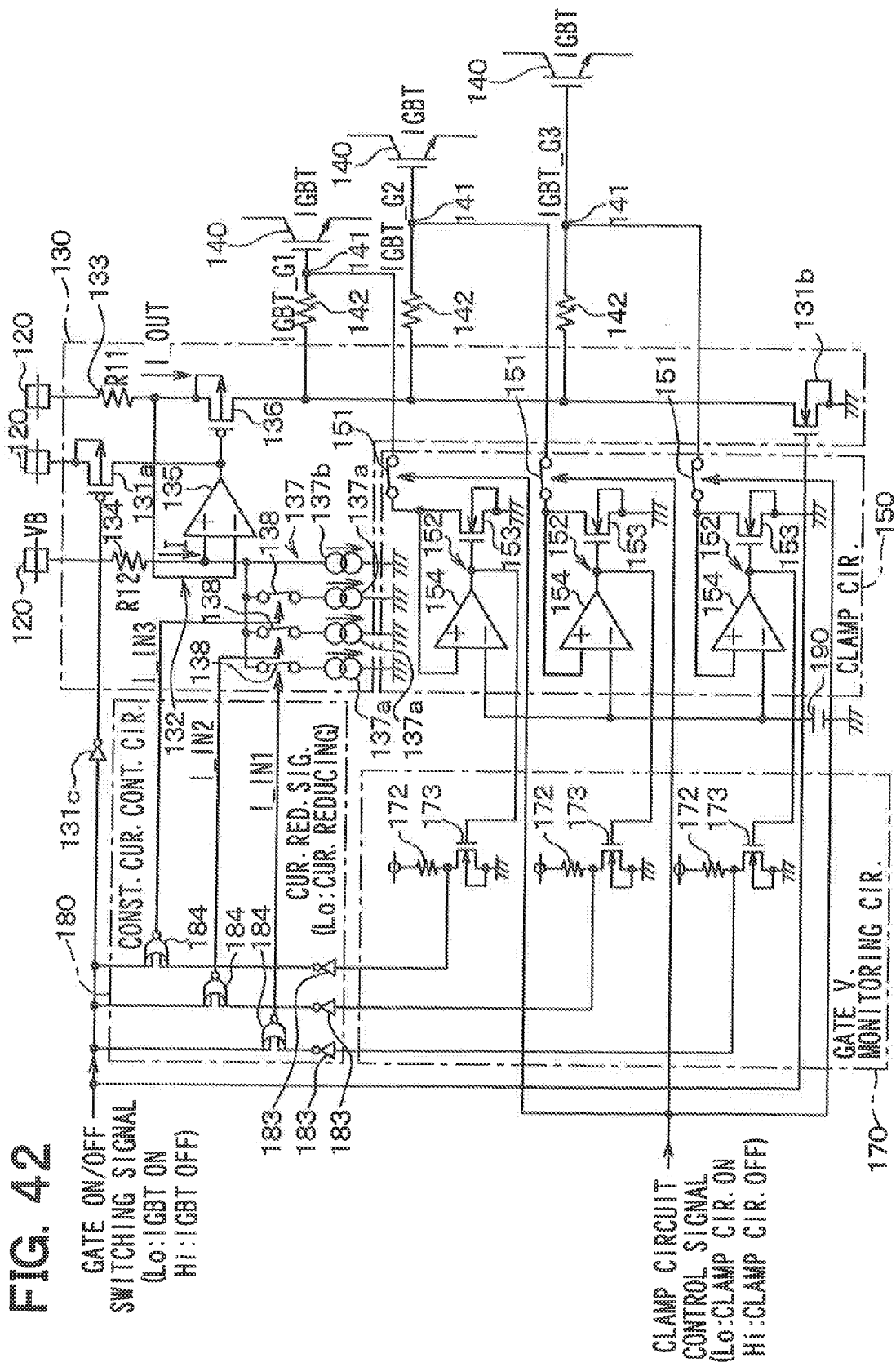
FIG. 42 is a circuit diagram of a load driver according to a twenty-fourth embodiment.

FIG. 42 is a circuit diagram of the load driver according to the present embodiment. As shown in FIG. 42, the constant current source 137 of the driver circuit 130 includes multiple switches 138 and multiple first constant current sources 137a corresponding to the multiple switches 138.

The value of the electric current is the same between the first constant current sources 137a. The pair of the switch 138 and the first constant current source 137a is provided for each power element 140.

When all the switches 138 are turned on, the electric current having the first current value passes through the constant current source 137. When all the switches 138 are turned off, the electric current having the second current value passes through the constant current source 137. The value of the electric current passing through the constant current source 137 reduces with an increase in the number of the switches 138 being in the off state. Thus, the value of the electric current is changed stepwise from the first current value toward the second current value.

The constant current control circuit 180 includes inverters 183 and NOR circuits 184 corresponding to the power elements 140 in order to turn on the switches 138 stepwise. Each inverter 183 is connected to a connecting point between the corresponding resistor 172 and the corresponding switching element 173. The inverter 183 inverts the voltage of the connecting point as the gate voltage monitoring signal.

The NOR circuit 184 receives the switching signal and a signal outputted from the corresponding inverter 183, and generates a signal having a high level when all the signals are at the low level. The output of the NOR circuit 184, such as I_IN1, I_IN2, I_IN3, corresponds to the current reduction signal.

Also in the present embodiment, the switch 138 is turned off in accordance with the current reduction signal having the low level. The constant current control circuit 180 outputs the current reduction signal to turn off the corresponding switch 138 each time the gate voltage monitoring signal is inputted into the constant current control circuit 180 from the gate voltage monitoring circuit 170. Therefore, the value of the constant current supplied to the driving terminals 141 is reduced stepwise as the switches 138 are turned off stepwise. Accordingly, the constant current supplied to the driving terminals 141 is not reduced at once.

Next, an operation of the load driver shown in FIG. 42 will be described with reference to a time chart shown in FIG. 43.

An operation from a timing T150 to a timing T151 is similar to the operation from the timing T140 to the timing T141 of the twenty-second embodiment.

At the timing T151, when the voltage of the driving terminal 141 of any one of the power elements 140, i.e., the power element IGBT_ch1 reaches the predetermined voltage as the clamp voltage first, the signal having the low level is outputted from the connecting point between the resistor 172 and the switching element 173, which correspond to the driving terminal IGBT_ch1.

The signal having the low level is fed into the corresponding NOR circuit 184 in the constant current control circuit 180. Thus, the current reduction signal I_IN1 having the low level is generated from the corresponding NOR circuit 184. Therefore, the switch 138 corresponding to the power element IGBT_ch1 is turned off. As such, the value of the constant current supplied from the driver circuit 130 to each driving terminal 141 reduces by Δ⅓ after the timing T151.

Thereafter, when the voltage of the driving terminal 141 of another power element 140 reaches the predetermined voltage next, the value of the constant current supplied from the driver circuit 130 to each driving terminal 141 further reduces by Δ⅓. In this way, the electric current passing through the constant current source 137 reduces stepwise as the switches 138 are turned off on by one. With this, the value of the constant current supplied from the driver circuit 130 to each driving terminal 141 reduces stepwise. Accordingly, the waveform of the constant current has a stepwise shape.

At a timing T153, when the voltage of the driving terminal 141 of the last power element 140 (i.e., IGBT_chN, e.g., IGBT_ch3) reaches the predetermined voltage, all the switches 138 are in the off state. Therefore, the constant current having the second current value is supplied from the driver circuit 130 to each driving terminal 141. The value of the constant current supplied to each driving terminal 141 thereafter is reduced. The operation after a timing T154 is similar to the operation after the timing T143 of the twenty-second embodiment.

Figure 43:
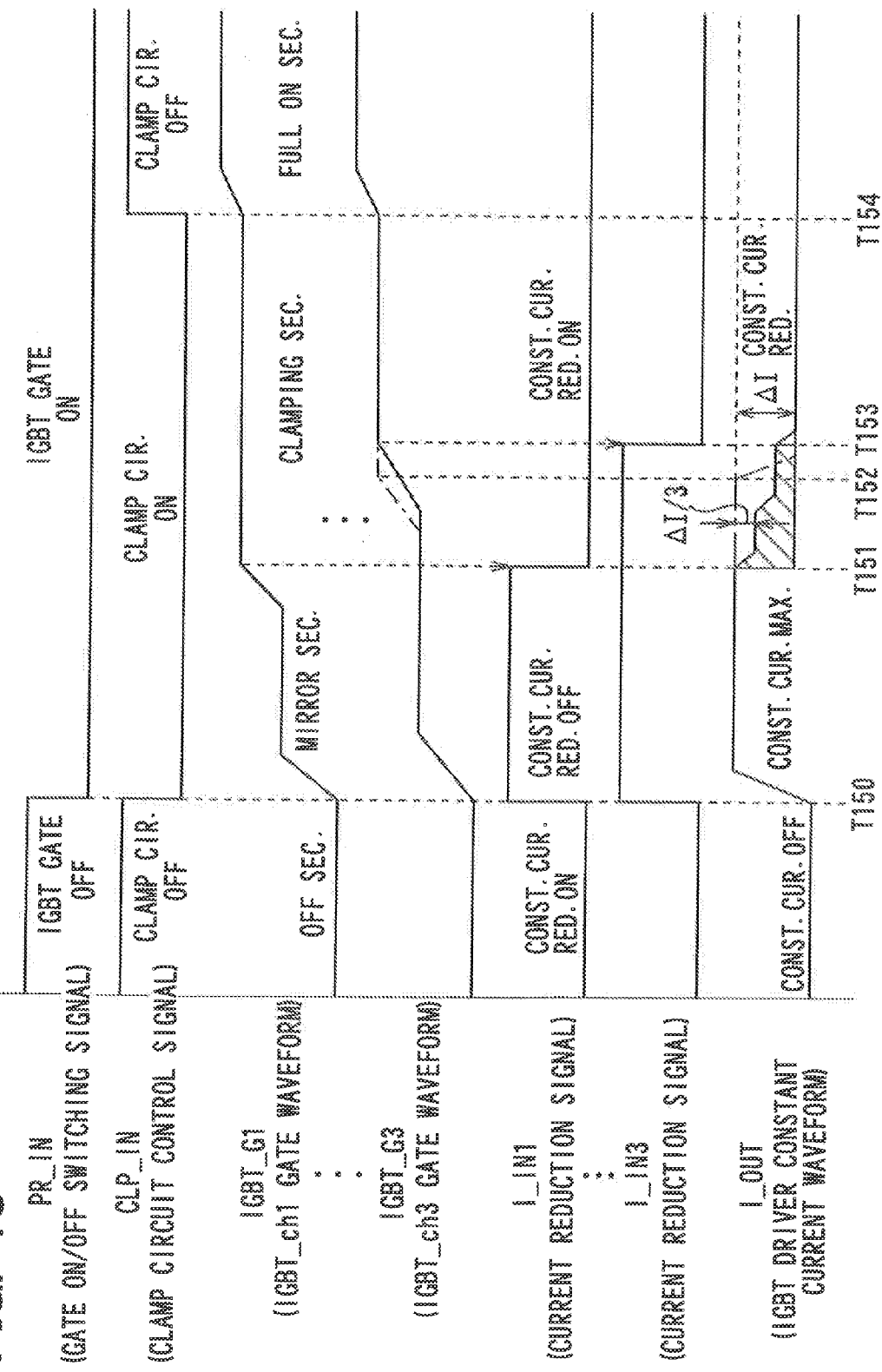
FIG. 43 is a time chart for explaining an operation of the load driver according to the twenty-fourth embodiment.

In the case where the constant current of the driver circuit 130 is reduced after the voltages of all the driving terminals 141 reach the predetermined voltage, the value of the constant current is reduced from the first current value to the second current value at once, e.g., at the timing T152, as shown by a dashed-chain line in FIG. 43.

In the present embodiment, on the other hand, the value of the constant current is reduced for one-step when the voltage of one of the driving terminals 141 reaches the predetermined voltage first. The value of the constant current is reduced step by step every time the voltage of the driving terminal 141 reaches the predetermined voltage.

Therefore, comparing the area of the waveform of the constant current from the timing T151 to the timing T153 between the two cases, the area of the case where the constant current is reduced stepwise is smaller than that of the case where the constant current is reduced at once. Accordingly, the constant current of the driver circuit 130 is further effectively reduced.

Since the value of the constant current is reduced gradually, a transition time from the mirror period to the clamp voltage level is increased, resulting in an increase in the switching loss. However, because the overshoot amount of the clamp voltage is reduced, the loss of the power element in the short-circuit can be reduced.

In the present embodiment, as described above, the constant current is reduced stepwise after the voltage of any one of the driving terminals 141 reaches the predetermined voltage first. The constant current has been reduced stepwise by the timing where the voltages of all the driving terminals reach the predetermined voltage. Therefore, the constant current can be further reduced, as compared with the case where the value of the constant current supplied to each driving terminal 141 is reduced at once.

Twenty-Fifth Embodiment

A twenty-fifth embodiment will be described with reference to FIG. 44. Hereinafter, a structure different from that of the twenty-fourth embodiment will be mainly described.

In the twenty-fourth embodiment, the value of the electric current is the same between the first constant current sources 137a. In the present embodiment, the value of the electric current is different between the first constant current sources 137a.

Figure 44:
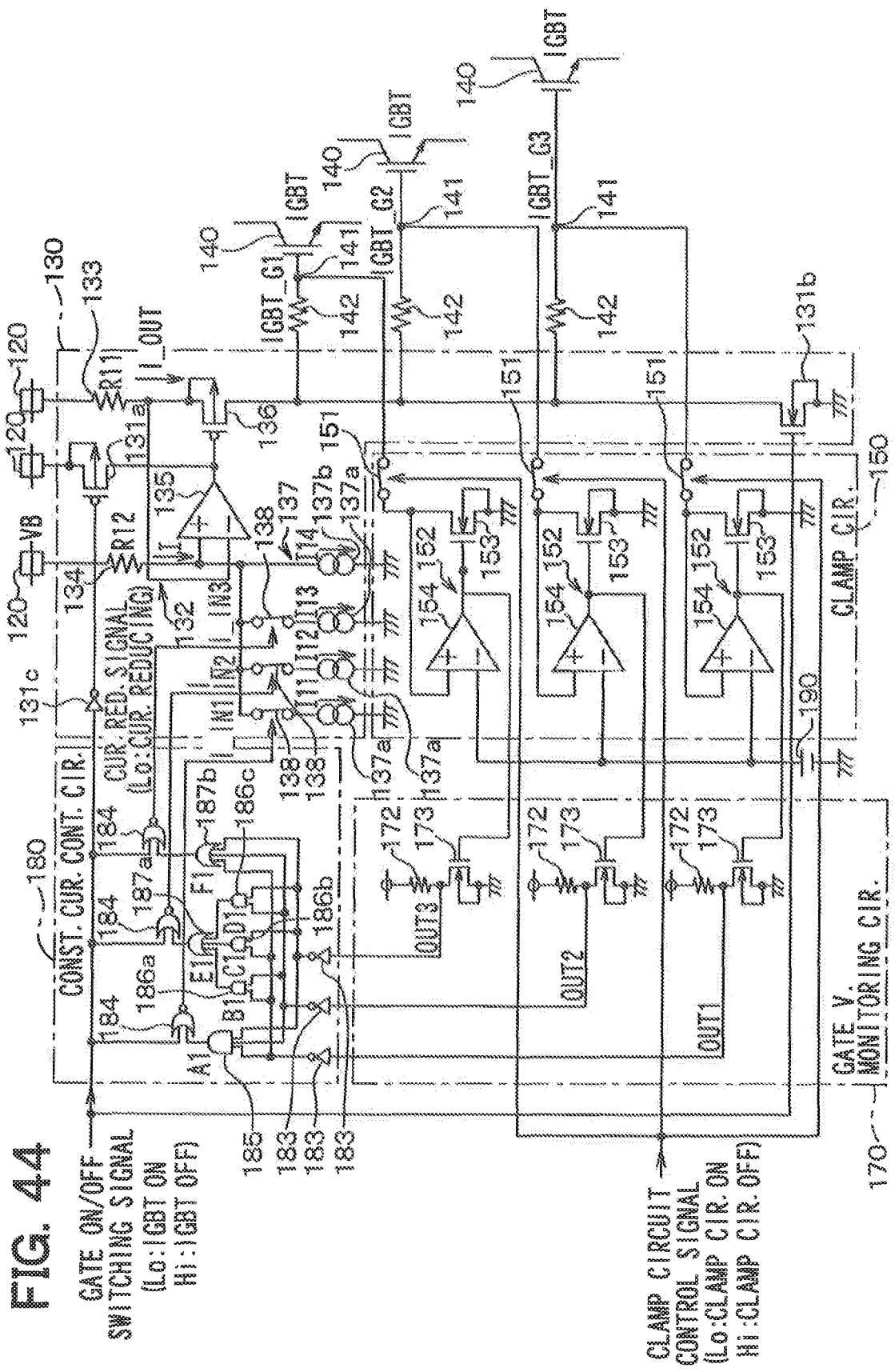
FIG. 44 is a circuit diagram of a load driver according to a twenty-fifth embodiment.

FIG. 44 is a circuit diagram of the load driver according to the present embodiment. As shown in FIG. 44, the constant current source 137 includes the first constant current sources 137a and a second constant current source 137b. The first constant current sources 137a and the second constant current source 137b have different current values. The current values of the first constant current sources 137a are defined as I11, I12, I13, respectively. The current value of the second constant current source 137b is defined as I14.

The current values I11, I12, I13, and I14 have a relationship of I11>I12>I13>I14. Therefore, when all the switches 138 are turned on, the electric current having the first current value passes through the constant current source 137 due to the current values I11, I12, I13, and I14 being added together. When all the switches 138 are turned off, the electric current having the second current value passes through the second constant current source 137b in the constant current source 137.

The constant current control circuit 180 includes the inverters 183 and the NOR circuits 184 corresponding to the multiple power elements 140. The constant current control circuit 180 further includes AND circuits 185, 186a, 186b, 186c and OR circuits 187a, 187b. The AND circuits 185, 186a, 186b, 186c and the OR circuits 187a, 187b are not disposed to correspond to each of the power elements 140.

The gate voltage monitoring signal corresponding to the IGBT_G3 is defined as OUT1. The gate voltage monitoring signal corresponding to the IGBT_G2 is defined as OUT2. The gate voltage monitoring signal corresponding to the IGBT_G1 is defined as OUT3.

The inverters 183 are connected to all the inputs of the AND circuit 185. The output A1 of the AND circuit 185 is inputted into the NOR circuit 184 that corresponds to the switch 138 having the current value I11.

The inverters 183 corresponding to the OUT1 and the OUT2 are connected to the inputs of the AND circuit 186a. The output B1 of the AND circuit 186a is inputted into the OR circuit 187a.

The inverters 183 corresponding to the OUT1 and the OUT3 are connected to the inputs of the AND circuit 186b. The output C1 of the AND circuit 186b is inputted into the OR circuit 187a.

The inverters 183 corresponding to the OUT2 and the OUT3 are connected to the inputs of the AND circuit 186c. The output D1 of the AND circuit 186c is inputted into the OR circuit 187a.

The AND circuits 186a, 186b, 186c are connected to the inputs of the OR circuit 187a. The output E1 of the OR circuit 187a is inputted into the NOR circuit 184 corresponding to the switch 138 that has the current value I12.

All the inverters 183 are connected to the inputs of the OR circuit 187b. The output F1 of the OR circuit 187b is inputted into the NOR circuit 185 corresponding to the switch 138 that has the current value I3.

The switches 138 are turned off in accordance with the current reduction signal having the low level (Lo), and the current value is reduced. Therefore, in the constant current control circuit 180 having the above described structure, when the switching signal is at the low level corresponding to the on command, the current reduction signals I_IN1, I_IN2 and I_IN3 are established as follows: (1) the I_IN1 is at the low level (Lo) when all OUT1 OUT2 and OUT3 are at the low level; (2) the I_IN2 is at the low level (Lo) when two or more of OUT1. OUT2 and OUT3 are at the low level; and (3) I_IN3 is at the low level (Lo) when one or more of OUT1, OUT2 and OUT3 is at the low level. The above conditions are shown in a truth value chart of FIG. 45.

Next, an operation of the load driver shown in FIG. 44 will be described with reference to a time chart shown in FIG. 46.

The operation from a timing T160 to a timing T161 is similar to the operation from the timing T50 to the timing T51 of the twenty-fourth embodiment shown in FIG. 43.

At the timing T161, when the voltage IGBT_G1 of the driving terminal 141 of the power element IGBT_ch1 reaches the predetermined voltage as the clamp voltage first, only the OUT3 becomes the low level. Therefore, as shown in FIG. 45, only the current reduction signal I_IN3 becomes the low level. With this, only the switch 138 corresponding to the current value I13 is turned off. Therefore, the constant current supplied from the driving circuit 130 to each driving terminal 141 is reduced by ΔI13.

Next, when the voltage IGBT_G2 of the driving terminal 141 of the power element IGBT_ch2 reaches the predetermined voltage, the OUT2 and the OUT3 become the low level. Therefore, as shown in FIG. 45, the current reduction signals I_IN2 and I_IN3 become the low level. With this the switches 138 corresponding to the current value I12 and I13 are turned off. Therefore, the constant current supplied from the driver circuit 130 to each driving terminal 141 is reduced by Δ(I12+I13).

At a timing T163, when the voltage IGBT_G1 of the driving terminal 141 of the power element IGBT_ch3 reaches the predetermined voltage last, all the OUT1, OUT2 and OUT3 become the low level. Therefore, as shown in FIG. 45, all the current reduction signals I_IN1, I_IN2 and I_IN3 become the low level. With this, all the switches 138 corresponding to the current values I11, I12, I13 are turned off, the constant current supplied from the driver circuit 130 to each driving terminal 141 is reduced by Δ(I11+I12+I13), and becomes the second current value. The operating after the timing T164 is similar to the operation after the timing T143.

As comparing the area of the constant current waveform between a case where the current value is reduced from the first current value to the second current value at once at the timing T162 corresponding to the timing T152 as shown by a dashed-chain line and a case where the current value is reduced stepwise as shown by a solid line from the timing T161 to the timing T163, the area is smaller in the case where the constant current is reduced stepwise than that in the case where the constant current is reduced at once. Therefore, the constant current of the driver circuit 130 is further effectively reduced.

Since the current value of each first constant current source 137a is optimized, the consumption current in the load driver is reduced, while maintaining the switching loss to a substantially similar level to that of the case where the constant current is reduced at once.

Other Embodiments

Various exemplary embodiments are described hereinabove. However, the present invention is not limited to the above described exemplary embodiments, but may be implemented in various other ways without departing from the spirit of the invention.

For example, the structures of the constant current generator 30 described in the first embodiment and the third embodiment are examples, and the constant current generator 30 may have any other structures. Also, the driver circuit 40 is not limited to the above described structures, but may have any other structures.

In the first through fourth embodiments, the switching element 50 is provided by the N-channel MOSFET. Alternatively, the switching element 50 may be provided by the P-channel MOSFET. Also in a case where the switching element 50 is provided by the P-channel MOSFET, the constant current is reduced on condition that the output of the driver circuit 40 is at the high level, that is, the potential of the gate of the switching element 50 is at the high level. In the fifth embodiment, the switching element 50 may be provided by the N-channel MOSFET. In such a case, the pre-driver unit 60 is configured to correspond to the N-channel switching element 50.

In the fourth embodiment, the value (intensity) of the constant current is controlled by adjusting both the voltage value of the power source 36 and the resistance value of the resistor 43b. Alternatively, the value of the constant current may be controlled by adjusting one of the voltage value of the power source 36 and the resistance value of the resistor 34b.

For example, in a case where the resistance value of the resistor 34b is a fixed value, and the voltage value of the power source 36 is adjusted, the voltage value of the power source 36 is set to the first voltage value in accordance with the current reduction signal until the on-timing where the switching element 50 reaches the on state, that is, during the on-period where the switching element 50 is turned on. Therefore, the constant current having the first current value is supplied to the driver circuit 40 until the on-timing.

After the on-timing where the switching element 50 reaches the on state, that is, after the on-period has elapsed, the voltage value of the power source 36 is set to the second voltage value that is smaller than the first voltage value in accordance with the current reduction signal. Therefore, the constant current having the second current value is supplied to the driver circuit 40.

In this way, the value of the constant current supplied to the driver circuit 40 can be controlled by adjusting only the voltage value of the power source 36.

Alternatively, in a case where the voltage value of the power source 36 is a fixed value and the resistance value of the resistor 34b is adjusted, the resistance value of the resistor 34b is set to the first resistance value in accordance with the current reduction signal until the on-timing where the switching element 50 reaches the on state. Therefore, the constant current having the first current value is supplied to the driver circuit 40. After the on-timing, the resistance value of the resistor 34b is set to the second resistance value larger than the first resistance value. Therefore, the constant current having the second current value is supplied to the driver circuit 40. In this way, the value of the constant current supplied to the driver circuit 40 can be controlled by adjusting the resistance value of the resistor 34b.

In the load drivers of the sixth through sixteenth embodiments, the constant current generator 30 of the first embodiment is exemplarily employed. Alternatively, the constant current generator 30 having a different structure may be employed in the load drivers of the sixth through sixteenth embodiments.

For example, the structure of the constant current source 137 of the seventeenth embodiment is an example, and may be modified into any other structures. Also, the structure of the second resistor of the eighteenth embodiment is just an example, and may be modified into any other structures. The current reduction signal generating circuit 160 shown in FIG. 33 or 35 may be added to the structure where the constant current is reduced by adjusting the resistance value of the eighteenth embodiment. Further, the current reduction signal generating circuits 160 shown in FIG. 33 and FIG. 35 are examples, and may have any other structures. Alternatively, the current reduction signal generating circuit 160 may be included in the driver circuit 130.

In the above described embodiments, the voltage applied to the driving terminal 141 is increased to the maximum driving voltage once after reaching the predetermined voltage. Such a driving operation is an example. As another example, the power element 140 may be driven at the predetermined voltage after the voltage applied to the driving terminal 141 reaches the predetermined voltage.

In the twenty-second embodiment, the clamp portion 152 exemplarily includes the switching element 153 and the operation amplifier 154. Any other structures may be employed as long as the voltage of the driving terminal 141 is clamped on the predetermined voltage.

In the above described embodiments, such as the twenty-second through twenty-fifth embodiments, the reference power source 190 is commonly used between the clamp circuit 150 and the gate voltage monitoring circuit 170, as an example. Alternatively, the reference power source 190 may be provided for each of the clamp circuit 150 and the gate voltage monitoring circuit 170. In such a case, the reference voltage can be set more precisely.

In the above described embodiments, such as the twenty-second through twenty-fifth embodiments, the value of the constant current supplied to each driving terminal 141 is changed by changing the current value of the constant current source 137. Alternatively, the value of the constant current supplied to each driving terminal 141 can be changed by changing the resistance value as the eighteenth embodiment.

In the structure where the resistance value is changed, the second resistor 134 may be provided with the multiple switches 138 to reduce the current value stepwise. In such a case, the when all the switch 138 are turned on, the resistance value becomes the first resistance value by the smallest compound resistance value. When all the switch 138 are turned off, the resistance value becomes the second resistance value larger than the first resistance value, by the largest compound resistance value. The resistance value is changed stepwise from the second resistance value to the first resistance value with an increase in the number of turning on the switches 138.

The constant current control circuit 180 generates the current reduction signal to turn on one switch 138 each time the gate voltage monitoring signal is fed from the gate voltage monitoring circuit 170. Therefore, since the resistance value of the second resistor 134 is reduced stepwise from the second resistance value to the first resistance value, the constant current supplied to each driving terminal 141 is reduced stepwise.

Further, the above described embodiments may be suitably combined in various other ways.

Additional advantages and modifications will readily occur to those skilled in the art. The invention in its broader term is therefore not limited to the specific details, representative apparatus, and illustrative examples shown and described.

What is claimed is:

1. A load driver for driving a load, comprising:
a switching element;
a constant current generator that generates a constant current; and
a driver circuit that is connected to the constant current generator and turns on the switching element for an on-period, which depends on a value of the constant current from the constant current generator, the on-period required to turn on the switching element being shortened with an increase in the value of the constant current, wherein
the constant current generator supplies a first constant current having a first current value to the driver circuit during the on-period when the switching element is turned on, and supplies a second constant current having a second current value smaller than the first current value after the on-period has elapsed,
the load is a power element provided by a semiconductor switching element,
the constant current generator and the driver circuit constitute a pre-driver unit that drives the power element by driving the switching element,
the driver circuit is configured to turn on the power element by driving the switching element in accordance with a switching signal, and
the pre-driver unit is configured to drive the switching element by the first constant current until a time when the power element reaches an on state, and to drive the switching element by the second constant current after the power element reaches the on state,
the load driver further comprising:
a constant current circuit that supplies the constant current to a gate of the power element until a gate voltage of the power element reaches a predetermined voltage when the switching element is turned off, thereby to turn on the power element;
a clamp circuit that is configured to receive a short-circuit detection signal indicating a short-circuit of the power element, and to clamp the gate voltage of the power element to a clamp voltage when receiving the short-circuit detection signal; and
a current reduction control circuit that outputs a current reduction signal to generate the second constant current supplied to the gate of the power element at the time when the power element reaches the on state after the switching signal is received by the driver circuit, wherein
the constant current circuit drives the power element by the first constant current in accordance with the current reduction signal from the current reduction control circuit until the power element reaches the on state, and drives the power element by the second constant current in accordance with the current reduction signal after the timing where the power element reaches the on state, the current reduction control circuit is configured to receive the short-circuit detection signal, and the current reduction control circuit outputs the current reduction signal to generate the first constant current during a period starting when the short-circuit detection signal is received by the current reduction control circuit and ending when the input of the short-circuit detection signal is stopped.

2. The load driver according to claim 1, wherein the constant current generator includes:
- a switch that is turned on or off in accordance with the current reduction signal indicating one of an on command and an off command;
- a first constant current source that is connected to the switch; and
- a second constant current source that is connected in parallel with a series line of the switch and the first constant current source, the driver circuit is configured to turn on the switching element in accordance with the switching signal, the switch is in an on state during the on-period in accordance with the on command of the current reduction signal so that the first constant current is generated by adding an electric current passing through the first constant current source to an electric current passing through the second constant current source, and the switch is in an off state in accordance with the off command of the current reduction signal after the on-period has elapsed, so that the second constant current is generated by the electric current passing through the second constant current source.

3. The load driver according to claim 1, wherein the constant current generator includes:
- a first constant current source that generates the first constant current;
- a second constant current source that generates the second constant current; and
- a switch that is connected to the first constant current source in accordance with the current reduction signal during the on-period so that the first constant current is supplied from the first constant current source to the driver circuit, and is connected to the second constant current source in accordance with the current reduction signal after the on-period has elapsed so that the second constant current is supplied from the second constant current source to the driver circuit, and the driver circuit is configured to turn on the switching element in accordance with the switching signal.

4. The load driver according to claim 1, wherein:
the constant current generator includes a variable power source that is capable of varying a voltage value;
the constant current generator is configured to increase the value of the constant current with an increase in the voltage value;
the driver circuit is configured to turn on the switching element in accordance with the switching signal;
the constant current generator sets the voltage value of the variable power source to a first voltage value in accordance with the current reduction signal during the on-period so that the first constant current is supplied to the driver circuit; and
the constant current generator sets the voltage value of the variable power source to a second voltage value smaller than the first voltage value in accordance with the current reduction signal after the on-period has elapsed so that the second constant current is supplied to the driver circuit.

5. The load driver according to claim 1, wherein:
the constant current generator includes a variable resistor that is capable of varying a resistance value;
the constant current generator is configured to reduce the value of the constant current with an increase in the resistance value;
the driver circuit is configured to turn on the switching element in accordance with the switching signal;
the constant current generator sets the resistance value of the variable resistor to a first resistance value in accordance with the current reduction signal during the on-period so that the first constant current is supplied to the driver circuit; and
the constant current generator sets the resistance value of the variable resistor to a second resistance value larger than the first resistance value in accordance with the current reduction signal after the on-period has elapsed so that the second constant current is supplied to the driver circuit.

* * * * *